(12) United States Patent
Kato et al.

(10) Patent No.: US 12,247,117 B2
(45) Date of Patent: Mar. 11, 2025

(54) DISPERSION LIQUID, COMPOSITION, CURED FILM, COLOR FILTER, OPTICAL ELEMENT, SOLID-STATE IMAGING ELEMENT, AND HEADLIGHT UNIT

(71) Applicant: FUJIFILM Corporation, Tokyo (JP)

(72) Inventors: Ryosuke Kato, Shizuoka (JP); Yushi Kaneko, Shizuoka (JP); Takahiro Oya, Shizuoka (JP); Yoshinori Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 472 days.

(21) Appl. No.: 17/707,910

(22) Filed: Mar. 29, 2022

(65) Prior Publication Data

US 2022/0227966 A1 Jul. 21, 2022

Related U.S. Application Data

(63) Continuation of application No. PCT/JP2020/033924, filed on Sep. 8, 2020.

(30) Foreign Application Priority Data

Oct. 16, 2019 (JP) ................................. 2019-189471

(51) Int. Cl.
*C08K 9/06* (2006.01)
*C08J 5/18* (2006.01)
(Continued)

(52) U.S. Cl.
CPC ................. *C08K 9/06* (2013.01); *C08J 5/18* (2013.01); *C09C 1/3081* (2013.01); *C09C 3/12* (2013.01);
(Continued)

(58) Field of Classification Search
CPC ..... B01J 2/30; C09C 3/12; C09C 1/30; C09C 1/3081; C09C 1/309; C08K 9/06;
(Continued)

(56) References Cited

U.S. PATENT DOCUMENTS 10,865,319 B2 12/2020 Watanabe et al.
10,899,893 B2 1/2021 Murakami et al.
(Continued)

FOREIGN PATENT DOCUMENTS

CN 1692073 11/2005
CN 1692074 11/2005
(Continued)

OTHER PUBLICATIONS

Flejszar, Surface-Initiated Atom Transfer Radical Polymerization for the Preparation of Well-Defined Organic-Inorganic Hybrid Nanomaterials, Sep. 2019, Materials 12, 3030; doi:10.3390/ma12183030, pp. 1-28. (Year: 2019).*
(Continued)

*Primary Examiner* — Monique R Jackson
(74) *Attorney, Agent, or Firm* — JCIPRNET

(57) ABSTRACT

A dispersion liquid contains modified silica particles that are obtained by reacting silica particles which are surface-treated with a compound A represented by Formula $Si(R^A)_{4-n}(X^A)_n$, which has a reactive group, with a compound B which has a functional group reacting with the reactive group to form a bond and has an organic group, an organic solvent, and water, in which a content of water is 0.1 to 20.0 mass % with respect to a total mass of the modified silica particles. In Formula A, $R^A$ represents a monovalent organic group including the reactive group, $X^A$ represents a hydroxyl group or a monovalent hydrolyzable group, and n represents an integer of 1 to 3.

12 Claims, 5 Drawing Sheets

(51) Int. Cl.
  *C09C 1/30*      (2006.01)
  *C09C 3/12*      (2006.01)
  *H01L 27/146*    (2006.01)
(52) U.S. Cl.
  CPC .... *H01L 27/14649* (2013.01); *C01P 2004/62* (2013.01); *C01P 2004/64* (2013.01); *C08J 2333/10* (2013.01); *C08J 2333/14* (2013.01); *C08J 2335/02* (2013.01)
(58) Field of Classification Search
  CPC .. C08K 9/10; C08K 3/36; C01B 33/14; C01B 33/141; C01B 33/1417; C01B 33/145
  See application file for complete search history.

(56) References Cited

U.S. PATENT DOCUMENTS

| | | | | |
|---|---|---|---|---|
| 2004/0180193 | A1* | 9/2004 | Oda | B82Y 30/00 428/328 |
| 2009/0203838 | A1* | 8/2009 | Koch | C08F 2/44 524/588 |
| 2022/0213296 | A1* | 7/2022 | Kaneko | C08K 3/36 |
| 2023/0122289 | A1* | 4/2023 | Felder | C09D 5/1618 556/410 |

FOREIGN PATENT DOCUMENTS

| | | | |
|---|---|---|---|
| CN | 108026384 | | 5/2018 |
| CN | 110194853 | | 9/2019 |
| EP | 3767393 | | 1/2021 |
| JP | 2004083626 | | 3/2004 |
| JP | 2004269807 | | 9/2004 |
| JP | 2005000762 | | 1/2005 |
| JP | 2006117445 | | 5/2006 |
| JP | 2006257308 | | 9/2006 |
| JP | 2007119310 | | 5/2007 |
| JP | 2008222887 | | 9/2008 |
| JP | 2009155138 | | 7/2009 |
| JP | 2012031325 | A * | 2/2012 |
| JP | 2012041392 | | 3/2012 |
| JP | 2015086103 | | 5/2015 |
| JP | 2017031014 | | 2/2017 |
| WO | 2004035473 | | 4/2004 |
| WO | 2007011092 | | 1/2007 |
| WO | 2007110920 | | 10/2007 |
| WO | 2016181997 | | 11/2016 |
| WO | 2019171902 | | 9/2019 |
| WO | 2019176409 | | 9/2019 |

OTHER PUBLICATIONS

Machine translation of JP2015086103A, published May 2015, Powered by EPO and Google. (Year: 2015).*
Machine translation of JP2012031325A, published Feb. 2012, Powered by EPO and Google. (Year: 2012).*
"International Search Report (Form PCT/ISA/210) of PCT/JP2020/033924," mailed on Nov. 24, 2020, with English translation thereof, pp. 1-5.
"Written Opinion of the International Searching Authority (Form PCT/ISA/237)" of PCT/JP2020/033924, mailed on Nov. 24, 2020, with English translation thereof, pp. 1-6.
Office Action of Japan Counterpart Application, with English translation thereof, issued on Dec. 13, 2022, pp. 1-8.
Office Action of China Counterpart Application, with English translation thereof, issued on Nov. 28, 2022, pp. 1-11.
Chen Jing et al., "Synthesis and Properties of Nano-SiO2-Perfluoroalkyl Acrylate Modified Acrylate Emulsion via In-Situ Polymerization", Paint & Coatings Industry, vol. 48, Issue 5, May 2018, with English abstract, pp. 26-32.
Chen Guangmei et al., "Preparation and Properties of Polyurethane Modified by Acrylate /Nano-SiO2 Composites", Chinese Journal of Applied Chemistry, vol. 36, Issue 5, May 2019, with English abstract, pp. 532-538.
Li Yuping et al., "Preparation and Characterization of Nano-SiO2/Acrylic Resin Composite Latex", Acta Polymerica Sinica, vol. 8, Nov. 2006, with English abstract, pp. 953-958.
Mitsuru Watanabe et al., "Acrylic Polymer/Silica Organic-Inorganic Hybrid Emulsions for Coating Materials: Role of the Silane Coupling Agent", Journal of Polymer Science: Part A: Polymer Chemistry, vol. 44, Issue 16, Aug. 2006, pp. 4736-4742.

* cited by examiner

DISPERSION LIQUID, COMPOSITION, CURED FILM, COLOR FILTER, OPTICAL ELEMENT, SOLID-STATE IMAGING ELEMENT, AND HEADLIGHT UNIT

CROSS-REFERENCE TO RELATED APPLICATIONS

This application is a Continuation of PCT International Application No. PCT/JP2020/033924 filed on Sep. 8, 2020, which claims priority under 35 U.S.C § 119(a) to Japanese Patent Application No. 2019-189471 filed on Oct. 16, 2019. Each of the above application(s) is hereby expressly incorporated by reference, in its entirety, into the present application.

BACKGROUND OF THE INVENTION

1. Field of the Invention

The present invention relates to a dispersion liquid, a composition, a cured film, a color filter, an optical element, a solid-state imaging element, and a headlight unit.

2. Description of the Related Art

In the related art, a dispersion liquid in which silica particles are dispersed in an organic solvent has been used for various purposes.

For example, JP2006-257308A discloses a hollow silica particle dispersion in which hollow silica particles are dispersed in an organic solvent, in which a polymer having a hydrocarbon main chain is covalently bonded to the silica on a surface of the hollow silica particles (claim 1), and discloses that an optical film is produced using the dispersion.

SUMMARY OF THE INVENTION

In a case where the dispersion liquid disclosed in JP2006-257308A is studied, the present inventors have found that a viscosity of the dispersion liquid may change over time, and there is room for improvement in storage stability of the dispersion liquid.

In addition, a cured film used for a color filter or the like may be required to have low reflection properties. Examples of a method for obtaining such a cured film having low reflection properties include a method of making a surface of the cured film uneven, and for example, in a case where a composition including silica particles is used for manufacturing the cured film, it is considered that the silica particles can form unevenness on the surface of the cured film. However, in a case where a cured film formed of a composition including the dispersion liquid disclosed in JP2006-257308A is studied, the present inventors have found that a surface unevenness may not be sufficiently formed, and there is room for improvement in the surface unevenness.

Therefore, an object of the present invention is to provide a dispersion liquid with which a cured film having excellent surface unevenness can be manufactured and which has excellent storage stability, and a composition containing the dispersion liquid. Another object of the present invention is to provide a cured film formed of the composition, a color filter, an optical element, a solid-state imaging element, and a headlight unit.

The present inventors have conducted intensive studies to achieve the above-described object, and as a result, have found that, in a dispersion liquid containing modified silica particles, an organic solvent, and water, in a case where the modified silica particles obtained by using predetermined silica particles and a predetermined compound are used, and a water content with respect to a total mass of the modified silica particles is within a predetermined range, the desired effect is obtained, and completed the present invention.

That is, the present inventors have found that the above-described objects can be achieved by the following configurations.

[1]
A dispersion liquid comprising:
modified silica particles that are obtained by reacting silica particles which are surface-treated with a compound A represented by Formula A, which has a reactive group, with a compound B which has a functional group reacting with the reactive group to form a bond and has an organic group;
an organic solvent; and
water,
in which a content of water is 0.1 to 20.0 mass % with respect to a total mass of the modified silica particles,

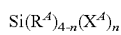   Formula A in Formula A, $R^A$ represents a monovalent organic group including the reactive group, $X^A$ represents a hydroxyl group or a monovalent hydrolyzable group, and n represents an integer of 1 to 3, in a case where n is 2 or less, a plurality of $R^A$'s may be the same or different from each other, and in a case where n is 2 or more, a plurality of $X^A$'s may be the same or different from each other.

[2]
The dispersion liquid according to [1],
in which the reactive group included in $R^A$ of Formula A is an ethylenically unsaturated group, a thiol group, an epoxy group, or an amino group.

[3]
The dispersion liquid according to [1] or [2],
in which the organic group of the compound B includes at least one structure selected from the group consisting of a polyester structure, a poly(meth)acrylate structure, a polyolefin structure, and a polyether structure.

[4]
The dispersion liquid according to any one of [1] to [3],
in which the organic group of the compound B includes a fluorine atom.

[5]
The dispersion liquid according to any one of [1] to [4],
in which the organic group of the compound B includes a silicon atom.

[6]
The dispersion liquid according to any one of [1] to [5],
in which an average primary particle diameter of the modified silica particles is 5 to 200 nm.

[7]
A composition comprising:
the dispersion liquid according to any one of [1] to [6]; and
at least one of a polymerizable compound or a resin.

[8]
The composition according to [7], further comprising:
a coloring material.

[9]
A cured film formed of the composition according to [7] or [8].

[10]
A color filter comprising:
the cured film according to [9].
[11]
An optical element comprising:
the cured film according to [9].
[12]
A solid-state imaging element comprising:
the cured film according to [9].
[13]
A headlight unit for a vehicle lighting tool, the headlight unit comprising:
a light source; and
a light shielding part which shields at least a part of light emitted from the light source,
in which the light shielding part contains the cured film according to [9].

According to the present invention, it is possible to provide a dispersion liquid with which a cured film having excellent surface unevenness can be manufactured and which has excellent storage stability, and a composition containing the dispersion liquid. In addition, according to the present invention, it is possible to provide a cured film formed of the composition, a color filter, an optical element, a solid-state imaging element, and a headlight unit.

DESCRIPTION OF THE PREFERRED EMBODIMENTS

Figure 1:
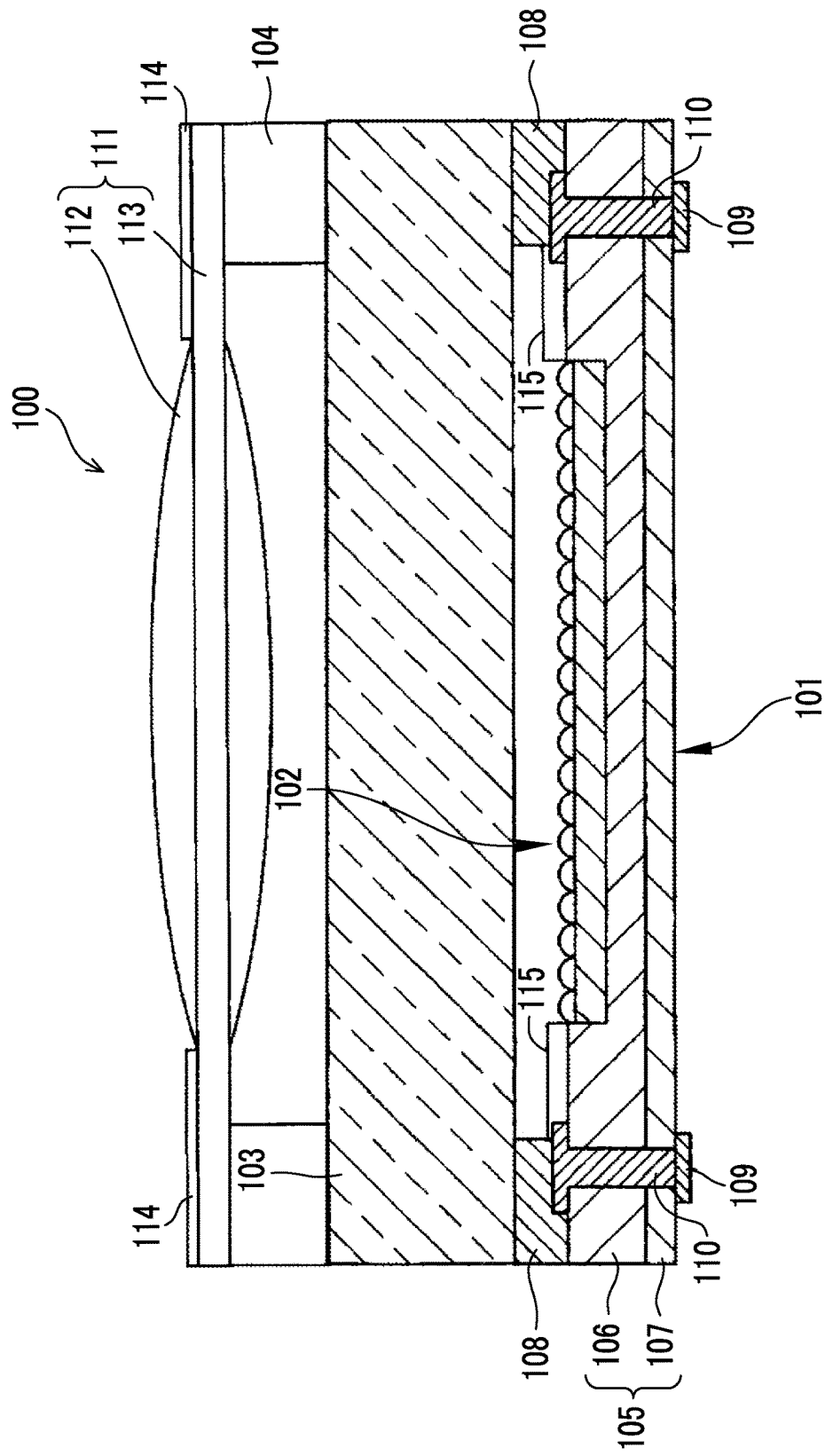
FIG. 1 is a schematic cross-sectional view showing a configuration example of a solid-state imaging device.

Hereinafter, the present invention will be described in detail.

The description of the configuration requirements described below is made on the basis of representative embodiments of the present invention, but it should not be construed that the present invention is limited to those embodiments.

In the present specification, a numerical range represented using "to" means a range containing numerical values described before and after the preposition "to" as a lower limit value and an upper limit value.

In addition, in a notation for a group (atomic group) in the present specification, in a case where the group is denoted without specifying whether it is substituted or unsubstituted, the group includes both a group having no substituent and a group having a substituent. For example, an "alkyl group" includes not only an alkyl group having no substituent (unsubstituted alkyl group), but also an alkyl group having a substituent (substituted alkyl group).

In addition, "actinic ray" or "radiation" in the present disclosure means, for example, far ultraviolet ray, extreme ultraviolet ray (EUV), X-ray, electron beam, and the like. In addition, in the present specification, light means actinic ray and radiation. In the present specification, unless specified otherwise, "exposure" denotes not only exposure with far ultraviolet ray, X-ray, EUV light, and the like, but also drawing with corpuscular beams such as electron beam and ion beam.

In addition, in the present specification, "(meth)acrylate" refers to acrylate and methacrylate. In the present specification, "(meth)acrylic" refers to acrylic and methacrylic. In the present specification, "(meth)acryloyl" refers to acryloyl and methacryloyl. In the present specification, "(meth)acrylamide" refers to acrylamide and methacrylamide. In the present specification, "monomeric substance" and "monomer" are synonymous.

In the present specification, "ppm" means "parts per million ($10^{-6}$)", "ppb" means "parts per billion ($10^{-9}$)", "ppt" means "parts per trillion ($10^{-12}$)".

In addition, in the present specification, a weight-average molecular weight (Mw) is a value by a gel permeation chromatography (GPC) method in terms of polystyrene.

In the present specification, the GPC method is based on a method using HLC-8020 GPC (manufactured by Tosoh Corporation), using TSKgel SuperHZM-H, TSKgel SuperHZ4000, and TSKgel SuperHZ2000 (all manufactured by Tosoh Corporation, 4.6 mmID×15 cm) as a column, and using tetrahydrofuran (THF) as an eluent.

The bonding direction of a divalent group (for example, —COO—) denoted in the present specification is not limited unless otherwise specified. For example, in a case where Y in a compound represented by a general formula "X—Y—Z" is —COO—, the compound may be "X—O—CO—Z" or "X—CO—O—Z".

In the present specification, in a case of containing a solvent (organic solvent, water, and the like), the "total solid content" of the dispersion liquid refers to all components except the solvent.

In the present specification, the "total solid content" of the composition refers to components forming a cured film, and refers to all components except a solvent in a case where the composition contains the solvent (an organic solvent, water, or the like). In addition, in a case where a component forms the cured film, the component which is a liquid component is also regarded as a solid content.

[Dispersion Liquid]

A dispersion liquid according to an embodiment of the present invention contains modified silica particles (hereinafter, also referred to as a "modified silica particle precursor") that are obtained by reacting silica particles which are surface-treated with a compound A represented by Formula A described later, which has a reactive group, with a compound B which has a functional group reacting with the reactive group to form a bond and has an organic group, an organic solvent, and water, in which a content of water is 0.1 to 20.0 mass % with respect to a total mass of the modified silica particles.

The dispersion liquid according to the embodiment of the present invention has excellent storage stability, and a cured film formed of the dispersion liquid has excellent surface unevenness. The details of the reason are not clear, but are presumed as follows. That is, by containing water in a predetermined amount, it is considered that an appropriate amount of water is likely to be present near a surface of the modified silica particles. As a result, in a case where the water evaporates during a formation of the cured film, it is presumed that a phase separation between the modified silica particles and a matrix (components such as a resin) is likely to occur, a cohesive force between the modified silica particles is increased, and unevenness due to the modified silica particles is formed well near a surface of the cured film.

In addition, by containing water in a predetermined amount, as a result of maintaining a good balance of hydrophobicity/hydrophilicity in the dispersion liquid, it is presumed that a dispersion liquid having excellent storage stability is obtained.

In the following description, the fact that the storage stability of the dispersion liquid and/or the surface unevenness of the cured film is excellent is also referred to as that the effects of the present invention are excellent.

[Modified Silica Particles]

The dispersion liquid according to the embodiment of the present invention contains modified silica particles.

From the viewpoint that the effects of the present invention are more excellent, a content of the modified silica particles in the dispersion liquid is preferably 0.1 to 70 mass %, more preferably 0.2 to 65 mass %, and still more preferably 0.3 to 60 mass % with respect to a total mass of the dispersion liquid.

In a case where a particle size of the modified silica particles is large, since a surface unevenness of a cured film (particularly, a light shielding film) formed of a composition including the dispersion liquid tends to be large, the low reflection properties of the cured film are more excellent. On the other hand, in a case where the particle size of the modified silica particles is small, since the modified silica particles are more likely to be unevenly distributed on a surface side of the cured film, a presence proportion of a coloring material inside the cured film is likely to be improved, and the light shielding properties of the cured film are more excellent. As described above, from the viewpoint that a balance between the low reflection properties and light shielding properties of the obtained cured film (particularly, light shielding film) is excellent, the particle size of the modified silica particles is preferably 1 to 250 nm, more preferably 5 to 200 nm, and still more preferably 10 to 150 nm. In addition, in a case where the particle size of the modified silica particles is within the above-described range, the effects of the present invention are more exhibited.

In the present specification, a particle size of particles (modified silica particles, coloring material described later, or the like) refers to an average primary particle diameter of the particles measured by the following method. The average primary particle diameter can be measured using a scanning electron microscope (SEM).

A maximum length (Dmax: maximum length between two points on a contour of a particle image) and a maximum perpendicular length (DV-max: shortest length connecting perpendicularly between two straight lines in a case where the image is interposed between the two straight lines parallel with the maximum length) of a particle image obtained by using the SEM are measured, and the geometric mean value $(Dmax \times DV\text{-}max)^{1/2}$ thereof is defined as a particle diameter. Particle diameters of 100 particles by the method are measured, and the arithmetic average value thereof is defined as the average primary particle diameter of the particles.

A refractive index of the modified silica particles is not particularly limited, but from the viewpoint that the low reflection properties of the cured film are more excellent, the refractive index is preferably 1.10 to 1.60 and more preferably 1.15 to 1.55.

In addition, the modified silica particles may be hollow particles or solid particles.

The hollow particles refer to particles in which cavities exist inside the particles. The hollow particles may have a structure in which the particles consist of an inner cavity and an outer shell surrounding the cavity. In addition, the hollow particles may have a structure in which a plurality of cavities exist inside the particles.

The solid particles refer to particles in which no cavity substantially exists inside the particles.

The hollow particles preferably have a void ratio of 3% or more, and the solid particles preferably have a void ratio of less than 3%.

Since the hollow particles have cavities inside so as to have a lower specific density than particles having no hollow structure, it is considered that the hollow particles float on a surface of a coating film formed of the composition, and the effect of uneven distribution on the surface of the cured film is further enhanced.

In addition, the hollow particles have a lower refractive index of the particles themselves than the particles having no hollow structure. For example, in a case where the hollow particles are composed of silica, since the hollow silica particles hold air having a low refractive index (refractive index=1.0), the refractive index of the particles themselves is 1.2 to 1.4, which is significantly lower than that of ordinary silica (refractive index=1.6). Therefore, by forming a cured film using a composition containing the hollow particles, it is considered that the hollow particles having a low refractive index are unevenly distributed on the surface of the cured film, so that an anti-reflection (AR) type low reflection effect is obtained and low reflection properties of the cured film are improved.

Examples of the hollow particles include the hollow silica particles described in JP2001-233611A and JP3272111B.

As the hollow particles, for example, THRULYA 4110 (trade name, manufactured by JGC C&C) can also be used.

As a preferred aspect of the solid particles, IPA-ST, IPA-ST-L, IPA-ST-ZL, MIBK-ST, MIBK-ST-L, CHO-ST-M, PGM-AC-2140Y, PGM-AC-4130Y, and the like (all trade names manufactured by Nissan Chemical Corporation) can be used.

As the modified silica particles, beaded silica particles which are particle aggregates in which a plurality of silica particles are connected in a chain may be used. As the beaded silica particles, silica particles in which a plurality of spherical colloidal silica particles having a particle size of 5 to 50 nm are bonded with metal oxide-containing silica are preferable.

Examples of the beaded colloidal silica particles include silica sol described in JP4328935B and JP2013-253145A.

The modified silica particles include silicon dioxide, and may contain a component other than silicon dioxide. A content of silicon dioxide in the modified silica particles is preferably 70 to 100 mass %, more preferably 75 to 100 mass %, and still more preferably 80 to 100 mass % with respect to the total mass of the modified silica particles.

The modified silica particle precursor refers to particles obtained by surface-treating, with the compound A, silica particles (hereinafter, also referred to as "unmodified silica particles") which is not surface-treated with the compound A. Therefore, usually, in a case where the modified silica particles are solid particles, the modified silica particle precursor and the unmodified silica particles are also solid particles, and in a case where the modified silica particles are hollow particles, the modified silica particle precursor and the unmodified silica particles are also hollow particles.

The modified silica particle precursor includes silicon dioxide, and a content of silicon dioxide in the modified silica particle precursor is preferably the same as the content of silicon dioxide in the modified silica particles.

The unmodified silica particles include silicon dioxide, and a content of silicon dioxide in the unmodified silica particles is preferably 99 to 100 mass % with respect to a total mass of the unmodified silica particles.

The compound A is a compound represented by Formula A. The compound A is used as a so-called silane coupling agent.

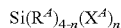
$$Si(R^A)_{4-n}(X^A)_n \qquad \text{Formula A}$$

$R^A$ represents a monovalent organic group including a reactive group.

Examples of the monovalent organic group including a reactive group include an alkyl group substituted with a reactive group and an aryl group substituted with a reactive group.

The above-described alkyl group preferably has 1 to 30 carbon atoms, more preferably has 2 to 20 carbon atoms, and still more preferably has 2 to 10 carbon atoms. The alkyl group may have any linear, branched, or cyclic structure. A methylene group in the alkyl group may be substituted with —O— or —NHC(O)—.

The above-described aryl group preferably has 6 to 30 carbon atoms, more preferably has 6 to 20 carbon atoms, and still more preferably has 6 to 15 carbon atoms. The aryl group may be monocyclic, or may have a fused-ring structure of two or more rings.

In a case where the substituent (reactive group) has a substituent, the carbon number of the substituent is not included in the carbon number of the alkyl group and the aryl group.

Examples of the above-described reactive group include an ethylenically unsaturated group, a thiol group, an epoxy group, an amino group, and an ethynyl group, and from the viewpoint that the effects of the present invention are more excellent, an ethylenically unsaturated group, a thiol group, an epoxy group, or an amino group is preferable.

Examples of the above-described ethylenically unsaturated group include a (meth)acryloyl group and a vinyl group.

$X^A$ represents a hydroxyl group or a monovalent hydrolyzable group, and is preferably a monovalent hydrolyzable group.

Examples of the hydrolyzable group include an alkoxy group, an allyloxy group, and a halogen atom, and from the viewpoint that the effects of the present invention are more excellent, an alkoxy group or a halogen atom is preferable, and an alkoxy group is more preferable. As the alkoxy group, an alkoxy group having 1 to 4 carbon atoms is preferable, and an alkoxy group having 1 or 2 carbon atoms is more preferable. As the allyloxy group, an allyloxy group having 6 to 10 carbon atoms is preferable. As the halogen atom, a chlorine atom is preferable.

n represents an integer of 1 to 3, and from the viewpoint that the effects of the present invention are more excellent, is preferably 2 or 3. In a case where n is 2 or less, a plurality of $R^A$'s may be the same or different from each other, and in a case where n is 2 or more, a plurality of $X^A$'s may be the same or different from each other.

The modified silica particle precursor is obtained by surface-treating the unmodified silica particles with the compound A.

A method of the surface treatment is not particularly limited, and examples thereof include a method in which the compound A and the unmodified silica particles are brought into contact with each other in the presence of water. In this case, on a surface of the modified silica particle precursor, a layer (hereinafter, also referred to as a "coating layer A") obtained by a dehydration condensation reaction between the hydroxyl group derived from $X^A$ of the compound A and a hydroxyl group derived from silicon dioxide constituting the unmodified silica particles is formed, and the coating layer A has $R^A$ derived from the compound A. In other words, it can be said that the modified silica particle precursor has particles including silica and the coating layer A formed on the surface of the particles including silica.

The modified silica particle precursor preferably has 10% or more (more preferably 25% or more and still more preferably 50% or more) of a surface area of the unmodified silica particles surface-treated with the compound A.

The modified silica particles are obtained by reacting the reactive group of the modified silica particle precursor with the functional group in the compound B which has a functional group reacting with the above-described reactive group to form a bond and has an organic group. A reaction rate between the reactive group of the modified silica particle precursor and the compound B is preferably 30% or more, more preferably 40% or more, and still more preferably 50% or more.

Examples of the functional group of the compound B include an amino group, a hydroxyl group, a carboxy group, a chlorine atom, a chlorocarbonyl group, an epoxy group, an isocyanate group, a (meth)acryloyl group, a sulfo group, a vinyl group, an azi group (—$N_3$), and a thiol group. Among these, from the viewpoint of excellent reactivity with the reactive group of the modified silica particle precursor, an amino group, a carboxy group, an epoxy group, a (meth)acryloyl group, or a thiol group is preferable.

Examples of the organic group include a monovalent organic group, and an alkyl group or an aryl group is preferable. The alkyl group and the aryl group may be substituted with a substituent.

The above-described alkyl group preferably has 1 to 30 carbon atoms and more preferably has 1 to 25 carbon atoms. The alkyl group may have any linear, branched, or cyclic structure.

The above-described aryl group preferably has 6 to 30 carbon atoms, more preferably has 6 to 20 carbon atoms, and still more preferably has 6 to 15 carbon atoms. The aryl group may be monocyclic, or may have a fused-ring structure of two or more rings.

In a case where the above-described alkyl group or aryl group is substituted, examples of a substituent include a fluorine atom, —Si(—O—Si($R^S$)$_3$)$_m$($R^S$)$_{3-m}$ (a plurality of $R^S$'s each independently represent an alkyl group having 1 to 5 carbon atoms, and m represents an integer of 0 to 3), a polysiloxane structure, a poly(meth)acrylate structure, a polyolefin structure, and a polyether structure. The alkyl group or aryl group as the organic group may be substituted with only one of these substituents, or may be substituted with two or more thereof. A methylene group in the alkyl group may be substituted with —O— or —NHC(O)—.

As one suitable aspect of the organic group of the compound B, an aspect in which the organic group includes at least one structure selected from the group consisting of a polyester structure, a poly(meth)acrylate structure, a polyolefin structure, and a polyether structure is mentioned. As a result, the effects of the present invention are more excellent.

As another suitable aspect of the organic group of the compound B, an aspect in which the organic group includes a fluorine atom is mentioned. A content of the fluorine atom in the organic group is preferably 5 mass % or more, more preferably 10 mass % or more, and still more preferably 15 mass % or more.

As still another suitable aspect of the organic group of the compound B, an aspect in which the organic group includes a silicon atom is mentioned. A content of the silicon atom in the organic group is preferably 10 mass % or more, more preferably 20 mass % or more, and still more preferably 30 mass % or more. Specific examples of the aspect in which the organic group includes a silicon atom include an aspect in which a group represented by $-Si(-O-Si(R^S)_3)_m(R^S)_{3-m}$ described above is included, and an aspect in which the above-described polysiloxane structure is included.

Only one of these suitable aspects may be satisfied, or two or more thereof may be satisfied from the viewpoint that the effects of the present invention are more excellent.

From the viewpoint that the effects of the present invention are more excellent, the compound B is preferably a compound represented by Formula B.

$$X^B-Y^B \qquad \text{Formula B}$$

$X^B$ represents a monovalent organic group. The monovalent organic group is the same as the above-described organic group, and the suitable aspect thereof is also the same.

$Y^B$ represents a functional group. Specific examples of the functional group are the same as those of the above-described functional group, and the suitable aspect thereof is also the same.

The compound represented by Formula B may be a compound having a molecular weight of 800 or less or a compound represented by Formula B-1, and from the viewpoint that the effects of the present invention are more excellent, a compound represented by Formula B-1 is preferable.

$$P^B\text{-L-}Y^B \qquad \text{Formula B-1}$$

$P^B$ represents a polymer chain. The polymer chain is a group derived from a polymer, and includes a predetermined repeating unit. In the polymer chain, it is preferable that a main chain portion can be bonded to L.

As the polymer chain, a known polymer can be selected depending on the purpose and the like, and examples thereof include polysiloxane, poly(meth)acrylate, polyolefin, polyether, and a copolymer thereof.

L represents a single bond or a divalent linking group. Examples of the divalent linking group include a divalent hydrocarbon group (which may be a divalent saturated hydrocarbon group or a divalent aromatic hydrocarbon group; the divalent saturated hydrocarbon group may be any of linear forms, branched forms, or cyclic forms, and preferably has 1 to 20 carbon atoms, and examples thereof include an alkylene group; the divalent aromatic hydrocarbon group preferably has 5 to 20 carbon atoms, and examples thereof include a phenylene group; other than these groups, the divalent hydrocarbon group may be an alkenylene group or an alkynylene group), a divalent heterocyclic group, $-O-$, $-S-$, $-SO_2-$, $-NR_L-$, $-CO-$, $-COO-$, $-CONR_L-$, $-SO_3-$, $-SO_2NR_L-$, and a group of a combination of two or more kinds thereof (for example, an alkyleneoxy group, an alkyleneoxycarbonyl group, an alkynylenecarbonyloxy group, and the like). Here, $R_L$ represents a hydrogen atom or an alkyl group (preferably having 1 to 10 carbon atoms).

$Y^B$ represents a functional group, and is synonymous with the functional group in Formula B.

The modified silica particles are obtained by reacting the reactive group of the modified silica particle precursor with the functional group of the compound B. As a result, on a surface of the modified silica particles, a layer (hereinafter, also referred to as a "coating layer B") including a reactant of the reactive group of the modified silica particle precursor and the functional group of the compound B is formed. In other words, it can be said that the modified silica particles have particles including silica and the coating layer B formed on the surface of the particles including silica.

The modified silica particles preferably have 10% or more (more preferably 25% or more and still more preferably 50% or more) of a surface area coated with the coating layer B.

[Organic Solvent]

The dispersion liquid according to the embodiment of the present invention contains an organic solvent.

A content of the organic solvent is preferably 10 to 97 mass % with respect to the total mass of the dispersion liquid. The lower limit is preferably 30 mass % or more, more preferably 40 mass % or more, still more preferably 50 mass % or more, even still more preferably 60 mass % or more, and particularly preferably 70 mass % or more. The upper limit is preferably 96 mass % or less and more preferably 95 mass % or less. The dispersion liquid may include only one kind of the organic solvent or two or more kinds thereof. In a case of including two or more kinds thereof, the total amount thereof is preferably within the above-described range.

Examples of the organic solvent include an ester-based solvent, a ketone-based solvent, an alcohol-based solvent, an amide-based solvent, an ether-based solvent, and a hydrocarbon-based solvent. The details of the organic solvent can be found in paragraph No. 0223 of WO2015/166779A, the content of which is incorporated herein by reference. In addition, an ester solvent in which a cyclic alkyl group is substituted or a ketone solvent in which a cyclic alkyl group is substituted can also be preferably used. Specific examples of the organic solvent include polyethylene glycol monomethyl ether, dichloromethane, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclohexyl acetate, cyclopentanone, ethyl carbitol acetate, butyl carbitol acetate, propylene glycol monomethyl ether (1-methoxy-2-propanol), and propylene glycol monomethyl ether acetate. In this case, it may be preferable that the content of aromatic hydrocarbons (such as benzene, toluene, xylene, and ethylbenzene) as the organic solvent is low (for example, 50 parts per million (ppm) by mass or less, 10 ppm by mass or less, or 1 ppm by mass or less with respect to the total amount of the organic solvent) in consideration of environmental aspects and the like.

[Water]

The dispersion liquid according to the embodiment of the present invention contains water.

A content of water is 0.1 to 20.0 mass % with respect to the total mass of the modified silica particles, and from the viewpoint that the effects of the present invention are more excellent, is preferably 0.2 to 15 mass %, more preferably 0.4 to 10 mass %, and still more preferably 0.6 to 7.5 mass %.

The content of water in the dispersion liquid according to the embodiment of the present invention can be measured by a Karl Fischer volumetric titration method in accordance with JIS K0113:2005.

[Other Components]

The dispersion liquid according to the embodiment of the present invention may further contain other components other than the above-described components.

Examples of the other components include a catalyst used in a case of reacting the compound A and a self-condensate of the compound A produced in a case of reacting the compound A.

[Method for Producing Dispersion Liquid]

The dispersion liquid can be prepared by mixing the above-described respective components by a known mixing method (for example, a mixing method using a stirrer, a homogenizer, a high-pressure emulsification device, a wet-type pulverizer, a wet-type disperser, or the like).

In a case of preparing the dispersion liquid, the respective components may be blended at once, or each of the components may be dissolved or dispersed in a solvent and then sequentially blended. In addition, adding sequence and working conditions for blending are not particularly limited.

The dispersion liquid may be filtered with a filter for the purpose of removing foreign matters, reducing defects, and the like. As the filter, for example, any filters which have been used in the related art for filtration use and the like may be used without particular limitation. Examples thereof include filters formed of a fluororesin such as polytetrafluoroethylene (PTFE), a polyamide-based resin such as nylon, or a polyolefin-based resin (including a high-density polypropylene and ultrahigh molecular weight polypropylene) such as polyethylene and polypropylene (PP). Among these materials, polypropylene (including a high-density polypropylene) or nylon is preferable.

A pore size of the filter is preferably 0.1 to 7.0 µm, more preferably 0.2 to 2.5 µm, still more preferably 0.2 to 1.5 µm, and particularly preferably 0.3 to 0.7 µm.

In a case of using a filter, different filters may be combined. In this case, the filtering with a first filter may be performed once or may be performed twice or more times. In a case where filtering is performed twice or more by combining different filters, it is preferable that the pore size of the second and subsequent filters are the same or larger than the pore size of the first filtering. In addition, first filters having different pore sizes within the above-described range may be combined. With regard to the pore size of the filter herein, reference can be made to nominal values of filter manufacturers. As a commercially available filter, for example, various filters provided by Nihon Pall Corporation, Advantec Toyo Kaisha., Ltd., Nihon Entegris G.K. (formerly Mykrolis Corporation), Kitz Microfilter Corporation, and the like can be selected.

As a second filter, a filter formed of the same material as that of the first filter described above, or the like can be used. A pore size of the second filter is preferably 0.2 to 10.0 µm, more preferably 0.2 to 7.0 µm, and still more preferably 0.3 to 6.0 µm.

[Composition]

A composition according to an embodiment of the present invention contains the above-described dispersion liquid and at least one of a polymerizable compound or a resin, and as necessary, may further contain a polymerization initiator, a coloring material, a polymerization inhibitor, a solvent, and the like. Hereinafter, components which are contained in the composition according to the embodiment of the present invention and components which may be contained in the composition according to the embodiment of the present invention will be described.

[Dispersion Liquid]

The composition according to the embodiment of the present invention contains the above-described dispersion liquid. Since the dispersion liquid is as described above, the description thereof will be omitted.

From the viewpoint that the effects of the present invention are more excellent, a content of the dispersion liquid is preferably 0.1 to 50 mass %, more preferably 0.5 to 45 mass %, and still more preferably 1 to 40 mass % with respect to a total mass of the composition.

[Polymerizable Compound]

The composition according to the embodiment of the present invention may contain a polymerizable compound.

A content of the polymerizable compound is not particularly limited, but is preferably 5 to 60 mass %, more preferably 7 to 55 mass %, and still more preferably 9 to 50 mass % with respect to a total solid content of the composition.

The polymerizable compound may be used alone or in combination of two or more kinds thereof. In a case where two or more kinds of polymerizable compounds are used, it is preferable that the total content thereof is within the above-described range.

A molecular weight (or weight-average molecular weight) of the polymerizable compound is not particularly limited, but is preferably 2500 or less.

The polymerizable compound is preferably a compound containing an ethylenically unsaturated group (a group containing an ethylenically unsaturated bond).

That is, the composition according to the embodiment of the present invention preferably contains, as a polymerizable compound, a low-molecular-weight compound containing an ethylenically unsaturated group.

The polymerizable compound is preferably a compound containing one or more ethylenically unsaturated bonds, more preferably a compound containing two or more ethylenically unsaturated bonds, still more preferably a compound containing three or more ethylenically unsaturated bonds, and particularly preferably a compound containing four or more ethylenically unsaturated bonds. The upper limit is, for example, 15 or less. Examples of the ethylenically unsaturated group include a vinyl group, a (meth)allyl group, and a (meth)acryloyl group.

As the polymerizable compound, for example, compounds described in paragraph 0050 of JP2008-260927A and paragraph 0040 of JP2015-68893A can be used, the contents of which are incorporated herein by reference.

The polymerizable compound may be in any chemical form such as, for example, a monomer, a prepolymer, an oligomer, a mixture thereof, and a multimer thereof.

As the polymerizable compound, a 3 to 15 functional (meth)acrylate compound is preferable, a 3 to 6 functional (meth)acrylate compound is more preferable, and a 5 or 6 functional (meth)acrylate compound is still more preferable.

The polymerizable compound is also preferably a compound containing one or more ethylenically unsaturated groups and having a boiling point of 100° C. or higher under normal pressure. For example, compounds described in paragraph 0227 of JP2013-29760A and paragraphs 0254 to 0257 of JP2008-292970A can be referred to, the contents of which are incorporated herein by reference.

As the polymerizable compound, dipentaerythritol triacrylate (as a commercially available product, for example, KAYARAD D-330 manufactured by Nippon Kayaku Co., Ltd.), dipentaerythritol tetraacrylate (as a commercially available product, for example, KAYARAD D-320 manufactured by Nippon Kayaku Co., Ltd.), dipentaerythritol penta(meth)acrylate (as a commercially available product, for example, KAYARAD D-310 manufactured by Nippon Kayaku Co., Ltd.), dipentaerythritol hexa(meth)acrylate (as a commercially available product, for example, KAYARAD DPHA manufactured by Nippon Kayaku Co., Ltd., and A-DPH-12E manufactured by Shin-Nakamura Chemical Co., Ltd.), or a structure in which these (meth)acryloyl groups are bonded through an ethylene glycol residue or a propylene glycol residue (for example, SR454 and SR499 which are commercially available products from Sartomer) is preferable. An oligomer type of these compounds can be used. In addition, NK ESTER A-TMMT (pentaerythritol tetraacrylate, manufactured by Shin-Nakamura Chemical Co., Ltd.) KAYARAD RP-1040, KAYARAD DPEA-12LT, KAYARAD DPHA LT, KAYARAD RP-3060, and KAYARAD DPEA-12 (all trade names, manufactured by Nippon Kayaku Co., Ltd.), and the like may be used. In addition, as the polymerizable compound, urethane (meth) acrylate-based compound having both (meth)acryloyl group and urethane bond in the compound may be used, and for example, KAYARAD DPHA-40H (trade name, manufactured by Nippon Kayaku Co., Ltd.) may be used.

Preferred aspects of the polymerizable compound are shown below.

The polymerizable compound may have an acid group such as a carboxy group, a sulfo group, and a phosphoric acid group. The polymerizable compound containing an acid group is preferably an ester of an aliphatic polyhydroxy compound and an unsaturated carboxylic acid, more preferably a polymerizable compound having an acid group by reacting an unreacted hydroxyl group of an aliphatic polyhydroxy compound with a non-aromatic carboxylic acid anhydride, and in this ester, it is still more preferable that the aliphatic polyhydroxy compound is pentaerythritol and/or dipentaerythritol. Examples of a commercially available product include ARONIX TO-2349, M-305, M-510, and M-520 manufactured by Toagosei Co., Ltd.

An acid value of the polymerizable compound containing an acid group is preferably 0.1 to 40 mgKOH/g and more preferably 5 to 30 mgKOH/g. In a case where the acid value of the polymerizable compound is 0.1 mgKOH/g or more, developing and dissolving characteristics are good, and in a case where the acid value of the polymerizable compound is 40 mgKOH/g or less, it is advantageous in production and/or handling. Furthermore, photopolymerization performance is good and curing properties are excellent.

The polymerizable compound is also preferably a compound containing a caprolactone structure.

The compound containing a caprolactone structure is not particularly limited as long as, for example, the compound contains a caprolactone structure in the molecule, and examples thereof include a ε-caprolactone-modified polyfunctional (meth)acrylate obtained by esterifying (meth)acrylic acid and ε-caprolactone with a polyhydric alcohol such as trimethylolethane, ditrimethylolethane, trimethylolpropane, ditrimethylolpropane, pentaerythritol, dipentaerythritol, tripentaerythritol, glycerin, diglycerol, and trimethylolmelamine. Among these, a compound containing a caprolactone structure represented by Formula (Z-1) is preferable.

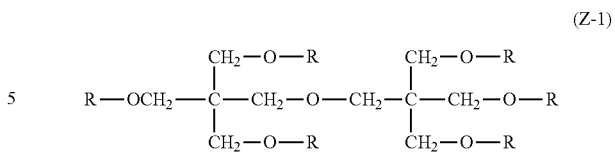

In Formula (Z-1), all of six R's represent a group represented by Formula (Z-2), or one to five R's among the six R's represent a group represented by Formula (Z-2) and the remaining R's represent a group represented by Formula (Z-3).

In Formula (Z-2), $R^1$ represents a hydrogen atom or a methyl group, m represents the number of 1 or 2, and "*" represents a bonding site.

In Formula (Z-3), $R^1$ represents a hydrogen atom or a methyl group and "*" represents a bonding position.

The polymerizable compound containing a caprolactone structure is commercially available, for example, from Nippon Kayaku Co., Ltd. as KAYARAD DPCA series, and examples thereof include DPCA-20 (compound in which m is 1 in Formulae (Z-1) to (Z-3), the number of groups represented by Formula (Z-2) is 2, and $R^1$'s are all hydrogen atoms), DPCA-30 (compound in which m is 1 in Formulae (Z-1) to (Z-3), the number of groups represented by Formula (Z-2) is 3, and $R^1$'s are all hydrogen atoms), DPCA-60 (compound in which m is 1 in Formulae (Z-1) to (Z-3), the number of groups represented by Formula (Z-2) is 6, and $R^1$'s are all hydrogen atoms), and DPCA-120 (compound in which m is 2 in Formulae (Z-1) to (Z-3), the number of groups represented by Formula (Z-2) is 6, and $R^1$'s are all hydrogen atoms). In addition, examples of a commercially available product of the polymerizable compound containing a caprolactone structure also include M-350 (trade name) (trimethylolpropane triacrylate) manufactured by Toagosei Co., Ltd.

As the polymerizable compound, a compound represented by Formula (Z-4) or (Z-5) can also be used.

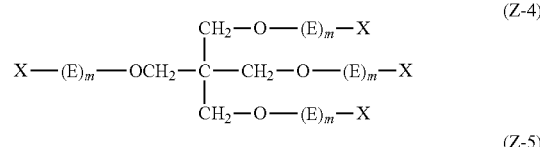

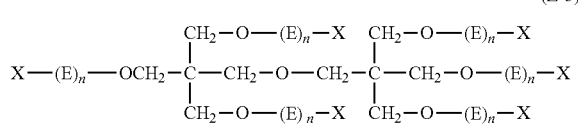

In Formulae (Z-4) and (Z-5), E represents —(($CH_2$)$_y$$CH_2$O)— or —(($CH_2$)$_y$CH($CH_3$)O)—, y represents an integer of 0 to 10, and X represents a (meth)acryloyl group, a hydrogen atom, or a carboxy group.

In Formula (Z-4), the total number of (meth)acryloyl groups is 3 or 4, m represents an integer of 0 to 10, and the sum of m's is an integer of 0 to 40.

In Formula (Z-5), the total number of (meth)acryloyl groups is 5 or 6, n represents an integer of 0 to 10, and the sum of n's is an integer of 0 to 60.

In Formula (Z-4), m represents preferably an integer of 0 to 6 and more preferably an integer of 0 to 4.

In addition, the sum of m's is preferably an integer of 2 to 40, more preferably an integer of 2 to 16, and still more preferably an integer of 4 to 8.

In Formula (Z-5), n represents preferably an integer of 0 to 6 and more preferably an integer of 0 to 4.

In addition, the sum of n's is preferably an integer of 3 to 60, more preferably an integer of 3 to 24, and still more preferably an integer of 6 to 12.

In addition, in —(($CH_2$)$_y$$CH_2$O)— or —(($CH_2$)$_y$CH($CH_3$)O)— in Formula (Z-4) or (Z-5), it is preferable that the terminal on the oxygen atom side is bonded to X.

The compound represented by Formula (Z-4) or (Z-5) may be used alone or in combination of two or more thereof. In particular, in Formula (Z-5), an aspect in which all six X's are acryloyl groups is preferable, and in Formula (Z-6), an aspect in which a compound that all six X's are acryloyl groups and a compound that at least one of the six X's has a hydrogen atom are mixed is preferable. With such a configuration, developability can be further improved.

In addition, the total content of the compound represented by Formula (Z-4) or (Z-5) in the polymerizable compound is preferably 20 mass % or more, and more preferably 50 mass % or more.

Among the compounds represented by Formula (Z-4) or (Z-5), a pentaerythritol derivative and/or a dipentaerythritol derivative are more preferable.

In addition, the polymerizable compound may contain a cardo skeleton.

The polymerizable compound containing a cardo skeleton is preferably a polymerizable compound containing a 9,9-bisarylfluorene skeleton.

Examples of the polymerizable compound containing a cardo skeleton include Oncoat EX series (manufactured by NAGASE & CO., LTD.) and OGSOL (manufactured by Osaka Gas Chemicals Co., Ltd.).

The polymerizable compound is also preferably a compound containing an isocyanuric acid skeleton as a central core. Examples of such a polymerizable compound include NK ESTER A-9300 (manufactured by Shin-Nakamura Chemical Co., Ltd.).

The ethylenically unsaturated bond equivalent (meaning a value obtained by dividing the number of ethylenically unsaturated groups in the polymerizable compound by the molecular weight (g/mol) of the polymerizable compound) of the polymerizable compound is preferably 5.0 mmol/g or more. The upper limit is not particularly limited, but is generally 20.0 mmol/g or less.

[Resin]

The composition according to the embodiment of the present invention may contain a resin. The resin is blended in, for example, an application for dispersing particles such as a pigment in a composition or an application as a binder. Mainly, a resin which is used for dispersing particles such as a pigment is also referred to as a dispersant. However, such applications of the resin are only exemplary, and the resin can also be used for other purposes in addition to such applications.

A weight-average molecular weight (Mw) of the resin is preferably 2000 to 2000000. The upper limit is preferably 1000000 or less and more preferably 500000 or less. The lower limit is preferably 3000 or more and more preferably 5000 or more.

Examples of the resin include a (meth)acrylic resin, an epoxy resin, an ene-thiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamidoimide resin, a polyolefin resin, a cyclic olefin resin, a polyester resin, and a styrene resin. These resins may be used singly or as a mixture of two or more kinds thereof. From the viewpoint of improving heat resistance, as the cyclic olefin resin, a norbornene resin is preferable. Examples of a commercially available product of the norbornene resin include ARTON series (for example, ARTON F4520) manufactured by JSR Corporation. Examples of the epoxy resin include an epoxy resin which is a glycidyl etherified product of a phenol compound, an epoxy resin which is a glycidyl etherified product of various novolac resins, an alicyclic epoxy resin, an aliphatic epoxy resin, a heterocyclic epoxy resin, a glycidyl ester-based epoxy resin, a glycidyl amine-based epoxy resin, an epoxy resin obtained by glycidylating halogenated phenols, a condensate of a silicon compound having an epoxy group and another silicon compound, and a copolymer of a polymerizable unsaturated compound having an epoxy group and another polymerizable unsaturated compound. In addition, as the epoxy resin, MARPROOF G-0150M, G-0105SA, G-0130SP, G-0250SP, G-1005S, G-1005SA, G-1010S, G-2050M, G-01100, or G-01758 (manufactured by NOF Corporation, an epoxy group-containing polymer) can also be used. In addition, as the resin, resins described in Examples of WO2016/088645A can be used. In addition, in a case where the resin has an ethylenically unsaturated group, particularly a (meth)acryloyl group in the side chain, in the resin, it is also preferable that the main chain and the ethylenically unsaturated group are bonded through a divalent linking group having an alicyclic structure.

The composition according to the embodiment of the present invention preferably includes an alkali-soluble resin. In a case where the composition according to the embodiment of the present invention includes an alkali-soluble resin, developability of the composition is improved, and in a case where a pattern is formed by a photolithography method using the composition according to the embodiment of the present invention, the generation of development residue and the like can be effectively suppressed. Examples of the alkali-soluble resin include resins having an acid group. Examples of the acid group include a carboxy group, a phosphoric acid group, a sulfo group, and a phenolic hydroxyl group, and a carboxy group is preferable. The acid group included in the alkali-soluble resin may be used singly or in combination of two or more kinds thereof. The alkali-soluble resin can also be used as a dispersant.

The alkali-soluble resin preferably includes a repeating unit having an acid group in the side chain, and more preferably includes 5 to 70 mol % of repeating units having an acid group in the side chain with respect to the total repeating units of the resin. The upper limit of the content of the repeating unit having an acid group in the side chain is preferably 50 mol % or less and more preferably 30 mol % or less. The lower limit of the content of the repeating unit having an acid group in the side chain is preferably 10 mol % or more and more preferably 20 mol % or more.

The alkali-soluble resin is also preferably an alkali-soluble resin having a polymerizable group. Examples of the polymerizable group include a (meth)allyl group (meaning both an allyl group and a methallyl group) and a (meth) acryloyl group. The alkali-soluble resin having a polymerizable group is preferably a resin including a repeating unit having a polymerizable group in the side chain and a repeating unit having an acid group in the side chain.

It is also preferable that the alkali-soluble resin includes a repeating unit derived from a monomer component including a compound represented by Formula (ED1) and/or a compound represented by Formula (ED2) (hereinafter, these compounds may be referred to as an "ether dimer").

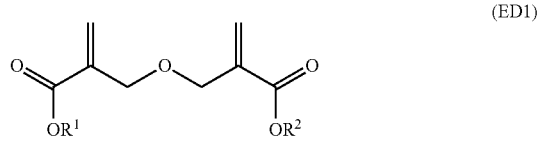

(ED1)

In Formula (ED1), $R^1$ and $R^2$ each independently represent a hydrogen atom or a hydrocarbon group having 1 to 25 carbon atoms, which may have a substituent.

(ED2)

In Formula (ED2), R represents a hydrogen atom or an organic group having 1 to 30 carbon atoms. With regard to details of Formula (ED2), reference can be made to the description in JP2010-168539A, the contents of which are incorporated herein by reference.

With regard to the specific examples of the ether dimer, reference can be made to the description in paragraph No. 0317 of JP2013-029760A, the contents of which are incorporated herein by reference.

It is also preferable that the alkali-soluble resin includes a repeating unit derived from a compound represented by Formula (X).

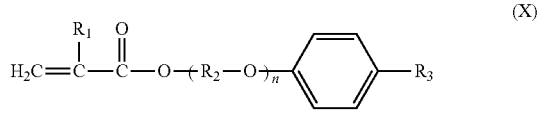

(X)

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may include a benzene ring. n represents an integer of 1 to 15.

With regard to the alkali-soluble resin, reference can be made to the description in paragraph Nos. 0558 to 0571 of JP2012-208494A (paragraph Nos. 0685 to 0700 of the corresponding US2012/0235099A) and the description in paragraph Nos. 0076 to 0099 of JP2012-198408A, the contents of which are incorporated herein by reference.

The acid value of the resin (particularly, the alkali-soluble resin) is preferably 10 to 500 mgKOH/g. The lower limit is preferably 30 mgKOH/g or more, more preferably 50 mgKOH/g or more, and still more preferably 70 mgKOH/g or more. The upper limit is preferably 400 mgKOH/g or less, more preferably 300 mgKOH/g or less, still more preferably 200 mgKOH/g or less, and particularly preferably 100 mgKOH/g or less.

The ethylenically unsaturated bond equivalent (meaning a value obtained by dividing the number of ethylenically unsaturated groups in the polymerizable compound by the molecular weight (g/mol) of the polymerizable compound) of the resin (particularly, the alkali-soluble resin) is preferably 0.4 to 2.5 mmol/g. The lower limit is preferably 1.0 mmol/g or more and more preferably 1.2 mmol/g or more. The upper limit is preferably 2.3 mmol/g or less and more preferably 2.0 mmol/g or less.

In particular, in a case where the composition according to the embodiment of the present invention includes a resin having an acid value of 10 to 100 mgKOH/g and an ethylenically unsaturated bond equivalent of 1.0 to 2.0 mmol/g, occurrence of peeling after a humidity test can be further suppressed.

Specific examples of the alkali-soluble resin include resins having the following structures. In the following structural formulae, Me represents a methyl group.

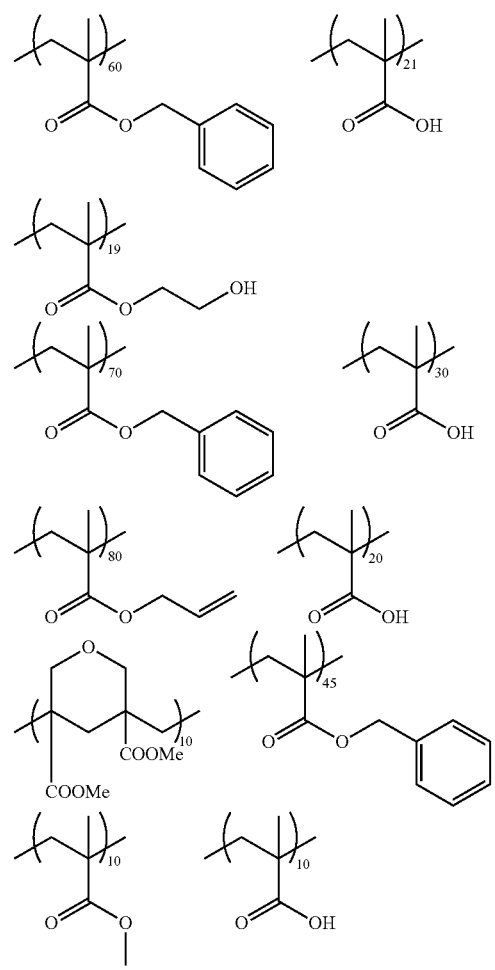

-continued

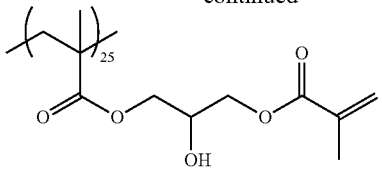

The composition according to the embodiment of the present invention preferably includes a resin having a basic group. Examples of the basic group include an amino group and an ammonium salt group. The resin having a basic group may further have an acid group in addition to the basic group. In a case where the resin having a basic group further has an acid group, such a resin is also an alkali-soluble resin.

Examples of the resin having a basic group include a resin having a tertiary amino group or a quaternary ammonium salt group. The resin having a tertiary amino group and a quaternary ammonium salt group is preferably a resin which has a repeating unit having a tertiary amino group and a repeating unit having a quaternary ammonium salt group. In addition, the resin having a tertiary amino group and a quaternary ammonium salt group may further have a repeating unit having an acid group. The resin having a tertiary amino group and a quaternary ammonium salt group also preferably has a block structure. In the resin having a tertiary amino group and a quaternary ammonium salt group, it is preferable that the amine value is 10 to 250 mgKOH/g and the quaternary ammonium salt value is 10 to 90 mgKOH/g, and it is more preferable that the amine value is 50 to 200 mgKOH/g and the quaternary ammonium salt value is 10 to 50 mgKOH/g. A weight-average molecular weight (Mw) of the resin having a tertiary amino group and a quaternary ammonium salt group is preferably 3000 to 300000 and more preferably 5000 to 30000. The resin having a tertiary amino group and a quaternary ammonium salt group can be produced by copolymerizing an ethylenically unsaturated monomer having a tertiary amino group, an ethylenically unsaturated monomer having a quaternary ammonium salt group, and other ethylenically unsaturated monomers as necessary. Examples of the ethylenically unsaturated monomer having a tertiary amino group and the ethylenically unsaturated monomer having a quaternary ammonium salt group include those described in paragraph Nos. 0150 to 0170 of WO2018/230486A, the contents of which are incorporated herein by reference. In addition, a resin having an acidic group, which is described in paragraph Nos. 0079 to 0160 of JP2018-87939A, may be used in combination.

In addition, the resin having a basic group is also preferably a resin including a nitrogen atom in the main chain. The resin including a nitrogen atom in the main chain (hereinafter, also referred to as an oligoimine-based resin) preferably includes at least one repeating unit having a nitrogen atom, selected from a poly(lower alkyleneimine)-based repeating unit, a polyallylamine-based repeating unit, a polydiallylamine-based repeating unit, a metaxylene diamine-epichlorohydrin polycondensate-based repeating unit, and a polyvinylamine-based repeating unit. In addition, as the oligoimine-based resin, a resin which has a repeating unit having a partial structure X having a functional group of pKa14 or less, and a repeating unit having a side chain including an oligomer chain or a polymer chain Y having 40 to 10000 atoms is preferable. The oligoimine-based resin may further have a repeating unit having an acid group. With regard to the oligoimine-based resin, reference can be made to the description in paragraph Nos. 0102 to 0166 of JP2012-255128A, the contents of which are incorporated herein by reference.

The composition according to the embodiment of the present invention may also include a resin as a dispersant, and preferably includes a resin as a dispersant. Examples of the dispersant include an acidic dispersant (acidic resin) and a basic dispersant (basic resin). Here, the acidic dispersant (acidic resin) represents a resin in which the amount of the acid group is larger than the amount of the basic group. The acidic dispersant (acidic resin) is preferably a resin in which the amount of the acid group occupies 70 mol % or more in a case where the total amount of the acid group and the basic group is 100 mol %, and more preferably a resin substantially consisting of only an acid group. The acid group included in the acidic dispersant (acidic resin) is preferably a carboxy group. In addition, the basic dispersant (basic resin) represents a resin in which the amount of the basic group is larger than the amount of the acid group. The basic dispersant (basic resin) is preferably a resin in which the amount of the basic group is more than 50 mol % in a case where the total amount of the acid group and the basic group is 100 mol %. The dispersant is preferably a resin having a basic group, and more preferably a basic dispersant.

Examples of the resin used as a dispersant include the above-described resin having a tertiary amino group and a quaternary ammonium salt group and the above-described oligoimine-based resin. In addition, it is also preferable that the resin used as a dispersant is a graft resin. Examples of the graft resin include a resin which has a repeating unit having a graft chain. The graft resin may further have a repeating unit having an acid group. With regard to details of the graft resin, reference can be made to the description in paragraph Nos. 0025 to 0094 of JP2012-255128A, the contents of which are incorporated herein by reference.

In order to improve interaction between the graft chain and the solvent, thereby improving dispersibility of the coloring material and the like, the graft chain is preferably a graft chain containing at least one selected from the group consisting of a polyester structure, a polyether structure, and a poly(meth)acrylate structure, and more preferably a graft chain containing at least one of a polyester structure or a polyether structure.

In addition, the resin used as a dispersant is also preferably a resin which includes a repeating unit having an acid group. In addition, it is also preferable that the resin used as a dispersant is a resin having a structure in which a plurality of polymer chains are bonded to a core portion. Examples of such a resin include dendrimers (including star polymers). In addition, specific examples of the dendrimer include polymer compounds C-1 to C-31 described in paragraph Nos. 0196 to 0209 of JP2013-043962A. In addition, the above-described alkali-soluble resin can also be used as a dispersant.

The dispersant is available as a commercially available product, and specific examples thereof include Disperbyk-111 (manufactured by BYK Chemie) and SOLSPERSE 76500 (manufactured by Lubrizol Corporation). The dispersants described in paragraph Nos. 0041 to 0130 of JP2014-130338A can also be used, the contents of which are incorporated herein by reference.

It is also preferable to use the dispersant described in JP2019-078878A.

A content of the resin is preferably 1 to 70 mass % with respect to the total solid content of the composition. The lower limit is preferably 5 mass % or more and more preferably 7 mass % or more. The upper limit is preferably 65 mass % or less and more preferably 60 mass % or less.

In addition, in a case where the composition according to the embodiment of the present invention contains an alkali-soluble resin, a content of the alkali-soluble resin in the total solid content of the composition is preferably 1 to 70 mass %. The lower limit is preferably 5 mass % or more and more preferably 7 mass % or more. The upper limit is preferably 65 mass % or less and more preferably 60 mass % or less. In addition, the content of the alkali-soluble resin in the resin included in the composition is preferably 50 to 100 mass %, more preferably 75 to 100 mass %, and still more preferably 90 to 100 mass %.

In addition, in a case where the composition according to the embodiment of the present invention contains a resin as a dispersant, the content of the resin as a dispersant in the total solid content of the composition is preferably 0.1 to 40 mass %. The upper limit is preferably 35 mass % or less and still more preferably 30 mass % or less. The lower limit is preferably 0.5 mass % or more and still more preferably 1 mass % or more.

The composition according to the embodiment of the present invention may include only one kind of the resin or two or more kinds thereof. In a case of including two or more kinds thereof, the total amount thereof is preferably within the above-described range.

[Polymerization Initiator]

The composition according to the embodiment of the present invention may contain a polymerization initiator.

As the polymerization initiator, for example, a known polymerization initiator can be used. Examples of the polymerization initiator include a photopolymerization initiator and a thermal polymerization initiator, and a photopolymerization initiator is preferable.

The content of the polymerization initiator is preferably 0.5 to 20 mass %, more preferably 1.0 to 10 mass %, and still more preferably 1.5 to 8 mass % with respect to the total solid content of the composition.

The polymerization initiator may be used singly or in combination of two or more kinds thereof. In a case where two or more kinds of polymerization initiators are used in combination, it is preferable that the total content thereof is within the above-described range.

<Thermal Polymerization Initiator>

Examples of the thermal polymerization initiator include azo compounds such as 2,2'-azobisisobutyronitrile (AIBN), 3-carboxypropionitrile, azobismalononitrile, and dimethyl-(2,2')-azobis(2-methylpropionate) [V-601], and organic peroxides such as benzoyl peroxide, lauroyl peroxide, and potassium persulfate.

Specific examples of the thermal polymerization initiator include polymerization initiators described on pages 65 to 148 of "Shigaisen Koka Shisutemu (Ultraviolet Ray-Curing System)" written by Kiyoshi KATO (published by Sogo Gijutsu Center K.K. (1989)).

<Photopolymerization Initiator>

The photopolymerization initiator is not particularly limited, and can be appropriately selected from known photopolymerization initiators. For example, a compound having photosensitivity to rays in a range from an ultraviolet range to a visible range is preferable. The photopolymerization initiator is preferably a photoradical polymerization initiator.

Examples of the photopolymerization initiator include a halogenated hydrocarbon derivative (for example, a compound having a triazine skeleton or a compound having an oxadiazole skeleton), an acylphosphine compound, a hexaarylbiimidazole, an oxime compound, an organic peroxide, a thio compound, a ketone compound, an aromatic onium salt, an α-hydroxyketone compound, and an α-aminoketone compound. From the viewpoint of exposure sensitivity, as the photopolymerization initiator, a trihalomethyltriazine compound, a benzyldimethylketal compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, or a 3-aryl-substituted coumarin compound is preferable, a compound selected from an oxime compound, an α-hydroxyketone compound, an α-aminoketone compound, or an acylphosphine compound is more preferable, and an oxime compound is still more preferable. Examples of the photopolymerization initiator include compounds described in paragraphs 0065 to 0111 of JP2014-130173A, and JP6301489B, the contents of which are incorporated herein by reference.

Examples of a commercially available product of the α-hydroxyketone compound include Omnirad 184, Omnirad 1173, Omnirad 2959, and Omnirad 127 (all of which are manufactured by IGM Resins B.V.) (in order, Irgacure 184, Irgacure 1173, Irgacure 2959, and Irgacure 127, manufactured by former BASF). Examples of a commercially available product of the α-aminoketone compound include Omnirad 907, Omnirad 369, Omnirad 369E, and Omnirad 379EG (all of which are manufactured by IGM Resins B.V) (in order, Irgacure 907, Irgacure 369, Irgacure 369E, and Irgacure 379EG, manufactured by former BASF). Examples of a commercially available product of the acylphosphine compound include Omnirad 819 and Omnirad TPO (both of which are manufactured by IGM Resins B.V) (in order, Irgacure 819 and Irgacure TPO, manufactured by former BASF).

Examples of the oxime compound include the compounds described in JP2001-233842A, the compounds described in JP2000-080068A, the compounds described in JP2006-342166A, the compounds described in J. C. S. Perkin II (1979, pp. 1653-1660), the compounds described in J. C. S. Perkin II (1979, pp. 156-162), the compounds described in Journal of Photopolymer Science and Technology (1995, pp. 202-232), the compounds described in JP2000-066385A, the compounds described in JP2004-534797A, the compounds described in JP2006-342166A, the compounds described in JP2017-019766A, the compounds described in JP6065596B, the compounds described in WO2015/152153A, the compounds described in WO2017/051680A, the compounds described in JP2017-198865A, the compounds described in paragraph Nos. 0025 to 0038 of WO2017/164127A, the compounds described in WO2013/167515A, and the compounds described in WO2019/088055A. Specific examples of the oxime compound include 3-benzoyloxyiminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy)iminobutane-2-one, and 2-ethoxycarbonyloxyimino-1-phenylpropane-1-one. Examples of a commercially available product include IRGACURE-OXE01, IRGACURE-OXE02, IRGACURE-OXE03, and IRGACURE-OXE04 (all of which are manufactured by BASF), TR-PBG-304 (manufactured by TRONLY), and ADEKA OPTOMER N-1919 (manufactured by ADEKA Corporation; photopolymerization initiator 2 described in JP2012-014052A). In addition, as the oxime compound, it is also preferable to use a compound having no colorability or a compound having high transparency and being resistant to discoloration. Examples of a commercially available product include ADEKA ARKLS NCI-730, NCI-831, and NCI-930 (all of which are manufactured by ADEKA Corporation).

In the present invention, an oxime compound having a fluorene ring can also be used as the photopolymerization initiator. Specific examples of the oxime compound having a fluorene ring include the compounds described in JP2014-137466A.

In addition, as the photopolymerization initiator, an oxime compound having a skeleton in which at least one benzene ring of a carbazole ring is a naphthalene ring can also be used. Specific examples of such an oxime compound include the compounds described in WO2013/083505A.

In the present invention, an oxime compound having a fluorine atom can also be used as the photopolymerization initiator. Specific examples of the oxime compound having a fluorine atom include the compounds described in JP2010-262028A, the compounds 24, and 36 to 40 described in JP2014-500852A, and the compound (C-3) described in JP2013-164471A.

In the present invention, an oxime compound having a nitro group can be used as the photopolymerization initiator. The oxime compound having a nitro group is also preferably used in the form of a dimer. Specific examples of the oxime compound having a nitro group include the compounds described in paragraph Nos. 0031 to 0047 of JP2013-114249A and paragraph Nos. 0008 to 0012 and 0070 to 0079 of JP2014-137466A, the compounds described in paragraph Nos. 0007 to 0025 of JP4223071B, and ADEKA ARKLS NCI-831 (manufactured by ADEKA Corporation).

In the present invention, an oxime compound having a benzofuran skeleton can also be used as the photopolymerization initiator. Specific examples thereof include OE-01 to OE-75 described in WO2015/036910A.

Specific examples of the oxime compound which are preferably used in the present invention are shown below, but the present invention is not limited thereto.

(C-1)

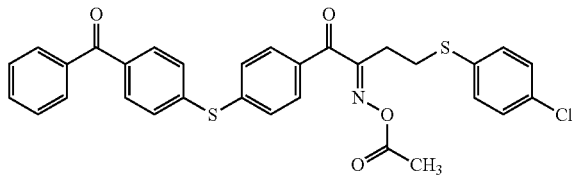

(C-2)

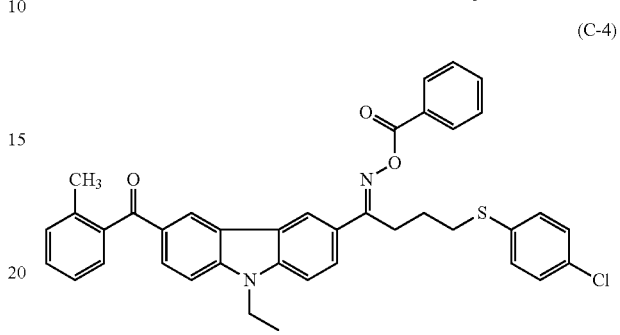

(C-3)

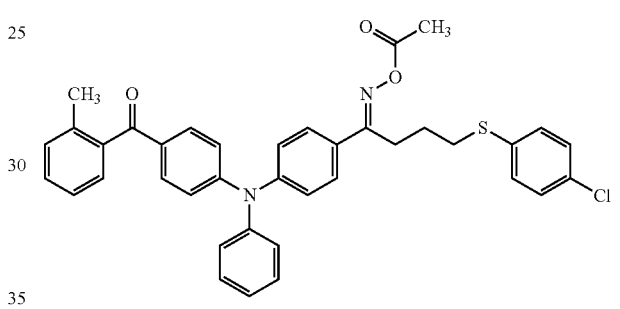

(C-4)

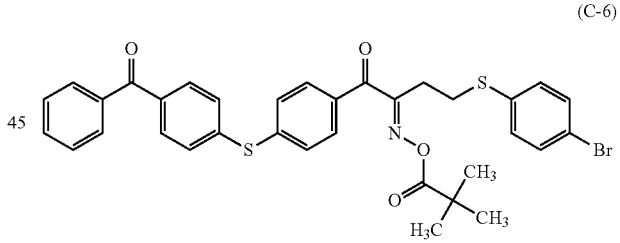

(C-5)

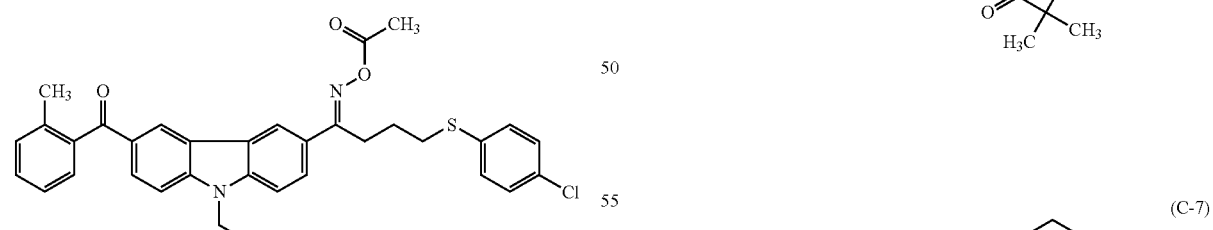

(C-6)

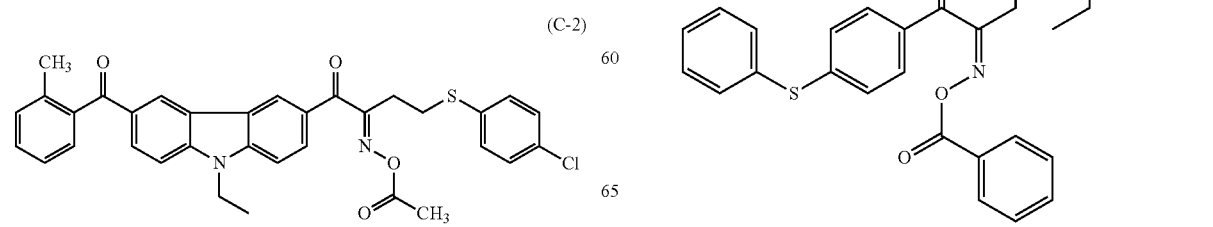

(C-7)

(C-8)
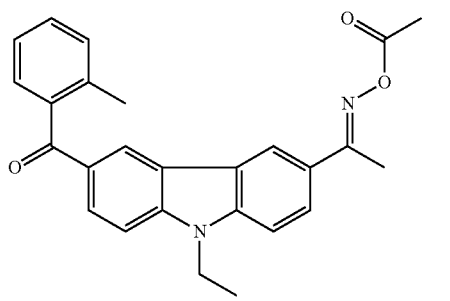

(C-9)
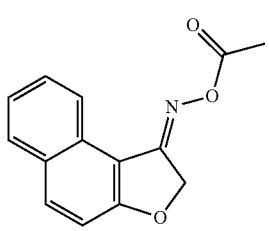

(C-10)
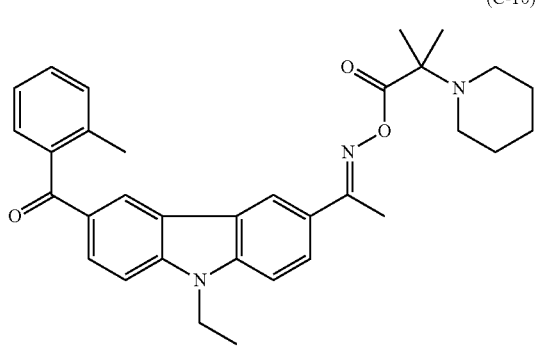

(C-11)
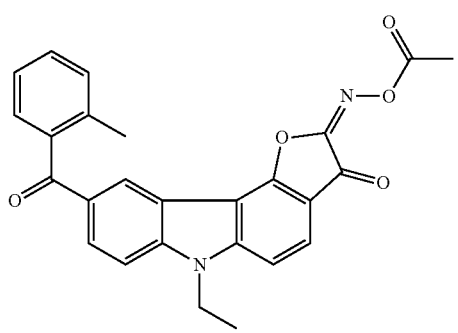

(C-12)
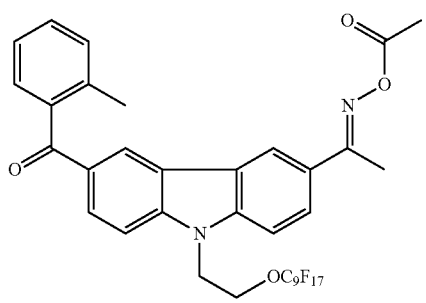

(C-13)
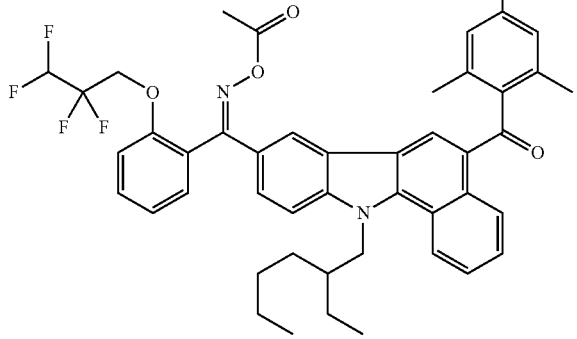

(C-14)
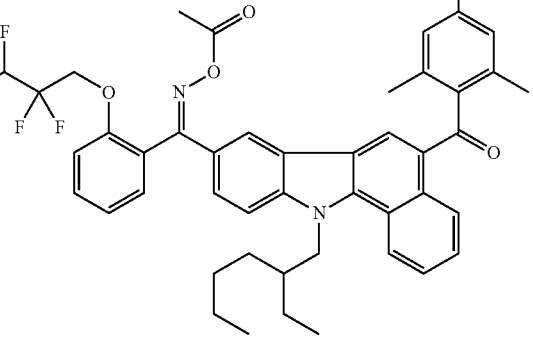

(C-15)
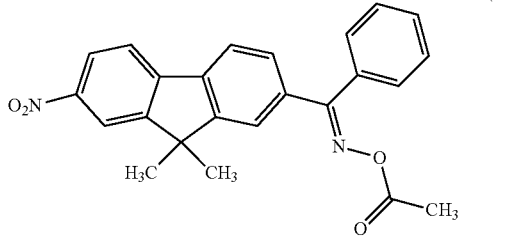

(C-16)
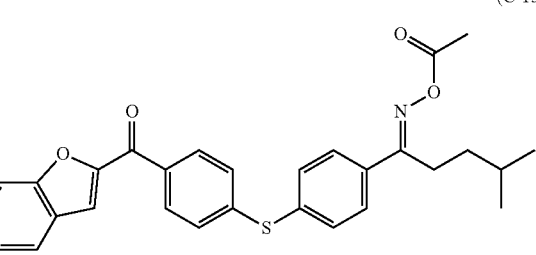

The oxime compound is preferably a compound having a maximal absorption wavelength in a wavelength range of 350 to 500 nm and more preferably a compound having a maximal absorption wavelength in a wavelength range of 360 to 480 nm. In addition, from the viewpoint of sensitivity, the molar absorption coefficient of the oxime compound at a wavelength of 365 nm or 405 nm is preferably high, more preferably 1000 to 300000, still more preferably 2000 to 300000, and particularly preferably 5000 to 200000. The molar absorption coefficient of a compound can be measured using a well-known method. For example, the molar absorption coefficient is preferably measured by a spectrophotometer (Cary-5 spectrophotometer, manufactured by Varian) using an ethyl acetate solvent at a concentration of 0.01 g/L.

As the photopolymerization initiator, a bifunctional or tri- or higher functional photoradical polymerization initiator may be used. By using such a photoradical polymerization initiator, two or more radicals are generated from one molecule of the photoradical polymerization initiator, and as a result, good sensitivity is obtained. In addition, in a case where a compound having an asymmetric structure is used, crystallinity is reduced, solubility in a solvent or the like is improved, and the compound is hardly precipitated over time, and the temporal stability of the composition can be improved. Specific examples of the bifunctional or tri- or higher functional photoradical polymerization initiator include dimers of the oxime compounds described in JP2010-527339A, JP2011-524436A, WO2015/004565A, paragraph Nos. 0407 to 0412 of JP2016-532675A, and paragraph Nos. 0039 to 0055 of WO2017/033680A; the compound (E) and compound (G) described in JP2013-522445A; Cmpd 1 to 7 described in WO2016/034963A; the oxime ester photoinitiators described in paragraph No. 0007 of JP2017-523465A; the photoinitiators described in paragraph Nos. 0020 to 0033 of JP2017-167399A; and the photopolymerization initiator (A) described in paragraph Nos. 0017 to 0026 of JP2017-151342A.

It is also preferable that the photopolymerization initiator includes an oxime compound and an α-aminoketone compound. By using the oxime compound and the α-aminoketone compound in combination, developability is improved, and a pattern having excellent rectangularity is likely to be formed. In a case where an oxime compound and an α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator in the total solid content of the composition is preferably 0.1 to 40 mass %, more preferably 0.5 to 30 mass %, and still more preferably 1 to 20 mass %. The composition may include only one kind of the photopolymerization initiator or two or more kinds thereof. In a case of including two or more kinds thereof, the total amount thereof is preferably within the above-described range.

[Coloring Material]

The composition according to the embodiment of the present invention may contain a coloring material. Different materials are used for the above-described modified silica particles and the coloring material. The coloring material may be used alone, or in combination of two or more kinds thereof.

Examples of the coloring material include a chromatic colorant, an achromatic colorant, and an infrared absorber. In the present invention, the chromatic colorant denotes a colorant other than a white colorant and a black colorant. It is preferable that the chromatic colorant is a colorant having an absorption in a wavelength range of 400 nm or more and less than 650 nm.

The content of the coloring material is preferably 10 to 80 mass %, more preferably 15 to 75 mass %, and still more preferably 20 to 70 mass % with respect to the total solid content of the composition.

The composition according to the embodiment of the present invention may include only one kind of the coloring material or two or more kinds thereof. In a case of including two or more kinds thereof, the total amount thereof is preferably within the above-described range.

<Chromatic Colorant>

Examples of the chromatic colorant include red colorants, green colorants, blue colorants, yellow colorants, violet colorants, and orange colorants. The chromatic colorant may be a pigment or a dye. The pigment and the dye may be used in combination. In addition, the pigment may be either an inorganic pigment or an organic pigment. In addition, as the pigment, a material in which a part of an inorganic pigment or an organic-inorganic pigment is replaced with an organic chromophore can also be used. By substituting an inorganic pigment or an organic-inorganic pigment with an organic chromophore, hue design can be easily performed.

An average primary particle diameter of the pigment is preferably 1 to 200 nm. The lower limit is preferably 5 nm or more and more preferably 10 nm or more. The upper limit is preferably 180 nm or less, more preferably 150 nm or less, and still more preferably 100 nm or less. In a case where the average primary particle diameter of the pigment is within the above-described range, dispersion stability of the pigment in the composition is good. In the present invention, the primary particle diameter of the pigment can be determined from a captured image obtained by observing primary particles of the pigment using a transmission electron microscope. Specifically, a projected area of the primary particles of the pigment is determined, and the corresponding equivalent circle diameter is calculated as the primary particle diameter of the pigment. In addition, the average primary particle diameter in the present invention is the arithmetic average value of the primary particle diameters with respect to 400 primary particles of the pigment. In addition, the primary particle of the pigment refers to a particle which is independent without aggregation.

It is preferable that the chromatic colorant includes a pigment. The content of the pigment in the chromatic colorant is preferably 50 mass % or more, more preferably 70 mass % or more, still more preferably 80 mass % or more, and particularly preferably 90 mass % or more. Examples of the pigment include the following pigments:

Color Index (C. I.) Pigment Yellow (hereinafter, also referred to as "PY") 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, 215, 228, 231, 232 (methine-based), 233 (quinoline-based), 234 (aminoketone-based), 235 (aminoketone-based), 236 (aminoketone-based), and the like (all of which are yellow pigments);

C. I. Pigment Orange (hereinafter, also referred to as "PO") 2, 5, 13, 16, 17:1, 31, 34, 36, 38, 43, 46, 48, 49, 51, 52, 55, 59, 60, 61, 62, 64, 71, 73, and the like (all of which are orange pigments);

C. I. Pigment Red (hereinafter, also referred to as "PR") 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 269, 270, 272, 279, 294 (xanthene-based, Organo Ultramarine, Bluish Red), 295 (azo-based), 296 (azo-based), 297 (aminoketone-based), and the like (all of which are red pigments);

C. I. Pigment Green (hereinafter, also referred to as "PG") 7, 10, 36, 37, 58, 59, 62, 63, 64 (phthalocyanine-based), 65 (phthalocyanine-based), 66 (phthalocyanine-based), and the like (all of which are green pigments);

C. I. Pigment Violet (hereinafter, also referred to as "PV") 1, 19, 23, 27, 32, 37, 42, 60 (triarylmethane-based), 61 (xanthene-based), and the like (all of which are violet pigments); and C. I. Pigment Blue (hereinafter, also referred to as "PB") 1, 2, 15, 15:1, 15:2, 15:3, 15:4, 15:6, 16, 22, 29, 60, 64, 66, 79, 80, 87 (monoazo-based), 88 (methine-based), and the like (all of which are blue pigments).

In addition, a halogenated zinc phthalocyanine pigment having an average number of halogen atoms in one molecule of 10 to 14, an average number of bromine atoms in one molecule of 8 to 12, and an average number of chlorine atoms in one molecule of 2 to 5 can also be used as the green pigment. Specific examples thereof include the compounds described in WO2015/118720A. In addition, as the green pigment, compounds described in CN2010-6909027A, phthalocyanine compounds described in WO2012/102395A, which have a phosphoric acid ester as a ligand, or the like can also be used.

In addition, an aluminum phthalocyanine compound having a phosphorus atom can also be used as the blue pigment. Specific examples thereof include the compounds described in paragraph Nos. 0022 to 0030 of JP2012-247591A and paragraph No. 0047 of JP2011-157478A.

In addition, as the yellow pigment, pigments described in JP2008-074985A, compounds described in JP2008-074987A, quinophthalone compounds described in JP2013-061622A, quinophthalone compounds described in JP2013-181015A, colorants described in JP2014-085565A, pigments described in JP2016-145282A, pigments described in JP2017-201003A, pigments described in 2017-197719A, pigments described in paragraph Nos. 0011 to 0062 and 0137 to 0276 of JP2017-171912A, pigments described in paragraph Nos. 0010 to 0062 and 0138 to 0295 of JP2017-171913A, pigments described in paragraph Nos. 0011 to 0062 and 0139 to 0190 of JP2017-171914A, pigments described in paragraph Nos. 0010 to 0065 and 0142 to 0222 of JP2017-171915A, quinophthalone compounds described in JP2017-197640A, quinophthalone-based pigments described in JP2018-040835A, pigments described in JP2018-203798A, pigments described in JP2018-062578A, quinophthalone-based yellow pigments described in JP2018-155881A, compounds described in JP2018-062644A, quinophthalone compounds described in JP6432077B, or pigments described in JP6443711B can also be used.

In addition, as the yellow pigment, compounds described in JP2018-062644A can also be used. These compounds can also be used as a pigment derivative.

As the red pigment, diketopyrrolopyrrole compounds described in JP2017-201384A, in which the structure has at least one substituted bromine atom, diketopyrrolopyrrole compounds described in paragraph Nos. 0016 to 0022 of JP6248838B, diketopyrrolopyrrole compounds described in WO2012/102399A, diketopyrrolopyrrole compounds described in WO2012/117965A, naphtholazo compounds described in JP2012-229344, and the like can also be used. In addition, as the red pigment, a compound having a structure that an aromatic ring group in which a group bonded with an oxygen atom, a sulfur atom, or a nitrogen atom is introduced to an aromatic ring is bonded to a diketopyrrolopyrrole skeleton can be used.

In addition, as the red pigment, compounds described in JP6516119B and JP6525101B can also be used. These compounds can also be used as a pigment derivative.

In the present invention, a dye can also be used as the chromatic colorant. The dye is not particularly limited and a known dye can be used. Examples thereof include a pyrazoleazo-based dye, an anilinoazo-based dye, a triarylmethane-based dye, an anthraquinone-based dye, an anthrapyridone-based dye, a benzylidene-based dye, an oxonol-based dye, a pyrazolotriazoleazo-based dye, a pyridoneazo-based dye, a cyanine-based dye, a phenothiazine-based dye, a pyrrolopyrazoleazomethine-based dye, a xanthene-based dye, a phthalocyanine-based dye, a benzopyran-based dye, an indigo-based dye, and a pyrromethene-based dye. In addition, thiazole compounds described in JP2012-158649A, azo compounds described in JP2011-184493A, or azo compounds described in JP2011-145540A can also be preferably used. In addition, as yellow dyes, the quinophthalone compounds described in paragraph Nos. 0011 to 0034 of JP2013-054339A, or the quinophthalone compounds described in paragraph Nos. 0013 to 0058 of JP2014-026228A can be used.

<Achromatic Colorant>

Examples of the achromatic colorant include a black colorant and a white colorant.

(Black Colorant)

Examples of the black colorant include one or more selected from the group consisting of black pigments and black dyes.

In addition, a black colorant which is adjusted so as to be black as a whole by combining a plurality of colorants which cannot be used alone as the black colorant may be used.

For example, a plurality of pigments having a color other than black alone may be combined and used as the black pigment. Similarly, a plurality of dyes having a color other than black alone may be combined and used as the black dye, and a pigment having a color other than black alone and a dye having a color other than black alone may be combined and used as the black dye.

In the present specification, the black colorant means a coloring material which absorbs over the entire wavelength range of 400 to 700 nm.

More specifically, for example, a black colorant which meets an evaluation standard Z described below is preferable.

First, a composition containing a coloring material, a transparent resin matrix (acrylic resin or the like), and a solvent, in which the content of the coloring material is 60 mass % with respect to the total solid content, is prepared. The obtained composition is applied to a glass substrate so that the film thickness of a coating film after drying is 1 μm to form a coating film. Light shielding properties of the coating film after drying are evaluated using a spectrophotometer (UV-3600 manufactured by Hitachi High-Tech Corporation, or the like). In a case where the maximum value of transmittance of the coating film after drying in a wavelength range of 400 to 700 nm is less than 10%, it can be determined that the above-described coloring material is a black colorant which meets the evaluation standard Z. In the evaluation standard Z, as the black colorant, the maximum value of transmittance of the coating film after drying in a wavelength range of 400 to 700 nm is more preferably less than 8%, and still more preferably less than 5%.

Black Pigment

As the black pigment, various known black pigments can be used. The black pigment may be an inorganic pigment or an organic pigment.

From the viewpoint that light resistance of a light shielding film is more excellent, the black colorant is preferably a black pigment.

As the black pigment, a pigment which expresses black color by itself is preferable, and a pigment which expresses black color by itself and absorbs infrared ray is more preferable.

Here, the black pigment which absorbs infrared ray has absorption, for example, in a wavelength region in the infrared region (preferably, a wavelength of 650 to 1300 nm). A black pigment having a maximal absorption wavelength in a wavelength region of 675 to 900 nm is also preferable.

The particle size of the black pigment is not particularly limited, but from the viewpoint that balance between handleability and temporal stability (black pigment does not settle) of the composition is more excellent, the particle size is preferably 5 to 100 nm, more preferably 5 to 50 nm, and still more preferably 5 to 30 nm.

In the present specification, the particle size of the black pigment means an average primary particle diameter of particles measured by the following method. The average primary particle diameter can be measured using a transmission electron microscope (TEM). As the transmission electron microscope, for example, a transmission microscope HT7700 manufactured by Hitachi High-Tech Corporation. can be used.

A maximum length (Dmax: maximum length between two points on a contour of a particle image) and a maximum perpendicular length (DV-max: shortest length connecting perpendicularly between two straight lines in a case where the image is interposed between the two straight lines parallel with the maximum length) of a particle image obtained by using the transmission electron microscope are measured, and the geometric mean value (Dmax×DV-max)$^{1/2}$ thereof is defined as a particle diameter. Particle diameters of 100 particles by the method are measured, and the arithmetic average value thereof is defined as the average primary particle diameter of the particles.

Inorganic Pigment Used as Black Colorant

The inorganic pigment used as the black colorant is not particularly limited as long as particles have light shielding properties and contain an inorganic compound, and a known inorganic pigment can be used.

From the viewpoint that low reflection properties and light shielding properties of the light shielding film are more excellent, the black colorant is preferably an inorganic pigment.

Examples of the inorganic pigment include Group 4 metal elements such as titanium (Ti) and zirconium (Zr), Group 5 metal elements such as vanadium (V) and niobium (Nb), and metal oxides, metal nitrides, and metal oxynitrides containing one or two or more metal elements selected from the group consisting of cobalt (Co), chromium (Cr), copper (Cu), manganese (Mn), ruthenium (Ru), iron (Fe), nickel (Ni), tin (Sn), and silver (Ag).

As the above-described metal oxides, metal nitrides, and metal oxynitrides, particles in which other atoms are further mixed may be used. For example, metal nitride-containing particles further containing an atom selected from Group 13 to 17 elements of the periodic table (preferably, an oxygen atom and/or a sulfur atom) can be used.

A method for producing the above-described metal oxides, metal nitrides, or metal oxynitrides is not particularly limited as long as a black pigment having desired physical properties can be obtained, and a known production method such as a gas phase reaction method can be used. Examples of the gas phase reaction method include an electric furnace method and a thermal plasma method, and from the viewpoint that there are few impurities mixed in, the particle size is easy to match, and productivity is high, a thermal plasma method is preferable.

The above-described metal oxides, metal nitrides, or metal oxynitrides may be subjected to a surface modification treatment. For example, a surface modification treatment may be performed with a surface treatment agent having both a silicone group and an alkyl group. Examples of such an inorganic pigment include "KTP-09" series (manufactured by Shin-Etsu Chemical Co., Ltd.). In addition, a surface of the metal nitride or the metal oxynitride may be coated with silica and/or alumina. In this case, the entire surface may be coated, or a part of the surface may be coated.

Among these, from the viewpoint that occurrence of undercut in a case of forming the light shielding film can be suppressed, nitrides or oxynitrides of one or more metals selected from the group consisting of titanium, vanadium, zirconium, and niobium are more preferable. In addition, from the viewpoint that moisture resistance of the light shielding film is more excellent, oxynitrides of one or more metals selected from the group consisting of titanium, vanadium, zirconium, and niobium are still more preferable, and titanium oxynitride (titanium black), zirconium nitride, or zirconium oxynitride is particularly preferable.

Titanium black is black particles containing titanium oxynitride. The surface of the titanium black can be modified, as necessary, according to the purpose of improving dispersibility, suppressing aggregating properties, and the like. The titanium black can be coated with silicon oxide, titanium oxide, germanium oxide, aluminum oxide, magnesium oxide, or zirconium oxide, and can be subjected to a treatment with a water repellent substance as shown in JP2007-302836A.

As a method for producing the titanium black, a method of heating and reducing a mixture of titanium dioxide and metallic titanium in a reducing atmosphere (JP1974-5432A (JP-S49-5432A)), a method of reducing ultrafine titanium dioxide obtained by high-temperature hydrolysis of titanium tetrachloride in a hydrogen-containing reducing atmosphere (JP1982-205322A (JP-S57-205322A)), a method of high temperature reduction of titanium dioxide or titanium hydroxide in the presence of ammonia (JP1985-65069A (JP-S60-65069A) and JP1986-201610A (JP-S61-201610A)), a method of adhering a vanadium compound to titanium dioxide or titanium hydroxide and reducing at high-temperature in the presence of ammonia (JP1986-201610A (JP-S61-201610A)), and the like can be used, but the method for producing the titanium black is not particularly limited thereto.

The particle size of the titanium black is not particularly limited, but is preferably 10 to 45 nm and more preferably 12 to 20 nm. The specific surface area of the titanium black is not particularly limited, but in order to set water repellency after the surface treatment with a water repellent agent to be specified performance, a value measured by Brunauer, Emmett, Teller (BET) method is preferably 5 to 150 m$^2$/g and more preferably 20 to 100 m$^2$/g.

Examples of a commercially available product of the titanium black include Titanium black 10S, 12S, 13R, 13M, 13M-C, 13R, 13R-N, and 13M-T (trade name, manufactured by Mitsubishi Materials Corporation), Tilack D (trade name, manufactured by Akokasei Co., Ltd.), and MT-150A (trade name, manufactured by TAYCA Co., Ltd.).

The composition also preferably contains the titanium black as a dispersoid containing titanium black and an Si atom. In this aspect, the titanium black is contained as a dispersoid in the composition. The content ratio (Si/Ti) of Si atoms to Ti atoms in the dispersoid is preferably 0.05 to 0.5, more preferably 0.07 to 0.4 in terms of mass. Here, the above-described dispersoid includes both those in which the titanium black is in a state of primary particle and those in which the titanium black is in a state of aggregate (secondary particle).

In addition, in a case where Si/Ti of the dispersoid is a predetermined value or more, a residue is less likely to remain in a removed portion in a case where a coating film using the dispersoid is patterned by optical lithography or the like, and in a case where Si/Ti of the dispersoid is a predetermined value or less, light shielding performance tends to be good.

In order to change Si/Ti of the dispersoid (for example, to make it 0.05 or more), the following method can be used. First, a dispersion is obtained by dispersing titanium oxide and silica particles using a disperser, and by reducing the mixture at a high temperature (for example, 850° C. to 1000° C.), a dispersoid containing titanium black particles as a main component and containing Si and Ti can be obtained. Titanium black in which Si/Ti has been adjusted can be produced, for example, by a method described in paragraphs 0005 and 0016 to 0021 of JP2008-266045A.

The content ratio (Si/Ti) of Si atoms to Ti atoms in the dispersoid is measured, for example, using a method (2-1) or method (2-3) described in paragraphs 0054 to 0056 of WO2011/049090A.

In the dispersoid containing titanium black and Si atom, the above-described titanium black can be used. In addition, in the dispersoid, for the purpose of adjusting dispersibility, colorability, and the like, in addition to the titanium black, one or two or more black pigments consisting of composite oxides of a plurality of metals selected from Cu, Fe, Mn, V, Ni, and the like, cobalt oxide, iron oxide, carbon black, and aniline black may be used in combination as the dispersoid. In this case, it is preferable that the dispersoid consisting of titanium black occupies 50 mass % or more of the total dispersoid.

Examples of the inorganic pigment include carbon black.

Examples of the carbon black include furnace black, channel black, thermal black, acetylene black, and lamp black.

As the carbon black, carbon black produced by a known method such as an oil furnace method may be used, or a commercially available product may be used. Specific examples of the commercially available product of the carbon black include organic pigments such as C. I. Pigment Black 1 and inorganic pigments such as C. I. Pigment Black 7.

As the carbon black, surface-treated carbon black is preferable. By the surface treatment, a particle surface state of the carbon black can be reformed, and dispersion stability in the composition can be improved. Examples of the surface treatment include a coating treatment with a resin, a surface treatment for introducing an acidic group, and a surface treatment with a silane coupling agent.

As the carbon black, carbon black coated with a resin is preferable. By coating the surface of the carbon black particles with an insulating resin, light shielding properties and insulating properties of the light shielding film can be improved. In addition, reliability of the image display device can be improved by reducing leakage current and the like. Therefore, it is suitable for applications in which the light shielding film is required to have insulating properties.

Examples of the coating resin include an epoxy resin, polyamide, polyamidoimide, a novolac resin, a phenol resin, a urea resin, a melamine resin, polyurethane, a diallyl phthalate resin, an alkylbenzene resin, polystyrene, polycarbonate, polybutylene terephthalate, and modified polyphenylene oxide.

From the viewpoint that light shielding properties and insulating properties of the light shielding film are more excellent, the content of the coating resin is preferably 0.1 to 40 mass % and more preferably 0.5 to 30 mass % with respect to the total of the carbon black and the coating resin.

In addition, zirconium nitride described in JP2017-222559A, WO2019/130772A, and the like can also be preferably used.

Organic Pigment Used as Black Colorant

The organic pigment used as the black colorant is not particularly limited as long as particles have light shielding properties and contain an organic compound, and a known organic pigment can be used.

In the present invention, examples of the organic pigment include a bisbenzofuranone compound, an azomethine compound, a perylene compound, and an azo compound. Among these, a bisbenzofuranone compound or a perylene compound is preferable.

Examples of the bisbenzofuranone compound include the compounds described in JP2010-534726A, JP2012-515233A, and JP2012-515234A, and the like. The bisbenzofuranone compound is available, for example, as "Irgaphor Black" (trade name) manufactured by BASF.

Examples of the perylene compound include the compounds described in JP1987-1753A (JP-S62-1753A) and JP1988-26784B (JP-S63-26784B). The perylene compound is available as C. I. Pigment Black 21, 30, 31, 32, 33, and 34.

Black Dye

As the black dye, a dye which expresses black color by itself can be used, and for example, a pyrazoleazo compound, a pyrromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothiazine compound, a pyrrolopyrazoleazomethine compound, and the like can be used.

In addition, as the black dye, compounds described in JP1989-90403A (JP-S64-90403A), JP1989-91102A (JP-S64-91102A), JP1989-94301A (JP-H1-94301A), JP1994-11614A (JP-H6-11614A), JP2592207B, U.S. Pat. Nos. 4,808,501A, 5,667,920A, 505,950A, JP1993-333207A (JP-H5-333207A), JP1994-35183A (JP-H6-35183A), JP1994-51115A (JP-H6-51115A), JP1994-194828A (JP-H6-194828A), and the like can be referred to, the contents of which are incorporated herein by reference.

Specific examples of these black dyes include dyes defined by Color Index (C. I.) of solvent black 27 to 47, and a dye defined by C. I. of solvent black 27, 29, or 34 is preferable.

In addition, examples of a commercially available product of these black dyes include dyes such as Spiron Black MH and Black BH (both manufactured by Hodogaya Chemical Co., Ltd.), VALIFAST Black 3804, 3810, 3820, and 3830 (all manufactured by ORIENT CHEMICAL INDUSTRIES CO., LTD.), Savinyl Black RLSN (manufactured by Clariant), and KAYASET Black K-R and K-BL (both manufactured by Nippon Kayaku Co., Ltd.).

In addition, as the black dye, a coloring agent multimer may be used. Examples of the coloring agent multimer include compounds described in JP2011-213925A and JP2013-041097A. In addition, a polymerizable dye having a polymerizable property in the molecule may be used, and examples of a commercially available product thereof include RDW series manufactured by Wako Pure Chemical Corporation.

Further, as described above, a plurality of dyes having a color other than black alone may be combined and used as the black dye. As such coloring dye, for example, in addition to dyes of chromatic colors such as R (red), G (green), and B (blue) (chromatic dyes), dyes described in paragraphs 0027 to 0200 of JP2014-42375A can also be used.

(White Colorant)

Examples of the white colorant include one or more selected from the group consisting of white pigments and white dyes, and from the viewpoint of weather fastness and the like, a white pigment is preferable.

Examples of the white pigment include titanium oxide, strontium titanate, barium titanate, zinc oxide, magnesium oxide, zirconium oxide, aluminum oxide, barium sulfate, silica, talc, mica, aluminum hydroxide, calcium silicate, aluminum silicate, hollow resin particles, and zinc sulfide. The white pigment is preferably particles having a titanium atom, more preferably titanium oxide. As the titanium oxide, titanium oxide described in "Titanium Oxide—Physical Properties and Applied Technology, written by Manabu Kiyono, Jun. 25, 1991, published by Gihodo Shuppan Co., Ltd." can also be suitably used.

In addition, as the white pigment, C. I. Pigment White 1, 3, 6, 16, 18, and 21 can be used.

<Infrared Absorber>

The infrared absorber means a compound having absorption in a wavelength region in the infrared region (preferably, a wavelength of 650 to 1300 nm). As the infrared absorber, a compound having a maximal absorption wavelength in a wavelength region of 675 to 900 nm is preferable.

Examples of the colorant having such spectral characteristics include a pyrrolopyrrole compound, a copper compound, a cyanine compound, a phthalocyanine compound, an iminium compound, a thiol complex compound, a transition metal oxide compound, a squarylium compound, a naphthalocyanine compound, a quaterrylene compound, a dithiol metal complex compound, and a croconium compound.

As the phthalocyanine compound, naphthalocyanine compound, iminium compound, cyanine compound, squarylium compound, and croconium compound, compounds described in paragraphs 0010 to 0081 of JP2010-111750A may also be used, the contents of which are incorporated herein by reference. The cyanine compound can be found in, for example, "Functional Colorants by Makoto Okawara, Masaru Matsuoka, Teijiro Kitao, and Tsuneoka Hirashima, published by Kodansha Scientific Ltd.", the content of which is incorporated herein by reference.

As the colorant having the above-described spectral characteristics, compounds described in paragraphs 0004 to 0016 of JP1995-164729A (JP-H07-164729A) and/or compounds described in paragraphs 0027 to 0062 of JP2002-146254A, or near-infrared absorbing particles consisting of crystallites of oxides containing Cu and/or P described in paragraphs 0034 to 0067 of JP2011-164583A and having a number average aggregated particle diameter of 5 to 200 nm can also be used.

As the compound having a maximal absorption wavelength in a wavelength region of 675 to 900 nm, at least one selected from the group consisting of a cyanine compound, a pyrrolopyrrole compound, a squarylium compound, a phthalocyanine compound, and a naphthalocyanine compound is preferable.

In addition, the infrared absorber is preferably a compound which dissolves in water at 25° C. in an amount of 1 mass % or more, and more preferably a compound which dissolves in water at 25° C. in an amount of 10 mass % or more. By using such a compound, solvent resistance is improved.

As the pyrrolopyrrole compound, paragraphs 0049 to 0062 of JP2010-222557A can be referred to, the content of which is incorporated herein by reference. As the cyanine compound and the squarylium compound, paragraphs 0022 to 0063 of WO2014/088063A, paragraphs 0053 to 0118 of WO2014/030628A, paragraphs 0028 to 0074 of JP2014-59550A, paragraphs 0013 to 0091 of WO2012/169447A, paragraphs 0019 to 0033 of JP2015-176046A, paragraphs 0053 to 0099 of JP2014-63144A, paragraphs 0085 to 0150 of JP2014-52431, paragraphs 0076 to 0124 of JP2014-44301A, paragraphs 0045 to 0078 of JP2012-8532A, paragraphs 0027 to 0067 of JP2015-172102A, paragraphs 0029 to 0067 of JP2015-172004A, paragraphs 0029 to 0085 of JP2015-40895A, paragraphs 0022 to 0036 of JP2014-126642A, paragraphs 0011 to 0017 of JP2014-148567A, paragraphs 0010 to 0025 of JP2015-157893A, paragraphs 0013 to 0026 of JP2014-095007A, paragraphs 0013 to 0047 of JP2014-80487A, paragraphs 0007 to 0028 of JP2013-227403A, and the like can be referred to, the contents of which are incorporated herein by reference.

[Polymerization Inhibitor]

The composition according to the embodiment of the present invention may contain a polymerization inhibitor.

As the polymerization inhibitor, for example, a known polymerization inhibitor can be used. Examples of the polymerization inhibitor include phenol-based polymerization inhibitors (for example, p-methoxyphenol, 2,5-di-tert-butyl-4-methylphenol, 2,6-di-tert-butyl-4-methylphenol, 4,4'-thiobis (3-methyl-6-t-butylphenol), 2,2'-methylenebis (4-methyl-6-t-butylphenol), 4-methoxynaphthol, and the like); hydroquinone-based polymerization inhibitor (for example, hydroquinone, 2,6-di-tert-butyl hydroquinone, and the like); quinone-based polymerization inhibitors (for example, benzoquinone and the like); free radical polymerization inhibitors (for example, 2,2,6,6-tetramethylpiperidine 1-oxyl free radical, 4-hydroxy-2,2,6,6-tetramethylpiperidine 1-oxyl free radical, and the like); nitrobenzene-based polymerization inhibitors (for example, nitrobenzene, 4-nitrotoluene, and the like); and phenothiazine-based polymerization inhibitors (for example, phenothiazine, 2-methoxyphenothiazine, and the like).

Among these, from the viewpoint that the composition has more excellent effects, a phenol-based polymerization inhibitor or a free radical-based polymerization inhibitor is preferable.

The content of the polymerization inhibitor is preferably 0.0001 to 0.5 mass %, more preferably 0.001 to 0.2 mass %, and still more preferably 0.008 to 0.05 mass % with respect to the total solid content of the composition. The polymerization inhibitor may be used singly or in combination of two or more kinds thereof. In a case where two or more kinds of polymerization inhibitors are used in combination, it is preferable that the total content thereof is within the above-described range.

In addition, a ratio (content of polymerization inhibitor/content of polymerizable compound (mass ratio)) of the content of the polymerization inhibitor to the content of the polymerizable compound in the composition is preferably 0.00005 to 0.02 and more preferably 0.0001 to 0.01.

[Organic Solvent]

The composition according to the embodiment of the present invention includes the organic solvent included in the dispersion liquid, but may contain an organic solvent other than the organic solvent which will be included in the composition due to the addition of the dispersion liquid. Specific examples of such an organic solvent are the same as those of the organic solvent included in the dispersion liquid, and thus the description thereof will be omitted.

The content of the organic solvent (including the organic solvent included in the dispersion liquid) is preferably 10 to 97 mass % with respect to the total mass of the composition. The lower limit is preferably 30 mass % or more, more preferably 40 mass % or more, still more preferably 50 mass % or more, even still more preferably 60 mass % or more, and particularly preferably 70 mass % or more. The upper limit is preferably 96 mass % or less and more preferably 95 mass % or less. The composition may include only one kind of the organic solvent or two or more kinds thereof. In a case of including two or more kinds thereof, the total amount thereof is preferably within the above-described range.

[Other Optional Components]

The composition may further contain any component other than the above-described components. Examples thereof include a particulate component other than those described above, an ultraviolet absorber, a silane coupling agent, a surfactant, a sensitizer, a co-sensitizer, a crosslinking agent, a curing accelerator, a thermal curing accelerator, a plasticizer, a diluent, and a sensitization agent, and further, a known additive such as an adhesion promoter to the surface of the substrate and other auxiliary agents (for example, conductive particles, a filler, an antifoaming agent, a flame retardant, a leveling agent, a peeling accelerator, an antioxidant, an aromatic chemical, a surface tension adjuster, a chain transfer agent, and the like) may be added as necessary.

The details of the components can be found in, for example, paragraphs 0183 to 0228 of JP2012-003225A (corresponding to paragraphs 0237 to 0309 of US2013/0034812A), paragraphs 0101 and 0102, 0103 and 0104, and 0107 to 0109 of JP2008-250074A, paragraphs 0159 to 0184 of JP2013-195480A, and the like, the contents of which are incorporated herein by reference.

[Method for Producing Composition]

The composition according to the embodiment of the present invention can be prepared by mixing each of the above-described components by a known mixing method (for example, a mixing method using a stirrer, a homogenizer, a high-pressure emulsification device, a wet-type pulverizer, a wet-type disperser, or the like).

Here, in a case where the composition according to the embodiment of the present invention contains a coloring material, it is preferable to produce the above-described dispersion liquid and a coloring material dispersion liquid in which the coloring material is dispersed, and further mix these with other components to obtain a composition.

The coloring material dispersion liquid is preferably prepared by mixing a coloring material, a resin (preferably a dispersant), and a solvent. In addition, it is also preferable to contain a polymerization inhibitor in the coloring material dispersion liquid.

In the preparation of the composition, each component may be blended together, or each component may be dissolved or dispersed in a solvent and then sequentially blended. In addition, adding sequence and working conditions for blending are not particularly limited.

For the purpose of removing foreign matters, reducing defects, and the like, the composition is preferably filtered through a filter. Since the filter is the same as the filter described in the method for producing the dispersion liquid, the description thereof will be omitted.

[Cured Film]

A cured film according to an embodiment of the present invention is a film formed of the above-described composition according to the embodiment of the present invention. Specifically, the cured film according to the embodiment of the present invention is formed by curing a composition layer formed of the composition according to the embodiment of the present invention to obtain a cured film (including a patterned cured film).

A method for manufacturing the cured film is not particularly limited, but preferably includes the following steps.

Composition layer forming step

Exposing step

Developing step

Hereinafter, the respective steps will be described.

[Composition Layer Forming Step]

In the composition layer forming step, the composition is applied to a support or the like to form a layer (composition layer) of the composition prior to exposure. As the support, for example, a substrate for a solid-state imaging element, which is provided with an imaging element (light receiving element) such as a charge coupled device (CCD) and a complementary metal-oxide semiconductor (CMOS) on a substrate (for example, a silicon substrate), can be used. In addition, optionally, an undercoat layer (base layer) may be provided on the support to improve adhesiveness with a layer above the support, to prevent diffusion of materials, to planarize the surface of the substrate, and the like.

As a method for applying the composition to the support, various coating methods such as a slit coating method, an ink jet method, a spin coating method, a cast coating method, a roll coating method, and a screen printing method can be applied. The film thickness of the composition layer is preferably 0.1 to 10 μm, more preferably 0.2 to 5 μm, and still more preferably 0.2 to 3 μm. The composition layer applied on the support can be dried (pre-baked), for example, in a hot plate, an oven, or the like at a temperature of 50° C. to 140° C. in 10 to 300 seconds.

Examples of the undercoat layer include a film including a resin such as a (meth)acrylic resin. Specific examples of a method for forming the undercoat layer include a method in which a composition containing (meth)acrylate, a crosslinking agent, a surfactant, a solvent, and the like is applied to a support by a coating method such as a spin coating method to obtain a coating film, and then the coating film is dried.

The undercoat layer preferably has a contact angle of 20 to 70 degrees measured with diiodomethane, and preferably has a contact angle of 30 to 80 degrees measured with water. In a case where the contact angle is the lower limit or more of the above-described range, wettability of the color filter is good, and in a case of being the upper limit or less, surface energy of the film is controlled so that application properties of the undercoat layer are good. Examples of a method for adjusting the contact angle to the above-described range include addition of a surfactant and a method of controlling drying speed, spin coating, rotation speed, and the like. The contact angle of the undercoat layer is measured using a contact angle meter based on a liquid droplet method.

As the undercoat layer, a commercially available product may be used, and examples thereof include CT-4000L manufactured by Fujifilm Electronic Materials Co., Ltd.

[Exposing Step]

In the exposing step, the composition layer formed in the composition layer forming step is exposed by irradiating the composition layer with actinic ray or radiation to cure the light-irradiated composition layer.

As a method of light irradiation, it is preferable to irradiate light through a photomask having a patterned opening part.

The exposure is preferably performed by irradiation with radiation. The radiation which can be used for the exposure is preferably ultraviolet rays such as g-ray, h-ray, and i-ray, and a light source is preferably a high-pressure mercury lamp. The irradiation intensity is preferably 5 to 1500 mJ/cm$^2$ and more preferably 10 to 1000 mJ/cm$^2$.

In a case where the composition contains a thermal polymerization initiator, the composition layer may be heated in the above-described exposing step. The heating temperature is not particularly limited, but is preferably 80° C. to 250° C. The heating time is preferably 30 to 300 seconds.

In the exposing step, in a case where the composition layer is heated, a post-heating step described later may be performed in combination. In other words, in the exposing step, in a case where the composition layer is heated, the method for manufacturing the cured film may not include a post-heating step.

[Developing Step]

The developing step is a step of developing the above-described composition layer after exposure to form a cured film. By this step, the composition layer of a light-unirradiated portion in the exposing step is eluted, only the photocured portion remains, and a patterned cured film can be obtained.

The type of a developer used in the developing step is not particularly limited, but an alkali developer which does not damage the underlying imaging element, circuit, and the like is desirable.

The developing temperature is, for example, 20° C. to 30° C.

The developing time is, for example, 20 to 90 seconds. In recent years, in order to remove the residue better, the development may be performed for 120 to 180 seconds. Further, in order to further improve residue removing properties, a step of removing the developer by shaking off per 60 seconds and supplying a fresh developer may be repeated multiple times.

As the alkali developer, an alkaline aqueous solution prepared by dissolving an alkaline compound in water so that the concentration is 0.001 to 10 mass % (preferably, 0.01 to 5 mass %) is preferable.

Examples of the alkaline compound include sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among these, an organic alkali is preferable).

In a case of using an alkali developer, a washing treatment with water is generally performed after the development.

[Post-Baking]

After the exposing step, it is preferable to perform a heating treatment (post-baking). Post-baking is a heating treatment which is performed after the development to complete the cure. The heating temperature is preferably 240° C. or lower and more preferably 220° C. or lower. There is no particular lower limit, but considering efficient and effective treatment, is preferably 50° C. or higher and more preferably 100° C. or higher.

The post-baking can be performed continuously or batch-wise by using a heating unit such as a hot plate, a convection oven (hot air circulation dryer), and a high-frequency heater.

The above-described post-baking is preferably performed in an atmosphere with a low oxygen concentration. The oxygen concentration is preferably 19 volume % or less, more preferably 15 volume % or less, still more preferably 10 volume % or less, particularly preferably 7 volume % or less, and most preferably 3 volume % or less. There is no particular lower limit, but 10 ppm by volume or more is practical.

In addition, the curing may be completed by ultraviolet (UV) irradiation instead of the post-baking by heating described above.

In this case, the above-described composition preferably further contains a UV curing agent. The UV curing agent is preferably a UV curing agent which can be cured at a wavelength shorter than 365 nm, which is an exposure wavelength of the polymerization initiator added for a lithography step by ordinary i-ray exposure. Examples of the UV curing agent include CIBA IRGACURE 2959 (trade name). In a case where the UV irradiation is performed, it is preferable that the composition layer is a material which cures at a wavelength of 340 nm or less. There is no particular lower limit value of the wavelength, but 220 nm or more is common. In addition, the exposure amount of the UV irradiation is preferably 100 to 5000 mJ, more preferably 300 to 4000 mJ, and still more preferably 800 to 3500 mJ. In order to perform low temperature curing more effectively, it is preferable that the UV curing step is performed after the exposing step. It is preferable to use an ozoneless mercury lamp as an exposure light source.

[Physical Properties, Shape, Use, and the Like of Cured Film]

The film thickness of the cured film is, for example, preferably 0.1 to 4.0 μm and more preferably 1.0 to 2.5 μm. In addition, the cured film may be a thinner film or a thicker film than the range, depending on the intended use.

The reflectivity of the cured film is preferably 10% or less, more preferably 5% or less, and still more preferably 3% or less. The lower limit is 0% or more.

The reflectivity referred to here is determined from a reflectivity spectrum obtained by injecting light having a wavelength of 400 to 1100 nm at an incidence angle of 5° using a spectroscope V7200 (trade name) VAR unit manufactured by JASCO Corporation. Specifically, the reflectivity of light having a wavelength showing the maximum reflectivity in the wavelength range of 400 to 1100 nm is defined as the reflectivity of the cured film.

In a case where the cured film has a patterned shape, a size of one side of the pattern of the cured film is preferably 3 μm or less, more preferably 2 μm or less, and still more preferably 1.4 μm or less. The lower limit value of the size of one side of the pattern of the cured film is not particularly limited, but is preferably 0.3 μm.

The patterned shape of the cured film is not particularly limited, but in a case where the cured film is a color filter used for a solid-state imaging element or the like, the patterned shape of the cured film is usually rectangular.

In addition, the above-described cured film is suitable for an optical filter (for example, a color filter), a light shielding member and a light shielding film of a module, and an antireflection member and an antireflection film, which are used in a product such as portable devices such as a personal computer, a tablet, a mobile phone, a smartphone, and a digital camera; office automation (OA) equipments such as a printer multifunction device and a scanner; industrial equipments such as a surveillance camera, a bar code reader, an automated teller machine (ATM), a high-speed camera, and an equipment with personal authentication functions using face image authentication or biometric authentication; in-vehicle camera equipments; medical camera equipments such as an endoscope, a capsule endoscope, and a catheter; and space equipments such as a biosensor, a military reconnaissance camera, a stereoscopic map camera, a meteorological and oceanographic observation camera, a land resource exploration camera, and an exploration camera for space astronomical and deep space targets.

The above-described cured film can also be used for applications such as micro light emitting diode (LED) and micro organic light emitting diode (OLED). The above-described cured film is suitable for a member which imparts a light shielding function or an antireflection function, in addition to an optical filter and an optical film (for example, a color filter) used in the micro LED and micro OLED.

Examples of the micro LED and micro OLED include examples described in JP2015-500562B and JP2014-533890A.

The above-described cured film is also suitable as an optical filter and an optical film (for example, a color filter) used in a quantum dot sensor and a quantum dot solid-state imaging element. In addition, the above-described cured film is also suitable as a member for imparting a light shielding function and an antireflection function. Examples of the quantum dot sensor and the quantum dot solid-state imaging element include examples described in US2012/37789A and WO2008/131313A.

[Light Shielding Film, Color Filter, Optical Element, Solid-State Imaging Element, and Solid-State Imaging Device]

In a case where the cured film according to the embodiment of the present invention is formed of the composition according to the embodiment of the present invention using the black colorant as the coloring material, it is also preferable to use the cured film according to the embodiment of the present invention as a so-called light shielding film. It is also preferable to such a light shielding film for a solid-state imaging element.

The light shielding film is one of the preferred uses in the cured film according to the embodiment of the present invention, and the light shielding film of the present invention can be similarly produced by a method described as the method for manufacturing the cured film.

In a case where the cured film according to the embodiment of the present invention is formed of the composition according to the embodiment of the present invention using the chromatic colorant as the coloring material, it is also preferable to use the cured film according to the embodiment of the present invention as a so-called color filter. It is also preferable to such a color filter for a solid-state imaging element.

The color filter is one of the preferred uses in the cured film according to the embodiment of the present invention, and the color filter of the present invention can be similarly produced by a method described as the method for manufacturing the cured film.

The present invention also includes an invention of an optical element. The optical element of the present invention is an optical element having the above-described cured film. Examples of the optical element include an optical element used in an optical instrument such as a camera, a binocle, a microscope, and a semiconductor exposure device.

Among these, as the above-described optical element, for example, a solid-state imaging element mounted on a camera or the like is preferable.

In addition, the solid-state imaging element according to an embodiment of the present invention is a solid-state imaging element containing the above-described cured film according to the embodiment of the present invention.

Examples of an aspect in which the solid-state imaging element according to the embodiment of the present invention contains the cured film include an aspect in which, on a substrate, a solid-state imaging element (CCD image sensor, CMOS image sensor, or the like) has light receiving elements which consist of a plurality of photodiodes and polysilicon or the like and constitute a light receiving area of the solid-state imaging element, and the cured film is provided on forming surface of the light receiving elements in the support (for example, a portion other than a light receiving section and/or a pixel for color adjustment, or the like) or on the opposite side of the forming surface.

In addition, in a case where the cured film is used as a light attenuation film, for example, in a case where the light attenuation film is disposed so that a part of light passes through the light attenuation film and then is incident on the light receiving elements, a dynamic range of the solid-state imaging element can be improved.

The solid-state imaging device includes the above-described solid-state imaging element.

Figure 2:
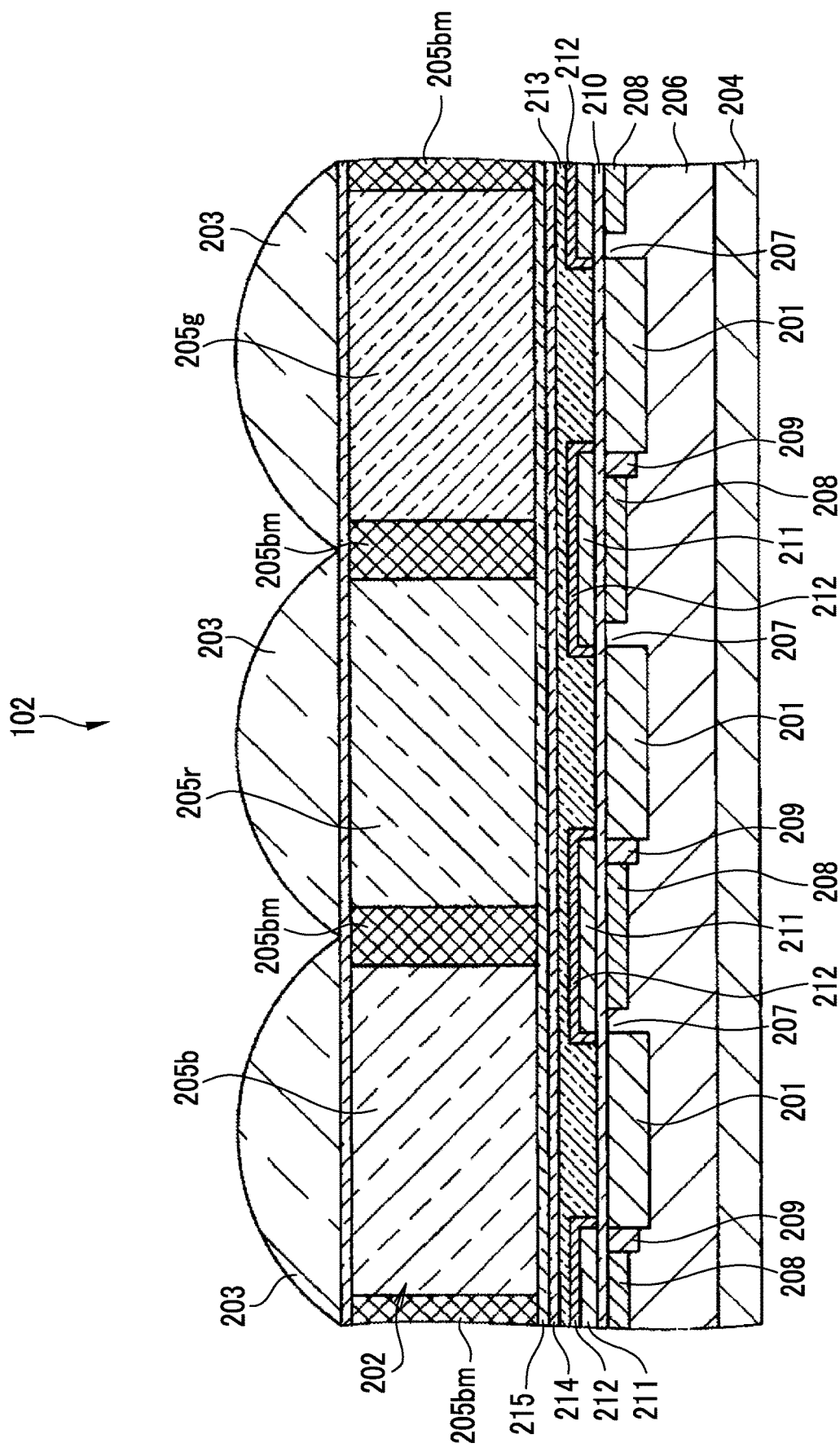
FIG. 2 is a schematic cross-sectional view showing an enlarged imaging unit included in the solid-state imaging device of FIG. 1.

Configuration examples of the solid-state imaging device and the solid-state imaging element will be described with reference to FIGS. 1 and 2. In FIGS. 1 and 2, in order to clarify each part, the ratio of the mutual thickness and/or the width is ignored and a part is exaggerated.

FIG. 1 is a schematic cross-sectional view showing a configuration example of a solid-state imaging device containing the solid-state imaging element according to the embodiment of the present invention.

As shown in FIG. 1, a solid-state imaging device 100 includes a rectangular solid-state imaging element 101, a transparent cover glass 103 which is held above the solid-state imaging element 101 and seals the solid-state imaging element 101. Further, a lens layer 111 is provided on the cover glass 103 so as to be overlapped with a spacer 104. The lens layer 111 is composed of a support 113 and a lens material 112. The lens layer 111 may be composed of a support 113 and a lens material 112, in which both are integrally molded. In a case where stray light is incident on a peripheral region of the lens layer 111, due to diffusion of light, an effect of light collection on the lens material 112 is weakened, and light reaching an imaging unit 102 is reduced. In addition, noise is also generated due to the stray light. Therefore, the peripheral region of the lens layer 111 is provided with a light shielding film 114 to shield light. The cured film according to the embodiment of the present invention can also be used as the light shielding film 114.

The solid-state imaging element 101 photoelectrically converts an optical image imaged by the imaging unit 102 which is a light receiving surface thereof, and outputs the optical image as an image signal. The solid-state imaging element 101 includes a laminated substrate 105 in which two substrates are laminated. The laminated substrate 105 is composed of a rectangular chip board 106 and a circuit board 107 of the same size, and the circuit board 107 is laminated on a back surface of the chip board 106.

As a material of the substrate used as the chip board 106, for example, a known material can be used.

The imaging unit 102 is provided at the center of a surface of the chip board 106. In addition, a peripheral region of the imaging unit 102 is provided with a light shielding film 115. By shielding stray light incident on the peripheral region by the light shielding film 115, it is possible to prevent the generation of dark current (noise) from the circuit in the peripheral region. The cured film according to the embodiment of the present invention can also be used as the light shielding film 115.

A plurality of electrode pads 108 are provided on a surface edge of the chip board 106. The electrode pads 108 are electrically connected to the imaging unit 102 through a signal line (may be a bonding wire) provided on the surface of the chip board 106, which is not shown.

On a back surface of the circuit board 107, external connection terminals 109 are provided at positions substantially below each electrode pad 108. Each external connection terminal 109 is connected to the electrode pad 108 through a through-electrode 110 which vertically penetrates the laminated substrate 105. In addition, through wiring not shown, each external connection terminal 109 is connected to a control circuit which controls drive of the solid-state imaging element 101, an image processing circuit which performs image processing on the imaging signal output from the solid-state imaging element 101, and the like.

FIG. 2 shows a schematic cross-sectional view showing the imaging unit 102. As shown in FIG. 2, the imaging unit 102 is composed of each unit provided on a substrate 204, such as a light receiving element 201, a color filter 202, and a microlens 203. The color filter 202 has a blue pixel 205$b$, a red pixel 205$r$, a green pixel 205$g$, and a black matrix 205$bm$. The cured film according to the embodiment of the present invention may be used as the blue pixel 205$b$, the red pixel 205$r$, the green pixel 205$g$, and the black matrix 205$bm$.

As a material for the substrate 204, for example, the same material as the above-described chip board 106 can be used. A p-well layer 206 is formed on a surface layer of the substrate 204. In the p-well layer 206, light receiving elements 201, which are composed of n-type layers, and generate and accumulate signal charges by photoelectric conversion, are arranged in a square grid manner.

A vertical electric charge transfer path 208 composed of an n-type layer is formed on one side of the light receiving element 201 through a readout gate portion 207 on a surface layer of the p-well layer 206. In addition, a vertical electric charge transfer path 208 belonging to an adjacent pixel is formed on the other side of the light receiving element 201 through an element separation region 209 composed of a p-type layer. The readout gate portion 207 is a channel region for reading the signal charge accumulated in the light receiving elements 201 to the vertical electric charge transfer path 208.

A gate insulating film 210 composed of an oxide-nitride-oxide (ONO) film is formed on a surface of the substrate 204. A vertical electric charge transfer electrode 211 composed of polysilicon or amorphous silicon is formed on the gate insulating film 210 so as to cover substantially directly above the vertical electric charge transfer path 208, the readout gate portion 207, and the element separation region 209. The vertical electric charge transfer electrode 211 functions as a driving electrode which drives the vertical electric charge transfer path 208 to perform charge transfer, and as a reading electrode which drives the readout gate portion 207 to read out the signal charge. The signal charge is sequentially transferred from the vertical electric charge transfer path 208 to a horizontal transfer path and an output unit (floating diffusion amplifier), which are not shown, and then outputs as a voltage signal.

A light shielding film 212 is formed on the vertical electric charge transfer electrode 211 so as to cover the surface thereof. The light shielding film 212 has an opening part at a position directly above the light receiving elements 201, and shields the other regions from light. The cured film according to the embodiment of the present invention may be used as the light shielding film 212.

On the light shielding film 212, an insulating film 213 composed of borophosphosilicate glass (BPSG), an insulating film (passivation film) 214 composed of P—SiN, and a transparent interlayer composed of a planarizing film 215 consisting of a transparent resin or the like are provided. The color filter 202 is formed on the interlayer.

[Image Display Device]

An image display device according to an embodiment of the present invention includes the cured film according to the embodiment of the present invention.

Examples of an aspect in which the image display device has the cured film include an aspect in which a color filter formed by the cured film according to the embodiment of the present invention is used in the image display device. The color filter may contain a black matrix.

Next, a black matrix and a color filter containing the black matrix will be described, and further, as a specific example of the image display device, a liquid crystal display device containing such a color filter will be described.

<Black Matrix>

It is also preferable that the cured film according to the embodiment of the present invention is contained in the black matrix. The black matrix may be contained in an image display device such as a color filter, a solid-state imaging element, and a liquid crystal display device.

Examples of the black matrix include those described above; a black edge provided on a peripheral edge of an image display device such as a liquid crystal display device; a lattice-formed and/or striped black part between red, blue, and green pixels; and a dot-shaped and/or linear black pattern for shielding thin film transistor (TFT). With regard to the definition of the black matrix, for example, the description of "Dictionary of Liquid Crystal Display Manufacturing Apparatus Terms" by Taihei Kanno, 2nd edition, published by Nikkan Kogyo Shimbun, 1996, p. 64. can be referred to.

In order to improve display contrast and to prevent deterioration of image quality due to light current leakage in a case of an active matrix drive-type liquid crystal display device using a thin film transistor (TFT), the black matrix preferably has high light shielding properties (optical density (OD) of 3 or more).

As a method for manufacturing the black matrix, for example, the black matrix can be produced by the same method as the above-described method for manufacturing the cured film. Specifically, the patterned cured film (black matrix) can be manufactured by applying a composition to a substrate to form a composition layer, and performing exposure and development. The film thickness of the cured film used as the black matrix is preferably 0.1 to 4.0 µm.

A material of the substrate preferably has a transmittance of 80% or more with respect to visible light (wavelength of 400 to 800 nm). Examples of such a material include glass such as soda lime glass, non-alkali glass, quartz glass, and borosilicate glass; and plastics such as a polyester-based resin and a polyolefin-based resin, and from the viewpoint of chemical resistance and heat resistance, non-alkali glass, quartz glass, or the like is preferable.

<Color Filter>

It is also preferable that the cured film according to the embodiment of the present invention is contained in the color filter.

Examples of an aspect in which the color filter contains the cured film include a color filter including a substrate and red, green, and blue colored pixels (cured films) formed on the substrate. In addition, the color filter may be a color filter including a substrate, the above-described black matrix, and red, green, and blue colored pixels formed in an opening part of the above-described black matrix formed on the substrate.

The color filter containing the black matrix can be manufactured, for example, by the following method.

First, a coating film (composition layer) of a composition containing a coloring material corresponding to each colored pixel of the color filter is formed in an opening part of a patterned black matrix formed on a substrate.

Next, the composition layer is exposed through a photomask having a pattern corresponding to the opening part of the black matrix. Next, a non-exposed portion is removed by a development treatment, and the product is baked to form colored pixels in the opening part of the black matrix. By performing the series of operations using, for example, a composition containing red, green, and blue pigments, a color filter having red, green, and blue pixels can be manufactured.

[Liquid Crystal Display Device]

It is also preferable that the cured film according to the embodiment of the present invention is contained in the liquid crystal display device. Examples of an aspect in which the liquid crystal display device contains the cured film include an aspect containing the color filter described above.

Examples of the liquid crystal display device according to the present embodiment include an aspect of including a pair of substrates arranged to face each other and a liquid crystal compound sealed between the substrates. The above-described substrate is as described above, for example, as a substrate for the black matrix.

Examples of a specific aspect of the above-described liquid crystal display device include a laminate containing, from the user side, polarizing plate/substrate/color filter/transparent electrode layer/alignment film/liquid crystal layer/transparent electrode layer/thin film transistor (TFT) element/substrate/polarizing plate/backlight unit in this order.

Examples of the liquid crystal display device include liquid crystal display devices described in "Electronic Display Device (Akio Sasaki, Kogyo Chosakai Publishing Co., Ltd., published in 1990)", "Display Device (Sumiaki Ibuki, Sangyo Tosho Co., Ltd., published in 1989)", and the like. In addition, examples thereof include liquid crystal display devices described in "Liquid Crystal Display Technology for Next Generation (edited by Tatsuo Uchida, Kogyo Chosakai Publishing Co., Ltd., published in 1994)".

[Infrared Sensor]

It is also preferable that the cured film according to the embodiment of the present invention is contained in an infrared sensor.

Figure 3:
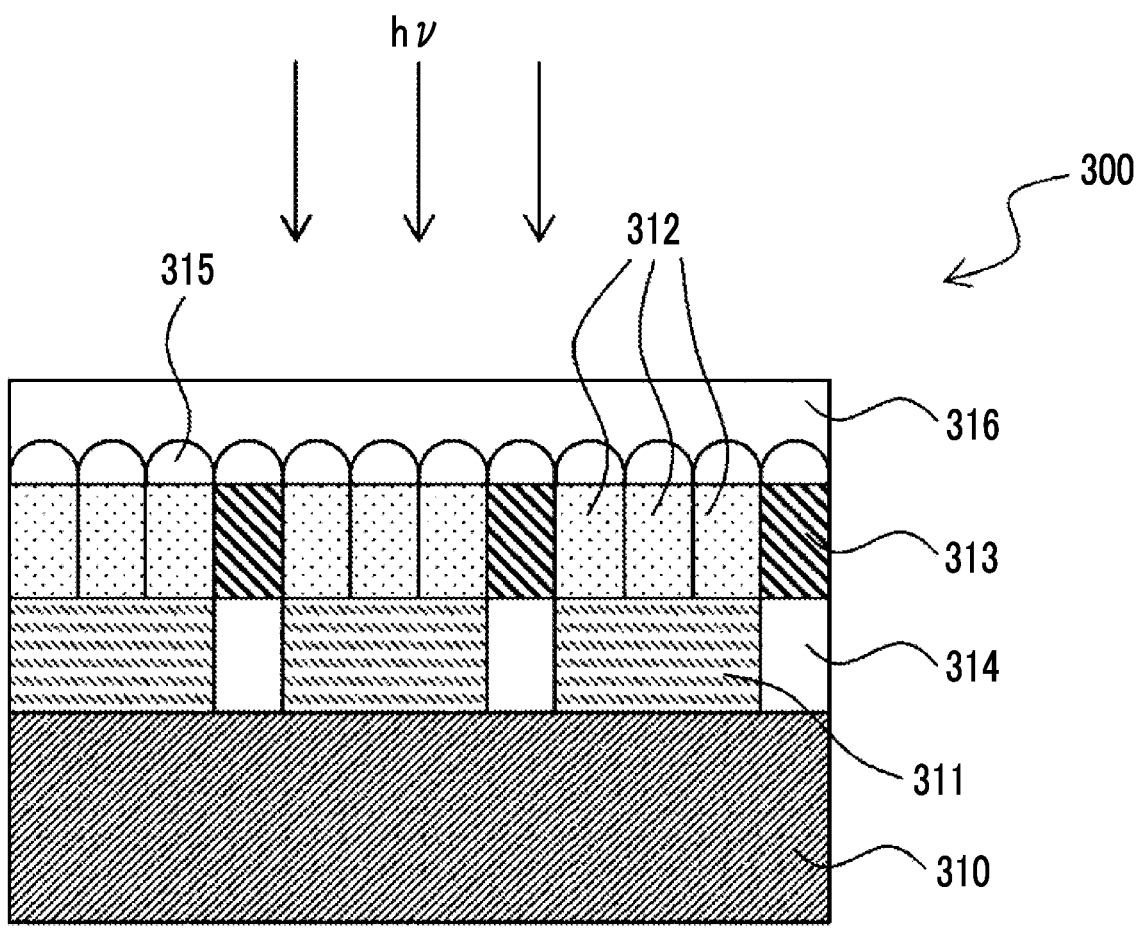
FIG. 3 is a schematic cross-sectional view showing a configuration example of an infrared sensor.

The infrared sensor according to the above-described embodiment will be described with reference to FIG. 3. FIG. 3 is a schematic cross-sectional view showing a configuration example of an infrared sensor including the cured film according to the embodiment of the present invention. An infrared sensor 300 shown in FIG. 3 includes a solid-state imaging element 310.

An imaging region provided on the solid-state imaging element 310 is configured by combining an infrared absorbing filter 311 and a color filter 312 according to the embodiment of the present invention.

The infrared absorbing filter 311 is a film which transmits light in the visible light region (for example, light having a wavelength of 400 to 700 nm) and cuts light in the infrared region (for example, light having a wavelength of 800 to 1300 nm, preferably light having a wavelength of 900 to 1200 nm and more preferably light having a wavelength of 900 to 1000 nm), and a cured film containing, as a coloring material, an infrared absorber (aspect of the infrared absorber is as described above) can be used.

The color filter 312 is a color filter having pixels which transmit and absorb light of a specific wavelength in the visible light region, and for example, a color filter or the like in which red (R), green (G), and blue (B) pixels are formed is used, and the aspect thereof is as described above.

A resin film 314 (for example, a transparent resin film or the like) capable of transmitting light having a wavelength transmitted through the infrared transmitting filter 313 is disposed between the infrared transmitting filter 313 and the solid-state imaging element 310.

The infrared transmitting filter 313 is a filter which has visible light shielding properties and transmits infrared rays of a specific wavelength, and the cured film according to the embodiment of the present invention, which contains a colorant (for example, a perylene compound and/or a bisbenzofuranone compound, and the like) absorbing light in the visible light region and an infrared absorber (for example, a pyrrolopyrrole compound, a phthalocyanine compound, a naphthalocyanine compound, a polymethine compound, and the like), can be used. For example, the infrared transmitting filter 313 preferably shields light having a wavelength of 400 to 830 nm and transmits light having a wavelength of 900 to 1300 nm.

A microlens 315 is disposed on an incidence ray hv side of the color filter 312 and the infrared transmitting filter 313. A planarizing film 316 is formed so as to cover the microlenses 315.

In the aspect shown in FIG. 3, the resin film 314 is disposed, but the infrared transmitting filter 313 may be formed instead of the resin film 314. That is, the infrared transmitting filter 313 may be formed on the solid-state imaging element 310.

In addition, in the aspect shown in FIG. 3, the film thickness of the color filter 312 and the film thickness of the infrared transmitting filter 313 are the same, but the film thicknesses of both may be different from each other.

In addition, in the aspect shown in FIG. 3, the color filter 312 is provided closer to the incidence ray hv side than the infrared absorbing filter 311, but the order of the infrared absorbing filter 311 and the color filter 312 may be changed so that the infrared absorbing filter 311 is provided closer to the incidence ray hv side than the color filter 312.

In addition, in the aspect shown in FIG. 3, the infrared absorbing filter 311 and the color filter 312 are laminated adjacent to each other, but both filters are not necessarily adjacent to each other, and another layer may be provided therebetween. The cured film according to the embodiment of the present invention can be used as a light shielding film for the edges and/or side surfaces of the surface of the infrared absorbing filter 311. In addition, in a case where the cured film according to the embodiment of the present invention is used on an interior wall of a device of the infrared sensor, it is possible to prevent internal reflection and/or incident of meaningless light on the light receiving section and improve sensitivity.

Since this infrared sensor can capture image information at the same time, it is possible to perform motion sensing or the like which recognizes an object for detecting motion. In addition, since this infrared sensor can acquire distance information, it is possible to take an image including 3D information. Furthermore, this infrared sensor can also be used as a biometric authentication sensor.

Next, a solid-state imaging device to which the infrared sensor is applied will be described.

The above-described solid-state imaging device contains a lens optical system, a solid-state imaging element, an infrared light emitting diode, and the like. With regard to each configuration of the solid-state imaging device, paragraphs 0032 to 0036 of JP2011-233983A can be referred to, the content of which is incorporated herein by reference.

[Headlight Unit]

It is also preferable that the cured film according to the embodiment of the present invention is included, as the light shielding film, in a headlight unit of a lighting tool for a vehicle such as an automobile. The cured film according to the embodiment of the present invention, which is included in the headlight unit as the light shielding film, is preferably formed in a patterned manner so as to shield at least a part of light emitted from a light source.

Figure 4:
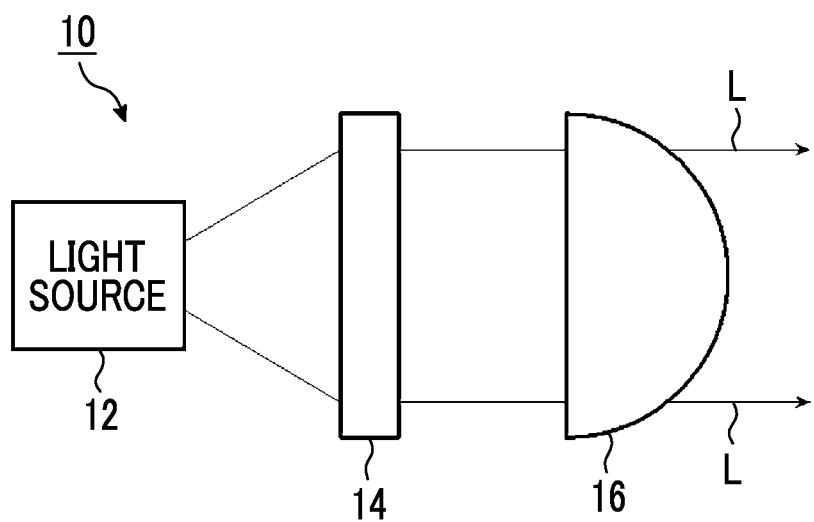
FIG. 4 is a schematic view showing a configuration example of a headlight unit.

The headlight unit according to the above-described embodiment will be described with reference to FIGS. 4 and 5. FIG. 4 is a schematic view showing an example of the configuration of the headlight unit, and FIG. 5 is a schematic perspective view showing an example of the configuration of a light shielding part of the headlight unit.

As shown in FIG. 4, a headlight unit 10 includes a light source 12, a light shielding part 14, and a lens 16, and the light source 12, the light shielding part 14, and the lens 16 are arranged in this order.

Figure 5:
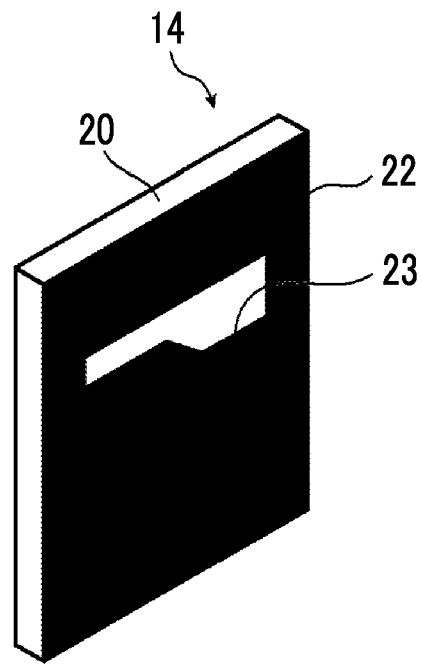
FIG. 5 is a schematic perspective view showing a configuration example of a light shielding part of the headlight unit.

As shown in FIG. 5, the light shielding part 14 has a substrate 20 and a light shielding film 22.

In the light shielding film 22, a patterned opening part 23 for radiating light emitted from the light source 12 into a specific shape is formed. A light distribution pattern radiated from the lens 16 is determined by the shape of the opening part 23 of the light shielding film 22. The lens 16 projects light L from the light source 12, which has passed through the light shielding part 14. In a case where a specific light distribution pattern can be radiated from the light source 12, the lens 16 is not necessarily required. The lens 16 is appropriately determined according to an irradiation distance and an irradiation range of the light L.

Moreover, a configuration of the substrate 20 is not particularly limited as long as the substrate can hold the light shielding film 22, but the substrate 20 is preferably not deformed by the heat of the light source 12, and is made of glass, for example.

An example of the light distribution pattern is shown in FIG. 5, but the present invention is not limited to the example.

Furthermore, the number of the light sources 12 is also not limited to one, and the light sources may be arranged in a row or in a matrix, for example. In a case where a plurality of light sources are provided, for example, one light shielding part 14 may be provided for one light source 12. In this case, the respective light shielding film 22 of a plurality of light shielding parts 14 may all have the same pattern or may have different patterns.

The light distribution pattern based on the pattern of the light shielding film 22 will be described.

Figure 6:
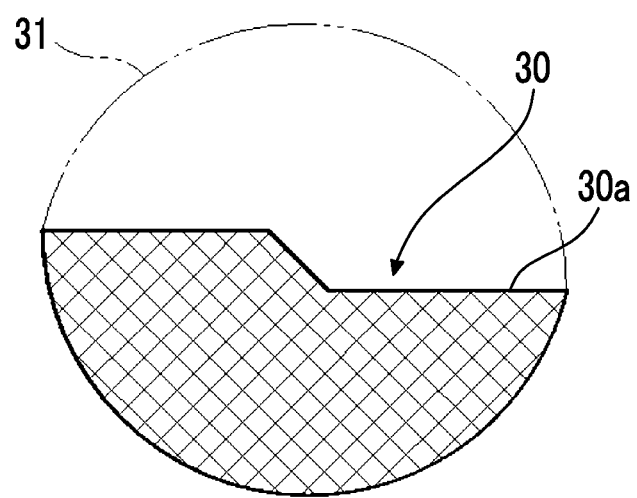
FIG. 6 is a schematic view showing an example of a light distribution pattern by the light shielding part of the headlight unit.
Figure 7:
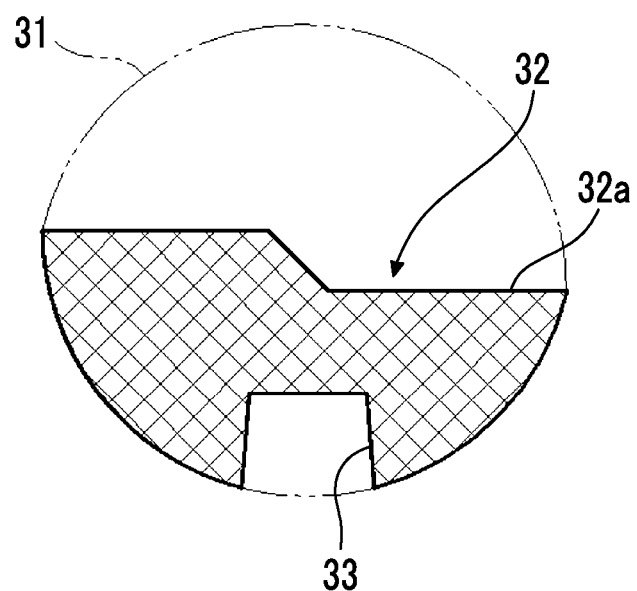
FIG. 7 is a schematic view showing another example of a light distribution pattern by the light shielding part of the headlight unit.

FIG. 6 is a schematic view showing an example of the light distribution pattern formed by the headlight unit, and FIG. 7 is a schematic view showing another example of the light distribution pattern formed by the headlight unit. Moreover, a light distribution pattern 30 shown in FIG. 6 and a light distribution pattern 32 shown in FIG. 7 both indicate a region irradiated with light. Further, a region 31 shown in FIG. 6 and a region 31 shown in FIG. 7 both indicate an irradiation region irradiated by the light source 12 (see FIG. 4) in a case where the light shielding film 22 is not provided.

Due to the pattern of the light shielding film 22, the intensity of light is sharply reduced at an edge 30a, for example, as in the light distribution pattern 30 shown in FIG. 6. The light distribution pattern 30 shown in FIG. 6 is, for example, a pattern in which light is not flashed at an oncoming vehicle in a case of left-side traveling.

Furthermore, as in the light distribution pattern 32 shown in FIG. 7, a pattern in which a part of the light distribution pattern 30 shown in FIG. 6 is notched can also be used. Also in this case, similar to the light distribution pattern 30 shown in FIG. 6, the intensity of light is sharply reduced at an edge 32a, and the pattern is, for example, a pattern in which light is not flashed at an oncoming vehicle in a case of left-side traveling. Further, the intensity of light is sharply reduced even at a notched part 33. Therefore, in a region corresponding to the notched part 33, a mark indicating a state where the road is curved, inclined upward, inclined downward, or the like can be displayed. By doing so, safety during night-time traveling can be improved.

In addition, the light shielding part 14 is not limited to being fixedly disposed between the light source 12 and the lens 16, and a configuration in which the light shielding part 14 is allowed to enter between the light source 12 and the lens 16, if necessary, by a drive mechanism (not shown) to obtain a specific light distribution pattern may be adopted.

Moreover, in the light shielding part 14, a shade member capable of shielding the light from the light source 12 may be formed. In this case, a configuration in which the shade member is allowed to enter between the light source 12 and the lens 16, as needed, by the drive mechanism (not shown) to obtain a specific light distribution pattern may be adopted.

EXAMPLES

Hereinafter, the present invention will be described in more detail based on Examples. The materials, the amounts of materials to be used, the proportions, the treatment details, the treatment procedure, or the like shown in the examples below may be modified appropriately as long as the modifications do not depart from the spirit of the present invention. Therefore, the scope of the present invention should not be construed as being limited by the following examples.

Synthesis Example 1

4 g of a silane coupling agent (A-1) (see below) as a compound A, 0.5 g of a 10% formic acid aqueous solution, and 1 g of water were mixed with 100 g of IPA-ST-L (manufactured by Nissan Chemical Corporation, solid content: 30 mass %, isopropyl alcohol solvent, organosilica sol) as raw material silica particles, and the mixture was stirred at 60° C. for 3 hours. After solvent substitution with 1-methoxy-2-propanol in a rotary evaporator, concentration of solid contents was confirmed, and the dispersion liquid was diluted with 1-methoxy-2-propanol to obtain a dispersion liquid of a modified silica particle precursor (PP-1) having a solid content of 50 mass %.

A-1: KBM-303 (manufactured by Shin-Etsu Chemical Co., Ltd., 2-(3,4-epoxycyclohexyl)ethyltrimethoxysilane)

Synthesis Examples 2 to 9

Dispersion liquids of modified silica particle precursors (PP-2) to (PP-9) were obtained by the same operation as in Synthesis Example 1, except that the raw material silica particles and silane coupling agent shown in Table 1 were used.

A-2: KBM-503 (manufactured by Shin-Etsu Chemical Co., Ltd., 3-methacryloxypropyltrimethoxysilane)

A-3: KBM-1403 (manufactured by Shin-Etsu Chemical Co., Ltd., p-styryltrimethoxysilane)

A-4: KBM-803 (manufactured by Shin-Etsu Chemical Co., Ltd., 3-mercaptopropyltrimethoxysilane)

A-5: KBM-903 (manufactured by Shin-Etsu Chemical Co., Ltd., 3-aminopropyltrimethoxysilane)

A-6: 2-propynyl [3-(triethoxysilyl)propyl]carbamate (manufactured by Tokyo Chemical Industry Co., Ltd.)

IPA-ST: manufactured by Nissan Chemical Corporation, solid content: 30 mass %, isopropyl alcohol solvent, organosilica sol IPA-ST-ZL: manufactured by Nissan Chemical Corporation, solid content: 30 mass %, isopropyl alcohol solvent, organosilica sol Synthesis Example 10

A dispersion liquid of a modified silica particle precursor (PP-10) was obtained by the same operation as in Synthesis Example 1, except that, instead of IPA-ST-L, THRULYA 4110 (manufactured by JGC C&C, solid content: 20 mass %, isopropyl alcohol solvent, organosilica sol) was concentrated to a solid content of 30 mass % with a rotary evaporator before use.

TABLE 1

| Modified silica particle precursor | | Raw material | |
|---|---|---|---|
| Type | Reactive group | silica particles | Compound A |
| PP-1 | Epoxy group | IPA-ST-L | A-1 |
| PP-2 | Methacrylic group | IPA-ST-L | A-2 |
| PP-3 | Styryl group | IPA-ST-L | A-3 |
| PP-4 | Thiol group | IPA-ST-L | A-4 |
| PP-5 | Amino group | IPA-ST-L | A-5 |
| PP-6 | Ethynyl group | IPA-ST-L | A-6 |
| PP-7 | Epoxy group | IPA-ST | A-1 |
| PP-8 | Epoxy group | IPA-ST-ZL | A-1 |
| PP-9 | Methacrylic group | IPA-ST-ZL | A-2 |
| PP-10 | Epoxy group | THRULYA 4110 | A-1 |

Examples 1-1 to 1-48 and Comparative Examples 1-1 and 1-2

According to the following Synthesis Examples 11 to 32, dispersion liquids of Examples 1-1 to 1-48 and Comparative Examples 1-1 and 1-2 shown in Table 2 were prepared.

In the table below, the content described in the column of water content means the amount (mass %) of water with respect to the modified silica particles included in the dispersion liquid.

Synthesis Example 11

In a one-neck flask, 1 g of 3,3,3-trifluoropropionic acid as a compound B and 1 g of tetrabutylammonium were added to 200 g of the dispersion liquid of the modified silica particle precursor (PP-1), and the mixture was stirred at 110° C. for 48 hours. The obtained dispersion liquid was filtered through an ultrafiltration membrane (molecular weight cut off: 50000), and dehydration was performed by adding activated 3 Å molecular sieves and filtering. The obtained dispersion liquid was diluted with 1-methoxy-2-propanol to obtain a dispersion liquid of modified silica particles (P-1) having a solid content of 20 mass %. After measuring water content of the obtained dispersion liquid, water was added so as to have the water content shown in the table to obtain dispersion liquids (D-1) to (D-9), (DC-1), and (DC-2).

Synthesis Example 12

A dispersion liquid of modified silica particles (P-2) was obtained by the same operation as in Synthesis Example 11, except that X-22-3710 (manufactured by Shin-Etsu Chemical Co., Ltd., terminal carboxylic acid-modified polydimethylsiloxane) was used instead of 3,3,3-trifluoropropionic acid. After measuring water content of the obtained dispersion liquid, water was added so as to have the water content shown in the table to obtain dispersion liquids (D-10) to (D-14).

Synthesis Example 13

Into a three-neck flask, 0.3 g of mercaptopropionic acid (manufactured by Tokyo Chemical Industry Co., Ltd.), 11.95 g of isobutyl methacrylate (manufactured by Tokyo Chemical Industry Co., Ltd.), and 18.4 g of propylene glycol monomethyl ether acetate were charged, and the contents of the flask were heated to 80° C. under a nitrogen atmosphere. An initiator V-601 (manufactured by FUJIFILM Wako Pure Chemicals Corporation, 0.07 g) was added to the flask, and the mixture was stirred for 3 hours. V-601 (0.07 g) was further added to the flask, and the mixture was stirred for 2 hours. Thereafter, the contents of the flask were concentrated by a rotary evaporator to obtain a polymer (Poly-1) having a terminal carboxy group.

1 g of Poly-1 as a compound B and 1 g of tetrabutylammonium were added to 200 g of the dispersion liquid of the modified silica particle precursor (PP-1), and the mixture was stirred at 110° C. for 48 hours. The obtained dispersion liquid was filtered through an ultrafiltration membrane (molecular weight cut off: 50000), and dehydration was performed by adding activated 3 Å molecular sieves and filtering. The obtained dispersion liquid was diluted with 1-methoxy-2-propanol to obtain a dispersion liquid of modified silica particles (P-3) having a solid content of 20 mass %. After measuring water content of the obtained dispersion liquid, water was added so as to have the water content shown in the table to obtain dispersion liquids (D-15) to (D-19).

Synthesis Example 14

A dispersion liquid of modified silica particles (P-4) was obtained by the same operation as in Synthesis Example 13, except that 3-[tris(trimethylsilyloxy)silyl]propyl methacrylate (manufactured by Tokyo Chemical Industry Co., Ltd.) was used instead of isobutyl methacrylate. After measuring water content of the obtained dispersion liquid, water was added so as to have the water content shown in the table to obtain dispersion liquids (D-20) to (D-22).

Synthesis Example 15

A dispersion liquid of modified silica particles (P-5) was obtained by the same operation as in Synthesis Example 13, except that 1H,1H,2H,2H-tridecafluoro-n-octyl methacrylate (manufactured by Tokyo Chemical Industry Co., Ltd.) was used instead of isobutyl methacrylate. After measuring water content of the obtained dispersion liquid, water was added so as to have the water content shown in the table to obtain dispersion liquids (D-23) to (D-25).

Synthesis Example 16

Into a three-neck flask, 30.0 g of the dispersion liquid of the modified silica particle precursor (PP-2), 1.8 g of isobutyl methacrylate (manufactured by Tokyo Chemical Industry Co., Ltd.), and 28.2 g of propylene glycol monomethyl ether acetate (PGMEA) were charged, and the contents of the flask were heated to 80° C. under a nitrogen atmosphere. 0.01 g of an initiator V-601 (manufactured by FUJIFILM Wako Pure Chemicals Corporation) was added to the flask, and the mixture was stirred for 3 hours. 0.02 g of V-601 was further added to the flask, and the mixture was stirred for 2 hours. Thereafter, the contents of the flask were microfiltered (filtration step), and 1-methoxy-2-propanol was added to the obtained filter product so that the solid content (modified silica particles) was 20 mass %. Thereafter, the obtained dispersion liquid was filtered through an ultrafiltration membrane (molecular weight cut off: 50000), and dehydration was performed by adding activated 3 Å molecular sieves and filtering. Again, 1-methoxy-2-propanol was added thereto so that the solid content (modified silica particles) was 20 mass % to obtain a dispersion liquid of modified silica particles (P-6). After measuring water content of the obtained dispersion liquid, water was added so as to have the water content shown in the table to obtain dispersion liquids (D-26) to (D-28).

Synthesis Example 17

A dispersion liquid of modified silica particles (P-7) was obtained by the same operation as in Synthesis Example 16, except that 3-[tris(trimethylsilyloxy)silyl]propyl methacrylate (manufactured by Tokyo Chemical Industry Co., Ltd.) was used instead of isobutyl methacrylate. After measuring water content of the obtained dispersion liquid, water was added so as to have the water content shown in the table to obtain dispersion liquids (D-29) to (D-31).

Synthesis Example 18

A dispersion liquid of modified silica particles (P-8) was obtained by the same operation as in Synthesis Example 16, except that 1H,1H,2H,2H-tridecafluoro-n-octyl methacrylate (manufactured by Tokyo Chemical Industry Co., Ltd.) was used instead of isobutyl methacrylate. After measuring water content of the obtained dispersion liquid, water was added so as to have the water content shown in the table to obtain dispersion liquids (D-32) to (D-34).

Synthesis Example 19

Into a three-neck flask, 30.0 g of the dispersion liquid of the modified silica particle precursor (PP-3), 1.8 g of styrene (manufactured by Tokyo Chemical Industry Co., Ltd.), and 28.2 g of propylene glycol monomethyl ether acetate (PGMEA) were charged, and the contents of the flask were heated to 60° C. under a nitrogen atmosphere. 0.01 g of an initiator azobisisobutyronitrile (manufactured by FUJIFILM Wako Pure Chemicals Corporation) was added to the flask, and the mixture was stirred for 3 hours. After heating the flask to 70° C., 0.02 g of azobisisobutyronitrile was added thereto, and the mixture was stirred for 3 hours. Thereafter, the contents of the flask were microfiltered (filtration step), and 1-methoxy-2-propanol was added to the obtained filter product so that the solid content (modified silica particles) was 20 mass %. Thereafter, the obtained dispersion liquid was filtered through an ultrafiltration membrane (molecular weight cut off: 50000), and dehydration was performed by adding activated 3 Å molecular sieves and filtering. Again, 1-methoxy-2-propanol was added thereto so that the solid content (modified silica particles) was 20 mass % to obtain a dispersion liquid of modified silica particles (P-9). After measuring water content of the obtained dispersion liquid, water was added so as to have the water content shown in the table to obtain a dispersion liquid (D-35).

Synthesis Example 20

A dispersion liquid of modified silica particles (P-10) was obtained by the same operation as in Synthesis Example 19, except that 4-(trifluoromethyl)styrene (manufactured by Tokyo Chemical Industry Co., Ltd.) was used instead of styrene. After measuring water content of the obtained dispersion liquid, water was added so as to have the water content shown in the table to obtain a dispersion liquid (D-36).

Synthesis Example 21

Into a three-neck flask, 2 g of stearyl acrylate (manufactured by Tokyo Chemical Industry Co., Ltd.), 0.1 g of triethylamine, and 20 g of PGMEA were charged, and the mixture was stirred at 0° C. for 1 hour. Thereafter, 200 g of the dispersion liquid of the modified silica particle precursor (PP-4) was added dropwise thereto over 2 hours while maintaining 0° C. to 5° C. After the dropwise addition, the mixture was stirred at 5° C. for 3 hours, and then further stirred at 25° C. for 24 hours. The obtained dispersion liquid was filtered through an ultrafiltration membrane (molecular weight cut off: 50000), and dehydration was performed by adding activated 3 Å molecular sieves and filtering. The obtained dispersion liquid was diluted with 1-methoxy-2-propanol to obtain a dispersion liquid of modified silica particles (P-11) having a solid content of 20 mass %. After measuring water content of the obtained dispersion liquid, water was added so as to have the water content shown in the table to obtain a dispersion liquid (D-37).

Synthesis Example 22

A dispersion liquid of modified silica particles (P-12) was obtained by the same operation as in Synthesis Example 21, except that 1H,1H,2H,2H-tridecafluoro-n-octyl acrylate (manufactured by Tokyo Chemical Industry Co., Ltd.) was used instead of stearyl acrylate. After measuring water content of the obtained dispersion liquid, water was added so as to have the water content shown in the table to obtain a dispersion liquid (D-38).

Synthesis Example 23

Into a three-neck flask, 104.4 g of ε-caprolactone, 18.4 g of δ-valerolactone, and 7.1 g of 2-ethyl-1-hexanol were charged to obtain a mixture. Next, the above-described mixture was stirred while blowing nitrogen. Next, 0.06 g of monobutyltin oxide was added to the mixture, and the obtained mixture was heated to 90° C. After 6 hours, disappearance of a signal derived from 2-ethyl-1-hexanol in the mixture was verified by $^1$H-NMR, and the mixture was heated to 110° C. After continuing the polymerization reaction at 110° C. for 12 hours under nitrogen, it was confirmed by $^1$H-NMR that a signal derived from ε-caprolactone and δ-valerolactone had disappeared. Thereafter, the obtained compound was subjected to molecular weight measurement by a gel permeation chromatography (GPC) method (according to measurement conditions described later). After confirming that the molecular weight of the compound reached a desired value, 0.04 g of 2,6-di-t-butyl-4-methylphenol was added to the mixture containing the above-described compound, and then 8.7 g of 2-acryloyloxyethyl isocyanate was added dropwise to the obtained mixture over 30 minutes. After 6 hours from completion of the dropwise addition, disappearance of a signal derived from 2-acryloyloxyethyl isocyanate was verified by $^1$H-NMR, and the solvent was distilled off with a rotary evaporator to obtain a polymer (PA-1) (polymer having a polyester structure) having an acryloyl group at the terminal. A dispersion liquid of modified silica particles (P-13) was obtained by the same operation as in Synthesis Example 21, except that (PA-1) was used instead of stearyl acrylate. After measuring water content of the obtained dispersion liquid, water was added so as to have the water content shown in the table to obtain a dispersion liquid (D-39).

Synthesis Example 24

In a one-neck flask, 1 g of 1,2-epoxyeicosane was added to 200 g of the dispersion liquid of the modified silica particle precursor (PP-5), and the mixture was stirred at 110° C. for 48 hours. The obtained dispersion liquid was filtered through an ultrafiltration membrane (molecular weight cut off: 50000), and dehydration was performed by adding activated 3 Å molecular sieves and filtering. The obtained dispersion liquid was diluted with 1-methoxy-2-propanol to obtain a dispersion liquid of modified silica particles (P-14) having a solid content of 20 mass %. After measuring water content of the obtained dispersion liquid, water was added so as to have the water content shown in the table to obtain a dispersion liquid (D-40).

Synthesis Example 25

A dispersion liquid of modified silica particles (P-15) was obtained by the same operation as in Synthesis Example 24, except that 3-perfluorohexyl-1,2-epoxypropane (manufactured by Tokyo Chemical Industry Co., Ltd.) was used instead of 1,2-epoxyeicosane. After measuring water content of the obtained dispersion liquid, water was added so as to have the water content shown in the table to obtain a dispersion liquid (D-41).

Synthesis Example 26

A dispersion liquid of modified silica particles (P-16) was obtained by the same operation as in Synthesis Example 24, except that 1,1,1,3,5,5,5-heptamethyl-3-(3-glycidyloxypropyl)trisiloxane (manufactured by Tokyo Chemical Industry Co., Ltd.) was used instead of 1,2-epoxyeicosane. After measuring water content of the obtained dispersion liquid, water was added so as to have the water content shown in the table to obtain a dispersion liquid (D-42).

Synthesis Example 27

A dispersion liquid of modified silica particles (P-17) was obtained by the same operation as in Synthesis Example 24, except that polyethylene glycol glycidyl lauryl ether (manufactured by Tokyo Chemical Industry Co., Ltd.) was used instead of 1,2-epoxyeicosane. After measuring water content of the obtained dispersion liquid, water was added so as to have the water content shown in the table to obtain a dispersion liquid (D-43).

Synthesis Example 28

Into a three-neck flask, 30.0 g of the dispersion liquid of the modified silica particle precursor (PP-6), 0.5 g of ethyl azidoacetate, and 0.04 g of tetrakis(acetonitrile)copper (I) hexafluorophosphate were charged, and the inside of the flask was replaced with argon. The contents of the flask were kept at 50° C. and stirred for 12 hours. The obtained dispersion liquid was filtered through an ultrafiltration membrane (molecular weight cut off: 50000), and dehydration was performed by adding activated 3 Å molecular sieves and filtering. The obtained dispersion liquid was diluted with 1-methoxy-2-propanol to obtain a dispersion liquid of modified silica particles (P-18) having a solid content of 20 mass %. After measuring water content of the obtained dispersion liquid, water was added so as to have the water content shown in the table to obtain a dispersion liquid (D-44).

Synthesis Example 29

A dispersion liquid of modified silica particles (P-19) was obtained by the same operation as in Synthesis Example 11, except that the dispersion liquid of the modified silica particle precursor (PP-7) was used instead of the dispersion liquid of the modified silica particle precursor (PP-1). After measuring water content of the obtained dispersion liquid, water was added so as to have the water content shown in the table to obtain a dispersion liquid (D-45).

Synthesis Example 30

A dispersion liquid of modified silica particles (P-20) was obtained by the same operation as in Synthesis Example 11, except that the dispersion liquid of the modified silica particle precursor (PP-7) was used instead of the dispersion liquid of the modified silica particle precursor (PP-1). After measuring water content of the obtained dispersion liquid, water was added so as to have the water content shown in the table to obtain a dispersion liquid (D-46).

Synthesis Example 31

A dispersion liquid of modified silica particles (P-21) was obtained by the same operation as in Synthesis Example 16, except that the dispersion liquid of the modified silica particle precursor (PP-9) was used instead of the dispersion liquid of the modified silica particle precursor (PP-2). After measuring water content of the obtained dispersion liquid, water was added so as to have the water content shown in the table to obtain a dispersion liquid (D-47).

Synthesis Example 32

A dispersion liquid of modified silica particles (P-22) was obtained by the same operation as in Synthesis Example 11, except that the dispersion liquid of the modified silica particle precursor (PP-10) was used instead of the dispersion liquid of the modified silica particle precursor (PP-1). After measuring water content of the obtained dispersion liquid, water was added so as to have the water content shown in the table to obtain a dispersion liquid (D-48).

[Content of Water]

The content of water with respect to the modified silica particles was calculated based on the content of water in the dispersion liquid measured by a Karl Fischer volumetric titration method in accordance with JIS K0113: 2005.

[Evaluation of Storage Stability]

A viscosity before and after the dispersion liquid was hermetically stored in a container for 6 months at 25° C. was measured, and a rate of change ΔT in the viscosity was calculated by the following expression. The viscosity of the dispersion liquid was measured using a viscometer (TV-22 type viscometer, cone plate-type, manufactured by Toki Sangyo Co., Ltd.). The viscosity of the dispersion liquid was measured by adjusting the temperature of the dispersion liquid to 25° C.

ΔT (%)=100×(viscosity of dispersion liquid after hermetical storage)/(viscosity of dispersion liquid before hermetical storage)(evaluation standard)

AA: ΔT≤105
A: 105<ΔT≤120
B: 120<ΔT≤135
C: 135<ΔT≤150
D: 150<ΔT

TABLE 2

|  | Dispersion liquid Type | Modified silica particles | | Water content | Evaluation result Storage stability |
|---|---|---|---|---|---|
|  |  | Type | Particle size [nm] | Content [mass %] |  |
| Example 1-1 | D-1 | P-1 | 80 | 5 | AA |
| Example 1-2 | D-2 | P-1 | 80 | 7.5 | AA |
| Example 1-3 | D-3 | P-1 | 80 | 10 | A |
| Example 1-4 | D-4 | P-1 | 80 | 0.6 | AA |
| Example 1-5 | D-5 | P-1 | 80 | 0.4 | A |
| Example 1-6 | D-6 | P-1 | 80 | 15 | A |
| Example 1-7 | D-7 | P-1 | 80 | 20.0 | B |
| Example 1-8 | D-8 | P-1 | 80 | 0.2 | A |
| Example 1-9 | D-9 | P-1 | 80 | 0.1 | B |
| Example 1-10 | D-10 | P-2 | 85 | 5 | AA |
| Example 1-11 | D-11 | P-2 | 85 | 7.5 | AA |
| Example 1-12 | D-12 | P-2 | 85 | 10 | A |
| Example 1-13 | D-13 | P-2 | 85 | 0.6 | AA |
| Example 1-14 | D-14 | P-2 | 85 | 0.4 | AA |
| Example 1-15 | D-15 | P-3 | 110 | 5 | AA |
| Example 1-16 | D-16 | P-3 | 110 | 7.5 | AA |
| Example 1-17 | D-17 | P-3 | 110 | 10 | A |
| Example 1-18 | D-18 | P-3 | 110 | 0.6 | AA |
| Example 1-19 | D-19 | P-3 | 110 | 0.4 | AA |
| Example 1-20 | D-20 | P-4 | 105 | 5 | AA |
| Example 1-21 | D-21 | P-4 | 105 | 9 | A |
| Example 1-22 | D-22 | P-4 | 105 | 0.5 | AA |
| Example 1-23 | D-23 | P-5 | 100 | 5 | AA |
| Example 1-24 | D-24 | P-5 | 100 | 9 | A |
| Example 1-25 | D-25 | P-5 | 100 | 0.5 | AA |
| Example 1-26 | D-26 | P-6 | 100 | 5 | AA |
| Example 1-27 | D-27 | P-6 | 100 | 9 | A |
| Example 1-28 | D-28 | P-6 | 100 | 0.5 | AA |
| Example 1-29 | D-29 | P-7 | 95 | 5 | AA |
| Example 1-30 | D-30 | P-7 | 95 | 9 | A |
| Example 1-31 | D-31 | P-7 | 95 | 0.5 | AA |
| Example 1-32 | D-32 | P-8 | 90 | 5 | AA |
| Example 1-33 | D-33 | P-8 | 90 | 9 | A |
| Example 1-34 | D-34 | P-8 | 90 | 0.5 | AA |
| Example 1-35 | D-35 | P-9 | 95 | 5 | AA |
| Example 1-36 | D-36 | P-10 | 100 | 5 | AA |
| Example 1-37 | D-37 | P-11 | 70 | 5 | A |
| Example 1-38 | D-38 | P-12 | 70 | 5 | AA |
| Example 1-39 | D-39 | P-13 | 100 | 5 | AA |
| Example 1-40 | D-40 | P-14 | 80 | 5 | A |
| Example 1-41 | D-41 | P-15 | 75 | 5 | AA |
| Example 1-42 | D-42 | P-16 | 70 | 5 | AA |
| Example 1-43 | D-43 | P-17 | 95 | 5 | AA |
| Example 1-44 | D-44 | P-18 | 75 | 5 | B |
| Example 1-45 | D-45 | P-19 | 13 | 5 | AA |
| Example 1-46 | D-46 | P-20 | 160 | 5 | A |
| Example 1-47 | D-47 | P-21 | 220 | 5 | B |
| Example 1-48 | D-48 | P-22 | 110 | 5 | AA |
| Comparative example 1-1 | DC-1 | P-1 | 80 | 20.5 | D |
| Comparative example 1-2 | DC-2 | P-1 | 80 | 0.05 | D |

As shown in Table 2, in a case of using a dispersion liquid containing the specific modified silica particles, organic solvent, and water in the present invention, in which the content of water was 0.1 to 20.0 mass % with respect to the total mass of the specific modified silica particles (Examples), it was shown that the storage stability was excellent as compared with a case where the dispersion liquid which did not satisfy this was used.

From the comparison of Examples 1-1 to 1-9, in a case where the content of water was within a range of 0.2 to 15 mass % with respect to the specific modified silica particles (Examples 1-1 to 1-6, and 1-8), it was shown that the storage stability was more excellent.

From the comparison of Examples 1-1, 1-10, 1-15, 1-20, 1-23, 1-26, 1-29, 1-32, and 1-35 to 1-44, in a case where the reactive group in the compound A used for producing the specific modified silica particles was an ethylenically unsaturated group, a thiol group, an epoxy group, or an amino group (Examples 1-1, 1-10, 1-15, 1-20, 1-23, 1-26, 1-29, 1-32, and 1-35 to 1-43), it was shown that the storage stability was more excellent.

From the comparison of Examples 1-15, 1-26, 1-35, 1-37, 1-39, 1-40, and 1-43, in a case where the organic group of the compound B included at least one structure selected from the group consisting of a polyester structure, a poly(meth)acrylic structure, a polyolefin structure, and a polyether structure (Examples 1-15, 1-26, 1-35, 1-39, and 1-43), it was shown that the storage stability was more excellent.

From the comparison of Examples 1-20 and 1-45 to 1-48, in a case where the average primary particle diameter of the modified silica particles was within a range of 5 to 200 nm (Examples 1-20, 1-45, 1-46, and 1-48), it was shown that the storage stability was more excellent.

Examples 2-1 to 2-64 and Comparative Examples 2-1 and 2-2

In order to prepare photocurable compositions, the following raw materials were used in addition to the above-described dispersion liquid of modified silica particles.

The raw materials other than the dispersion liquid of modified silica particles were used in a state of being dried and dehydrated, so that water other than the water included in the dispersion liquid of modified silica particles was not included in the photocurable composition.

<Resin>

B-1: resin having the following structure (weight-average molecular weight: 18500)

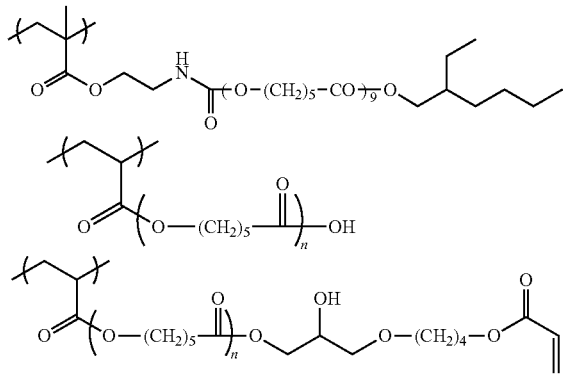

-continued

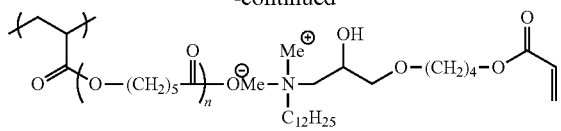

B-2: resin having the following structure (a numerical value described together with each repeating unit is a molar ratio, Mw=30000)

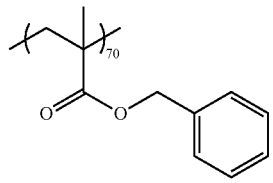 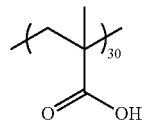

B-3: resin having the following structure (a numerical value described together with each repeating unit is a molar ratio, Mw=11000)

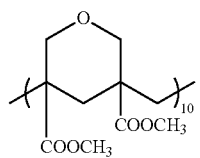 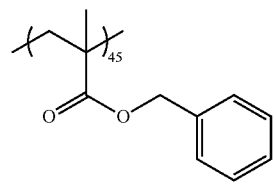

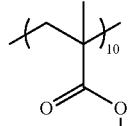 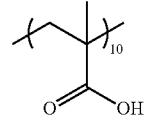

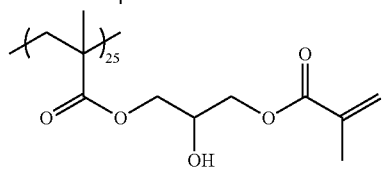

<Polymerization Initiator>

C-1: oxime-based initiator having the following structure

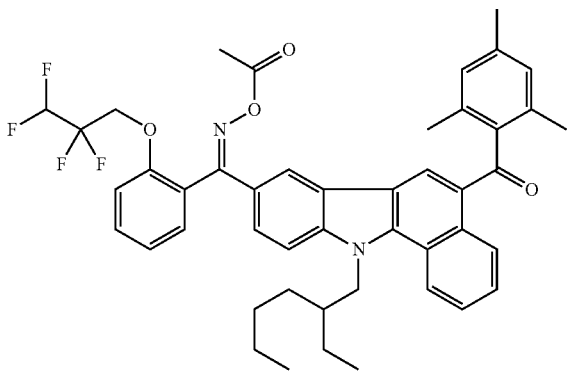 [SMILES: CCCCC(CC)Cn1c2ccc(/C(=N\OC(C)=O)c3ccccc3OCC(F)(F)C(F)F)cc2c2cc(C(=O)c3c(C)cc(C)cc3C)c3ccccc3c21]

C-2: Irgacure OXE02 (manufactured by BASF, oxime-based initiator)

C-3: Omnirad 369 (manufactured by IGM Resins B.V)

<Polymerizable Compound>
  M-1: NK ESTER A-TMMT (tetrafunctional acrylate, manufactured by Shin-Nakamura Chemical Co., Ltd.)
  M-2: KAYARAD UX DPHA-40H (polyfunctional urethane acrylate, manufactured by Nippon Kayaku Co., Ltd.)
  M-3: KAYARAD DPHA (penta- or hexafunctional acrylate, manufactured by Nippon Kayaku Co., Ltd.)
<Polymerization Inhibitor>
  p-Methoxyphenol
<Surfactant>
  Compound shown below ("%" representing the proportion of a repeating unit is mol %; weight-average molecular weight: 14000)

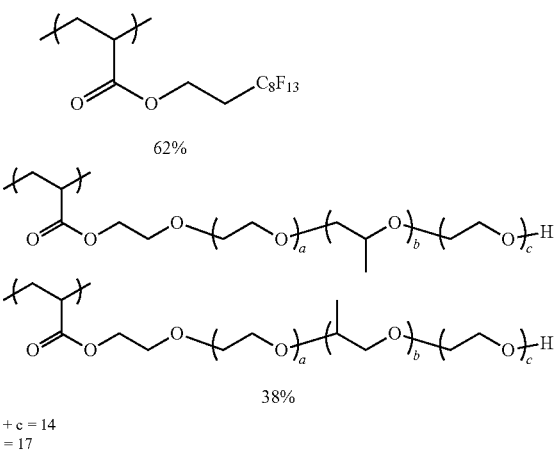

a + c = 14
b = 17

<Solvent>
  Cyclopentanone
  PGMEA (propylene glycol monomethyl ether acetate)
  Butyl acetate The above-described raw materials were mixed in the formulations shown in Table 3 to obtain photocurable compositions (compositions containing no coloring material) of Examples 2-1 to 2-64 and Comparative Examples 2-1 and 2-2. In Table 3, the description in a column of "Amount" in a column of each raw material indicates the addition amount (parts by mass) of each raw material.

[Evaluation of Storage Stability]

Storage stability of the photocurable composition was evaluated by the same procedure and evaluation standard as in the evaluation of the storage stability using the above-described dispersion liquid, except that the photocurable composition obtained as described above was used.

[Evaluation of Surface Unevenness]

The photocurable composition obtained above was applied to a glass substrate by a spin coating method to produce a coating film having a film thickness of 1.5 μm after exposure. Pre-baking was performed at 100° C. for 120 seconds, and then the entire surface of the substrate was exposed at an exposure amount of 1,000 mJ/cm$^2$ with a high-pressure mercury lamp (lamp power of 50 mW/cm$^2$) using UX-1000SM-EH04 (manufactured by Ushio Inc.). The exposed substrate was nost-baked at 220° C. for 300 seconds to obtain a substrate with a cured film.

An arithmetic average roughness of the obtained substrate with a cured film on the cured film side was measured, and surface unevenness was evaluated according to the following standard. The arithmetic average roughness was measured in accordance with JIS B 0601:2010 using a stylus-type surface roughness tester (for example, surface roughness measuring instrument SJ-401 manufactured by Mitutoyo Corporation).

(Evaluation Standard)
  AAA: arithmetic average roughness was 45 nm or more.
  AA: arithmetic average roughness was 40 nm or more and less than 45 nm.
  A: arithmetic average roughness was 20 nm or more and less than 40 nm.
  B: arithmetic average roughness was 10 nm or more and less than 20 nm.
  C: arithmetic average roughness was 5 nm or more and less than 10 nm.
  D: arithmetic average roughness was less than 5 nm.

TABLE 3-1

| | Dispersion liquid of modified silica particles | | Resin | | Polymerization initiator | | Polymerizable compound | | Polymerizable inhibitor | Solvent | | | | Evaluation result | |
|---|---|---|---|---|---|---|---|---|---|---|---|---|---|---|---|
| | Type | Amount | Type | Amount | Type | Amount | Type | Amount | Amount | Type | Amount | Type | Amount | Storage stability | Surface unevenness |
| Example 2-1 | D-1 | 11 | B-1 | 15 | C-1 | 5.2 | M-1 | 12.4 | 0.003 | Cyclopentanone | 38 | PGMEA | 10 | AA | AA |
| Example 2-2 | D-2 | 11 | B-1 | 15 | C-1 | 5.2 | M-1 | 12.4 | 0.003 | Cyclopentanone | 38 | PGMEA | 10 | AA | AA |
| Example 2-3 | D-3 | 11 | B-1 | 15 | C-1 | 5.2 | M-1 | 12.4 | 0.003 | Cyclopentanone | 38 | PGMEA | 10 | A | AA |
| Example 2-4 | D-4 | 11 | B-1 | 15 | C-1 | 5.2 | M-1 | 12.4 | 0.003 | Cyclopentanone | 38 | PGMEA | 10 | AA | AA |
| Example 2-5 | D-5 | 11 | B-1 | 15 | C-1 | 5.2 | M-1 | 12.4 | 0.003 | Cyclopentanone | 38 | PGMEA | 10 | A | A |

TABLE 3-1-continued

| | Dispersion liquid of modified silica particles | | Resin | | Polymerization initiator | | Polymerizable compound | | Polymerizable inhibitor | Solvent | | | | Evaluation result | |
|---|---|---|---|---|---|---|---|---|---|---|---|---|---|---|---|
| | Type | Amount | Type | Amount | Type | Amount | Type | Amount | Amount | Type | Amount | Type | Amount | Storage stability | Surface unevenness |
| Example 2-6 | D-6 | 11 | B-1 | 15 | C-1 | 5.2 | M-1 | 12.4 | 0.003 | Cyclopentanone | 38 | PGMEA | 10 | A | A |
| Example 2-7 | D-7 | 11 | B-1 | 15 | C-1 | 5.2 | M-1 | 12.4 | 0.003 | Cyclopentanone | 38 | PGMEA | 10 | B | A |
| Example 2-8 | D-8 | 11 | B-1 | 15 | C-1 | 5.2 | M-1 | 12.4 | 0.003 | Cyclopentanone | 38 | PGMEA | 10 | A | A |
| Example 2-9 | D-9 | 11 | B-1 | 15 | C-1 | 5.2 | M-1 | 12.4 | 0.003 | Cyclopentanone | 38 | PGMEA | 10 | B | B |
| Example 2-10 | D-10 | 11 | B-1 | 15 | C-1 | 5.2 | M-1 | 12.4 | 0.003 | Cyclopentanone | 38 | PGMEA | 10 | AA | AA |
| Example 2-11 | D-11 | 11 | B-1 | 15 | C-1 | 5.2 | M-1 | 12.4 | 0.003 | Cyclopentanone | 38 | PGMEA | 10 | AA | AA |
| Example 2-12 | D-12 | 11 | B-1 | 15 | C-1 | 5.2 | M-1 | 12.4 | 0.003 | Cyclopentanone | 38 | PGMEA | 10 | A | AA |
| Example 2-13 | D-13 | 11 | B-1 | 15 | C-1 | 5.2 | M-1 | 12.4 | 0.003 | Cyclopentanone | 38 | PGMEA | 10 | AA | AA |
| Example 2-14 | D-14 | 11 | B-1 | 15 | C-1 | 5.2 | M-1 | 12.4 | 0.003 | Cyclopentanone | 38 | PGMEA | 10 | AA | A |
| Example 2-15 | D-15 | 11 | B-1 | 15 | C-1 | 5.2 | M-1 | 12.4 | 0.003 | Cyclopentanone | 38 | PGMEA | 10 | AA | AA |
| Example 2-16 | D-16 | 11 | B-1 | 15 | C-1 | 5.2 | M-1 | 12.4 | 0.003 | Cyclopentanone | 38 | PGMEA | 10 | AA | AA |
| Example 2-17 | D-17 | 11 | B-1 | 15 | C-1 | 5.2 | M-1 | 12.4 | 0.003 | Cyclopentanone | 38 | PGMEA | 10 | A | AA |
| Example 2-18 | D-18 | 11 | B-1 | 15 | C-1 | 5.2 | M-1 | 12.4 | 0.003 | Cyclopentanone | 38 | PGMEA | 10 | AA | AA |
| Example 2-19 | D-19 | 11 | B-1 | 15 | C-1 | 5.2 | M-1 | 12.4 | 0.003 | Cyclopentanone | 38 | PGMEA | 10 | AA | A |
| Example 2-20 | D-20 | 11 | B-1 | 15 | C-1 | 5.2 | M-1 | 12.4 | 0.003 | Cyclopentanone | 38 | PGMEA | 10 | AA | AAA |
| Example 2-21 | D-21 | 11 | B-1 | 15 | C-1 | 5.2 | M-1 | 12.4 | 0.003 | Cyclopentanone | 38 | PGMEA | 10 | A | AA |
| Example 2-22 | D-22 | 11 | B-1 | 15 | C-1 | 5.2 | M-1 | 12.4 | 0.003 | Cyclopentanone | 38 | PGMEA | 10 | AA | AA |
| Example 2-23 | D-23 | 11 | B-1 | 15 | C-1 | 5.2 | M-1 | 12.4 | 0.003 | Cyclopentanone | 38 | PGMEA | 10 | AA | AAA |

TABLE 3-1-continued

| | Dispersion liquid of modified silica particles | | Resin | | Polymerization initiator | | Polymerizable compound | | Polymerizable inhibitor | Solvent | | | | Evaluation result | |
|---|---|---|---|---|---|---|---|---|---|---|---|---|---|---|---|
| | Type | Amount | Type | Amount | Type | Amount | Type | Amount | Amount | Type | Amount | Type | Amount | Storage stability | Surface unevenness |
| Example 2-24 | D-24 | 11 | B-1 | 15 | C-1 | 5.2 | M-1 | 12.4 | 0.003 | Cyclopentanone | 38 | PGMEA | 10 | A | AA |
| Example 2-25 | D-25 | 11 | B-1 | 15 | C-1 | 5.2 | M-1 | 12.4 | 0.003 | Cyclopentanone | 38 | PGMEA | 10 | AA | AA |
| Example 2-26 | D-26 | 11 | B-1 | 15 | C-1 | 5.2 | M-1 | 12.4 | 0.003 | Cyclopentanone | 38 | PGMEA | 10 | AA | AA |
| Example 2-27 | D-27 | 11 | B-1 | 15 | C-1 | 5.2 | M-1 | 12.4 | 0.003 | Cyclopentanone | 38 | PGMEA | 10 | A | AA |
| Example 2-28 | D-28 | 11 | B-1 | 15 | C-1 | 5.2 | M-1 | 12.4 | 0.003 | Cyclopentanone | 38 | PGMEA | 10 | AA | A |
| Example 2-29 | D-29 | 11 | B-1 | 15 | C-1 | 5.2 | M-1 | 12.4 | 0.003 | Cyclopentanone | 38 | PGMEA | 10 | AA | AAA |
| Example 2-30 | D-30 | 11 | B-1 | 15 | C-1 | 5.2 | M-1 | 12.4 | 0.003 | Cyclopentanone | 38 | PGMEA | 10 | A | AA |
| Example 2-31 | D-31 | 11 | B-1 | 15 | C-1 | 5.2 | M-1 | 12.4 | 0.003 | Cyclopentanone | 38 | PGMEA | 10 | AA | AA |
| Example 2-32 | D-32 | 11 | B-1 | 15 | C-1 | 5.2 | M-1 | 12.4 | 0.003 | Cyclopentanone | 38 | PGMEA | 10 | AA | AAA |
| Example 2-33 | D-33 | 11 | B-1 | 15 | C-1 | 5.2 | M-1 | 12.4 | 0.003 | Cyclopentanone | 38 | PGMEA | 10 | A | AA |

TABLE 3-2

| | Dispersion liquid of modified silica particles | | | | Resin | | | | Polymerization initiator | | | | Polymerizable compound | |
|---|---|---|---|---|---|---|---|---|---|---|---|---|---|---|
| | Type | Amount | Type | Amount | Type | Amount | Type | Amount | Type | Amount | Type | Amount | Type | Amount |
| Example 2-34 | D-34 | 11 | | | B-1 | 14.6 | | | C-1 | 5.2 | | | M-1 | 12.4 |
| Example 2-35 | D-35 | 11 | | | B-1 | 14.6 | | | C-1 | 5.2 | | | M-1 | 12.4 |
| Example 2-36 | D-36 | 11 | | | B-1 | 14.6 | | | C-1 | 5.2 | | | M-1 | 12.4 |
| Example 2-37 | D-37 | 11 | | | B-1 | 14.6 | | | C-1 | 5.2 | | | M-1 | 12.4 |
| Example 2-38 | D-38 | 11 | | | B-1 | 14.6 | | | C-1 | 5.2 | | | M-1 | 12.4 |
| Example 2-39 | D-39 | 11 | | | B-1 | 14.6 | | | C-1 | 5.2 | | | M-1 | 12.4 |
| Example 2-40 | D-40 | 11 | | | B-1 | 14.6 | | | C-1 | 5.2 | | | M-1 | 12.4 |
| Example 2-41 | D-41 | 11 | | | B-1 | 14.6 | | | C-1 | 5.2 | | | M-1 | 12.4 |
| Example 2-42 | D-42 | 11 | | | B-1 | 14.6 | | | C-1 | 5.2 | | | M-1 | 12.4 |
| Example 2-43 | D-43 | 11 | | | B-1 | 14.6 | | | C-1 | 5.2 | | | M-1 | 12.4 |
| Example 2-44 | D-44 | 11 | | | B-1 | 14.6 | | | C-1 | 5.2 | | | M-1 | 12.4 |
| Example 2-45 | D-45 | 11 | | | B-1 | 14.6 | | | C-1 | 5.2 | | | M-1 | 12.4 |
| Example 2-46 | D-46 | 11 | | | B-1 | 14.6 | | | C-1 | 5.2 | | | M-1 | 12.4 |
| Example 2-47 | D-47 | 11 | | | B-1 | 14.6 | | | C-1 | 5.2 | | | M-1 | 12.4 |
| Example 2-48 | D-48 | 11 | | | B-1 | 14.6 | | | C-1 | 5.2 | | | M-1 | 12.4 |
| Example 2-49 | D-1 | 8 | D-20 | 3 | B-1 | 14.6 | | | C-1 | 5.2 | | | M-1 | 12.4 |
| Example 2-50 | D-1 | 8 | DC-3 | 3 | B-1 | 14.6 | | | C-1 | 5.2 | | | M-1 | 12.4 |
| Example 2-51 | D-1 | 11 | | | B-1 | 14.3 | B-2 | 0.3 | C-1 | 5.2 | | | M-1 | 12.4 |
| Example 2-52 | D-1 | 11 | | | B-1 | 14.1 | B-3 | 0.5 | C-1 | 5.2 | | | M-1 | 12.4 |
| Example 2-53 | D-1 | 11 | | | B-1 | 14.6 | | | C-2 | 5.2 | | | M-1 | 12.4 |
| Example 2-54 | D-1 | 11 | | | B-1 | 14.6 | | | C-3 | 5.2 | | | M-1 | 12.4 |
| Example 2-55 | D-1 | 11 | | | B-1 | 14.6 | | | C-1 | 2.6 | C-3 | 2.6 | M-1 | 12.4 |

TABLE 3-2-continued

| | | | | | | | | |
|---|---|---|---|---|---|---|---|---|
| Example 2-56 | D-1 | 11 | B-1 | 14.6 | C-1 | 5.2 | M-2 | 12.4 |
| Example 2-57 | D-1 | 11 | B-1 | 14.6 | C-1 | 5.2 | M-3 | 12.4 |
| Example 2-58 | D-1 | 11 | B-1 | 14.6 | C-1 | 5.2 | M-1 | 6.2 |
| Example 2-59 | D-1 | 11 | B-1 | 27 | C-1 | 5.2 | | |
| Example 2-60 | D-1 | 11 | B-1 | 14.6 | C-1 | 5.2 | M-1 | 12.4 |
| Example 2-61 | D-1 | 5.5 | B-1 | 14.6 | C-1 | 5.2 | M-1 | 12.4 |
| Example 2-62 | D-1 | 18 | B-1 | 14.6 | C-1 | 5.2 | M-1 | 12.4 |
| Example 2-63 | D-1 | 11 | B-1 | 14.6 | C-1 | 5.2 | M-1 | 12.4 |
| Example 2-64 | D-1 | 11 | B-1 | 14.6 | C-1 | 5.2 | M-1 | 12.4 |
| Comparative example 2-1 | DC-1 | 11 | B-1 | 14.6 | C-1 | 5.2 | M-1 | 12.4 |
| Comparative example 2-2 | DC-2 | 11 | B-1 | 14.6 | C-1 | 5.2 | M-1 | 12.4 |

| | Polymerizable compound | | Surfactant | Polymerizable inhibitor | Solvent | | | | Evaluation result | |
|---|---|---|---|---|---|---|---|---|---|---|
| | Type | Amount | Amount | Amount | Type | Amount | Type | Amount | Storage stability | Surface unevenness |
| Example 2-34 | | | 0 | 0.003 | Cyclopentanone | 38 | PGMEA | 10 | AA | AA |
| Example 2-35 | | | 0 | 0.003 | Cyclopentanone | 38 | PGMEA | 10 | AA | AA |
| Example 2-36 | | | 0 | 0.003 | Cyclopentanone | 38 | PGMEA | 10 | AA | AAA |
| Example 2-37 | | | 0 | 0.003 | Cyclopentanone | 38 | PGMEA | 10 | A | A |
| Example 2-38 | | | 0 | 0.003 | Cyclopentanone | 38 | PGMEA | 10 | AA | AA |
| Example 2-39 | | | 0 | 0.003 | Cyclopentanone | 38 | PGMEA | 10 | AA | AA |
| Example 2-40 | | | 0 | 0.003 | Cyclopentanone | 38 | PGMEA | 10 | A | A |
| Example 2-41 | | | 0 | 0.003 | Cyclopentanone | 38 | PGMEA | 10 | AA | AA |
| Example 2-42 | | | 0 | 0.003 | Cyclopentanone | 38 | PGMEA | 10 | AA | AA |
| Example 2-43 | | | 0 | 0.003 | Cyclopentanone | 38 | PGMEA | 10 | AA | AA |
| Example 2-44 | | | 0 | 0.003 | Cyclopentanone | 38 | PGMEA | 10 | B | A |
| Example 2-45 | | | 0 | 0.003 | Cyclopentanone | 38 | PGMEA | 10 | AA | B |
| Example 2-46 | | | 0 | 0.003 | Cyclopentanone | 38 | PGMEA | 10 | A | AA |
| Example 2-47 | | | 0 | 0.003 | Cyclopentanone | 38 | PGMEA | 10 | B | A |
| Example 2-48 | | | 0 | 0.003 | Cyclopentanone | 38 | PGMEA | 10 | AA | AAA |
| Example 2-49 | | | 0 | 0.003 | Cyclopentanone | 38 | PGMEA | 10 | AA | AA |
| Example 2-50 | | | 0 | 0.003 | Cyclopentanone | 38 | PGMEA | 10 | A | A |
| Example 2-51 | | | 0 | 0.003 | Cyclopentanone | 38 | PGMEA | 10 | AA | AA |
| Example 2-52 | | | 0 | 0.003 | Cyclopentanone | 38 | PGMEA | 10 | AA | AA |
| Example 2-53 | | | 0 | 0.003 | Cyclopentanone | 38 | PGMEA | 10 | AA | AA |
| Example 2-54 | | | 0 | 0.003 | Cyclopentanone | 38 | PGMEA | 10 | AA | AA |
| Example 2-55 | | | 0 | 0.003 | Cyclopentanone | 38 | PGMEA | 10 | AA | AA |
| Example 2-56 | | | 0 | 0.003 | Cyclopentanone | 38 | PGMEA | 10 | AA | AA |
| Example 2-57 | | | 0 | 0.003 | Cyclopentanone | 38 | PGMEA | 10 | AA | AA |
| Example 2-58 | M-2 | 6.2 | 0 | 0.003 | Cyclopentanone | 38 | PGMEA | 10 | AA | AA |
| Example 2-59 | | | 0 | 0.003 | Cyclopentanone | 38 | PGMEA | 10 | AA | AA |
| Example 2-60 | | | 0 | 0.003 | Cyclopentanone | 38 | Butyl acetate | 10 | AA | A |
| Example 2-61 | | | 0 | 0.003 | Cyclopentanone | 38 | PGMEA | 10 | AA | A |
| Example 2-62 | | | 0 | 0.003 | Cyclopentanone | 38 | PGMEA | 10 | AA | AA |
| Example 2-63 | | | 0 | 0 | Cyclopentanone | 38 | PGMEA | 10 | AA | AA |
| Example 2-64 | | | 0.01 | 0.003 | Cyclopentanone | 38 | PGMEA | 10 | AA | AA |
| Comparative example 2-1 | | | 0 | 0.003 | Cyclopentanone | 38 | PGMEA | 10 | D | D |
| Comparative example 2-2 | | | 0 | 0.003 | Cyclopentanone | 38 | PGMEA | 10 | D | D |

As shown in Table 3, it was confirmed that the evaluation results of the storage stability of the photocurable composition showed the same tendency as the above-described dispersion liquid.

In addition, as shown in Table 3, in a case of using a photocurable composition including a dispersion liquid containing the specific modified silica particles, organic solvent, and water in the present invention, in which the content of water was 0.1 to 20.0 mass % with respect to the total mass of the specific modified silica particles (Examples), it was shown that a cured film having excellent surface unevenness could be obtained as compared with a case where the dispersion liquid which did not satisfy this was used.

In particular, from the comparison of Examples 2-15, 2-20, and 2-23, in a case where the organic group of the compound B included a fluorine atom or a silicon atom (Examples 2-20 and 2-23), it was shown that a cured film having more excellent surface unevenness could be obtained.

Examples 3-1 to 3-5 and Comparative Examples 3-1 and 3-2

Components used for preparing a thermosetting composition were as shown in the above-described photocurable composition, except for a polymerization initiator.

The raw materials other than the dispersion liquid of modified silica particles were used in a state of being dried and dehydrated, so that water other than the water included in the dispersion liquid of modified silica particles was not included in the thermosetting composition.

<Polymerization Initiator>
C-4: tert-butyl peroxybenzoate

The above-described raw materials were mixed in the formulations shown in Table 4 to obtain thermosetting compositions (compositions containing no coloring material) of Examples 3-1 to 3-5 and Comparative Examples 3-1 and 3-2. In Table 4, the description in a column of "Amount" in a column of each raw material indicates the addition amount (parts by mass) of each raw material.

[Evaluation of Storage Stability]

Storage stability of the thermosetting composition was evaluated by the same procedure and evaluation standard as in the evaluation of the storage stability using the above-described dispersion liquid, except that the thermosetting composition obtained as described above was used.

[Evaluation of Surface Unevenness]

The thermosetting composition obtained above was applied to a glass substrate by a spin coating method to produce a coating film having a film thickness of 1.5 μm after post-baking. After pre-baking at 100° C. for 120 seconds, post-baking was performed at 200° C. for 3 minutes to obtain a substrate with a cured film.

Surface unevenness of the cured film was evaluated by the same procedure and evaluation standard as in the evaluation of the surface unevenness of the substrate with a cured film, formed of the above-described photocurable composition, except that the substrate with a cured film obtained as described above was used.

total mass of the specific modified silica particles (Examples), it was shown that a cured film having excellent surface unevenness could be obtained as compared with a case where the dispersion liquid which did not satisfy this was used.

Examples 4-1 to 4-122 and Comparative Examples 4-1 and 4-2

In order to prepare coloring compositions, coloring material dispersion liquids CA-1 to CA-12 were prepared.

Raw materials other than the coloring material dispersion liquid were as described above. In addition, the raw materials other than the dispersion liquid of modified silica particles were used in a state of being dried and dehydrated, so that water other than the water included in the dispersion liquid of modified silica particles was not included in the coloring composition.

[Coloring Material Dispersion Liquid]
(Preparation of Coloring Material Dispersion Liquid CA-1 (Titanium Black Dispersion Liquid CA-1))

100 g of titanium oxide MT-150A (product name; manufactured by TAYCA) having an average particle diameter of 15 nm, 25 g of silica particles AEROGIL (registered trademark) 300/30 (manufactured by Evonik Industries AG) having a BET surface area of 300 m$^2$/g, and 100 g of Disperbyk 190 (product name; manufactured by BYK-Chemie GmbH) were weighed, 71 g of ion exchange water

TABLE 4

| | Dispersion liquid of modified silica particles | | Resin | | Initiator | | Polymerizable compound | | Surfactant | Polymerizable inhibitor |
|---|---|---|---|---|---|---|---|---|---|---|
| | Type | Amount | Type | Amount | Type | Amount | Type | Amount | Amount | Amount |
| Example 3-1 | D-1 | 11 | B-1 | 14.6 | C-4 | 2 | M-1 | 12.4 | 1 | 0.003 |
| Example 3-2 | D-2 | 11 | B-1 | 14.6 | C-4 | 2 | M-1 | 12.4 | 1 | 0.003 |
| Example 3-3 | D-3 | 11 | B-1 | 14.6 | C-4 | 2 | M-1 | 12.4 | 1 | 0.003 |
| Example 3-4 | D-4 | 11 | B-1 | 14.6 | C-4 | 2 | M-1 | 12.4 | 1 | 0.003 |
| Example 3-5 | D-5 | 11 | B-1 | 14.6 | C-4 | 2 | M-1 | 12.4 | 1 | 0.003 |
| Comparative example 3-1 | DC-1 | 11 | B-1 | 14.6 | C-4 | 2 | M-1 | 12.4 | 1 | 0.003 |
| Comparative example 3-2 | DC-2 | 11 | B-1 | 14.6 | C-4 | 2 | M-1 | 12.4 | 1 | 0.003 |

| | Solvent | | | | Evaluation result | |
|---|---|---|---|---|---|---|
| | Type | Amount | Type | Amount | Storage stability | Surface unevenness |
| Example 3-1 | Cyclopentanone | 38 | PGMEA | 10 | AA | AA |
| Example 3-2 | Cyclopentanone | 38 | PGMEA | 10 | AA | AA |
| Example 3-3 | Cyclopentanone | 38 | PGMEA | 10 | A | AA |
| Example 3-4 | Cyclopentanone | 38 | PGMEA | 10 | AA | AA |
| Example 3-5 | Cyclopentanone | 38 | PGMEA | 10 | A | A |
| Comparative example 3-1 | Cyclopentanone | 38 | PGMEA | 10 | D | D |
| Comparative example 3-2 | Cyclopentanone | 38 | PGMEA | 10 | D | D |

As shown in Table 4, it was confirmed that the evaluation results of the storage stability of the thermosetting composition showed the same tendency as the above-described dispersion liquid.

In addition, as shown in Table 4, in a case of using a thermosetting composition including a dispersion liquid containing the specific modified silica particles, organic solvent, and water in the present invention, in which the content of water was 0.1 to 20.0 mass % with respect to the was added thereto, and the resultant was treated for 20 minutes at a revolution speed of 1360 rpm and a rotation speed of 1047 rpm by using MAZERSTAR KK-400 W manufactured by KURABO INDUSTRIES LTD. to obtain a homogeneous mixture aqueous solution. A quartz container was filled with the aqueous solution and heated to 920° C. in an oxygen atmosphere by using a small rotary kiln (manufactured by MOTOYAMA Co., Ltd.), and then by replacing the atmosphere with nitrogen and allowing an ammonia gas to flow at 100 mL/min for 5 hours at the same temperature, a nitriding reduction treatment was performed. After the completion of the treatment, the collected powders were pulverized in a mortar to obtain titanium black (ca-1) [dispersoid including titanium black particles and a Si atom] containing a Si atom and having a specific surface area of 73 $m^2/g$.

A resin B-1 (5.5 parts by mass) was added to the titanium black (ca-1) (20 parts by mass), and cyclopentanone/propylene glycol monomethyl ether acetate (PGMEA) were added thereto in a ratio of 3/2 so that a concentration of solid contents was 35 mass %. The obtained dispersion was sufficiently stirred with a stirrer to perform pre-mixing. The obtained dispersion was subjected to a dispersion treatment using NPM Pilot manufactured by Shinmaru Enterprises Corporation under the following dispersion conditions to obtain a coloring material dispersion liquid CA-1 (titanium black dispersion liquid CA-1).

The above-described resin B-1 was the same as the resin B-1 used for preparing the photocurable composition.

Dispersion Conditions
Bead size: φ 0.05 mm
Bead filling rate: 65 volume %
Circumferential speed of mill: 10 m/sec
Circumferential speed of separator: 11 m/s
Amount of mixed solution subjected to dispersion treatment: 15.0 g
Circulation flow rate (pump supply rate): 60 kg/hour
Temperature of treatment liquid: 20° C. to 25° C.
Coolant: tap water of 5° C.
Inner volume of annular passage of beads mill: 2.2 L
Number of passes: 84 passes (Preparation of Coloring Material Dispersion Liquid CA-2 (Titanium Black Dispersion Liquid CA-2))

A coloring material dispersion liquid CA-2 (titanium black dispersion liquid CA-2) was obtained in the same manner as described above, except that the PGMEA used for preparing the coloring material dispersion liquid CA-1 was changed to butyl acetate.

(Preparation of Coloring Material Dispersion Liquid CA-3 (Resin-Coated Carbon Black Dispersion Liquid CA-3))

Carbon black was produced by an ordinary oil furnace method. However, ethylene bottom oil having a small amount of Na, a small amount of Ca, and a small amount of S were used as stock oil, and combustion was performed using a gas fuel. Further, pure water treated with an ion exchange resin was used as reaction stop water.

The obtained carbon black (540 g) was stirred together with pure water (14500 g) using a homomixer at 5,000 to 6,000 rpm for 30 minutes to obtain a slurry. The slurry was transferred to a container with a screw-type stirrer, and toluene (600 g) in which an epoxy resin "EPIKOTE 828" (manufactured by Japan Epoxy Resins Co., Ltd.) (60 g) was dissolved was added little by little into the container while performing mixing at approximately 1,000 rpm. In approximately 15 minutes, the total amount of the carbon black dispersed in water was transferred to the toluene side, thereby forming grains having a particle size of approximately 1 mm.

Next, draining was performed with a wire mesh having 60 meshes, and then the separated grains were placed in a vacuum dryer and dried at 70° C. for 7 hours to remove toluene and water, thereby obtaining resin-coated carbon black. The resin-coating amount of the obtained resin-coated carbon black was 10 mass % with respect to the total amount of the carbon black and the resin.

The following resin X-1 (9 parts by mass) and SOL-SPERSE 12000 (manufactured by Lubrizol Japan Limited) (1 part by mass) were added to the resin-coated carbon black (30 parts by mass) obtained above, and then PGMEA was added thereto so that a concentration of solid contents was 35 mass %.

The obtained dispersion was sufficiently stirred with a stirrer to perform pre-mixing. The obtained dispersion was subjected to a dispersion treatment using ULTRA APEX MILL UAM015 manufactured by HIROSHIMA METAL & MACHINERY CO., LTD. under the following conditions to obtain a dispersion composition. After the completion of the dispersion, the beads and the dispersion liquid were separated with a filter to obtain a coloring material dispersion liquid CA-3 (resin-coated carbon black dispersion liquid CA-3) containing resin-coated carbon black as a black coloring material.

Resin X-1: resin having the following structure (the number exhibited up to one decimal place and described together with each repeating unit indicates a molar ratio of each repeating unit, weight-average molecular weight: 32,000, acid value: 58 mg KOH/g)

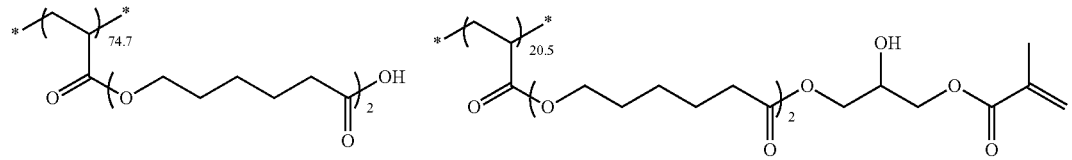

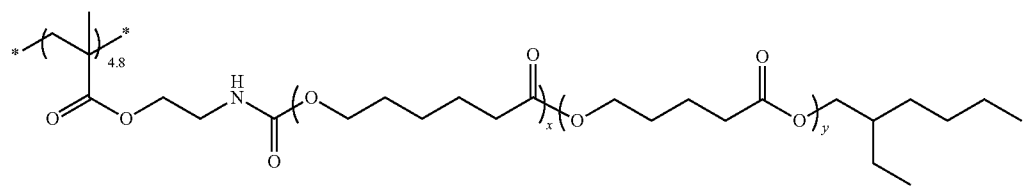

x:y = 83.2:16.8 (moral ration)

Dispersion Conditions
  Bead size: φ 0.05 mm
  Bead filling rate: 75 volume %
  Circumferential speed of mill: 8 m/sec
  Amount of mixed solution subjected to dispersion treatment: 500 g
  Circulation flow rate (pump supply rate): 13 kg/hour
  Temperature of treatment liquid: 25° C. to 30° C.
  Coolant: tap water (5° C.)
  Inner volume of annular passage of beads mill: 0.15 L
  Number of passes: 90 passes (Preparation of Coloring Material Dispersion Liquid CA-4 (Organic Pigment Dispersion Liquid CA-4))

An organic pigment (Irgaphor Black S0100CF (manufactured by BASF)) (150 parts by mass) as a black coloring material, the resin X-1 (75 parts by mass), SOLSPERSE 20000 (pigment derivative, manufactured by Lubrizol Japan Limited) (25 parts by mass), and 3-methoxy butyl acetate (MBA) (750 parts by mass) were mixed. The resin X-1 was the same as that used for preparing the above-described coloring material dispersion liquid CA-3.

The obtained mixture was stirred for 20 minutes using a homomixer (manufactured by PRIMIX Corporation) to obtain a preliminary dispersion liquid. Further, the obtained preliminary dispersion liquid was subjected to a dispersion treatment for 3 hours using ULTRA APEX MILL (manufactured by HIROSHIMA METAL & MACHINERY CO., LTD.) equipped with a centrifugal separator under the following dispersion conditions to obtain a dispersion composition. After the completion of the dispersion, the beads and the dispersion liquid were separated with a filter to obtain a coloring material dispersion liquid CA-4 (organic pigment dispersion liquid CA-4) containing an organic pigment as a black coloring material.

A concentration of solid contents in the coloring material dispersion liquid CA-4 was 25 mass %, and a proportion of organic pigment/resin component (the total of the resin X-1 and the pigment derivative) was 60/40 (mass ratio).

Dispersion Conditions
  Used beads: zirconia beads having φ 0.30 mm (YTZ ball, manufactured by Neturen Co., Ltd)
  Bead filling rate: 75 volume %
  Circumferential speed of mill: 8 m/sec
  Amount of mixed solution subjected to dispersion treatment: 1000 g
  Circulation flow rate (pump supply rate): 13 kg/hour
  Temperature of treatment liquid: 25° C. to 30° C.
  Coolant: tap water (5° C.)
  Inner volume of annular passage of beads mill: 0.15 L
  Number of passes: 90 passes (Preparation of Coloring Material Dispersion Liquid CA-5 (Black Dye Solution CA-5))

The resin X-1 (5.5 parts by mass) was added to VALIFAST BLACK 3804 (product name, manufactured by Orient Chemical Industries Co., Ltd., dye specified by C. I. of SOLVENT BLACK 34) (20 parts by mass) as a black coloring material. Subsequently, the mixture was dissolved in PGMEA (74.5 parts by mass) to obtain a coloring material dispersion liquid CA-5 (black dye solution CA-5).

The resin X-1 was the same as that used for preparing the above-described coloring material dispersion liquid CA-3.

(Preparation of Coloring Material Dispersion Liquid CA-6 (Zirconium Nitride Dispersion Liquid CA-6))

The resin X-1 (10 parts by mass) was added to zirconium nitride (30 parts by mass) prepared by the method of Example 1 of JP2017-222559A, and then PGMEA was further added thereto so that a concentration of solid contents was 35 mass %.

The resin X-1 was the same as that used for preparing the above-described coloring material dispersion liquid CA-3.

Dispersion Conditions
  Bead size: φ 0.05 mm
  Bead filling rate: 65 volume %
  Circumferential speed of mill: 10 m/sec
  Circumferential speed of separator: 11 m/s
  Amount of mixed solution subjected to dispersion treatment: 15.0 g
  Circulation flow rate (pump supply rate): 60 kg/hour
  Temperature of treatment liquid: 20° C. to 25° C.
  Coolant: tap water (5° C.)
  Inner volume of annular passage of beads mill: 2.2 L
  Number of passes: 84 passes (Coloring Material Dispersion Liquids CA-7 to CA-12)

A mixed solution obtained by mixing the types of dispersed resins, pigments, pigment derivatives, and solvents shown in Table 5 below in the proportions shown in Table 5 below was mixed and dispersed for 3 hours using a beads mill (zirconia beads having a diameter of 0.3 mm) to prepare a dispersion liquid. Next, using a high-pressure disperser NANO-3000-10 (manufactured by Nippon BEE Chemical Co., Ltd.) equipped with a pressure reducing mechanism, the dispersion liquid was further dispersed under a pressure of 2000 kg/cm$^3$ at a flow rate of 500 g/min. The dispersion treatment was repeated 10 times to obtain a coloring material dispersion liquid.

In Table 5, the description in a column of "Added amount" in a column of each raw material indicates the addition amount (parts by mass) of each raw material.

(Dispersed Resin)
  DPB-1: compound shown below (solid content: 30 mass %, PGMEA solution, Mw: 16000)
  DPB-2: compound shown below (solid content: 30 mass %, PGMEA solution, Mw: 8000)
  DPB-3: compound shown below (solid content: 30 mass %, PGMEA solution, Mw: 15000)

In the following formula, Me represents a methyl group, and Bu represents a butyl group.

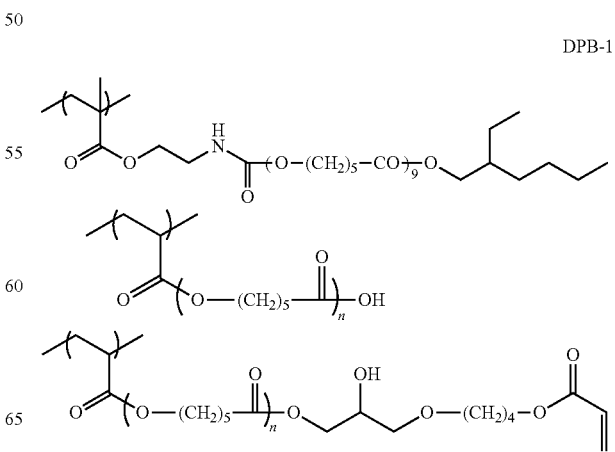

DPB-1

73
-continued
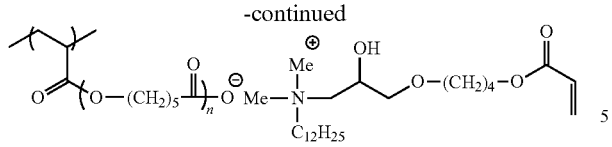
DPB-2
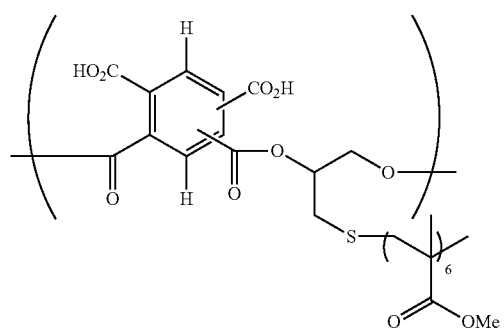
74
-continued
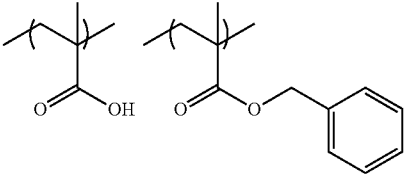
DPB-3
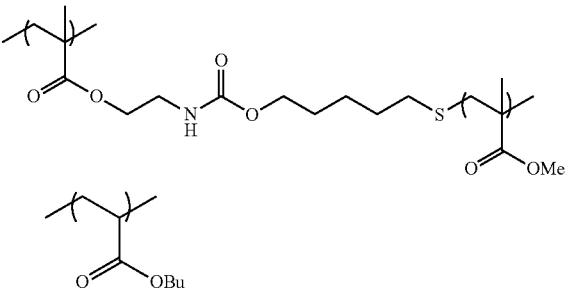
(Pigment Derivative)
Compounds shown below
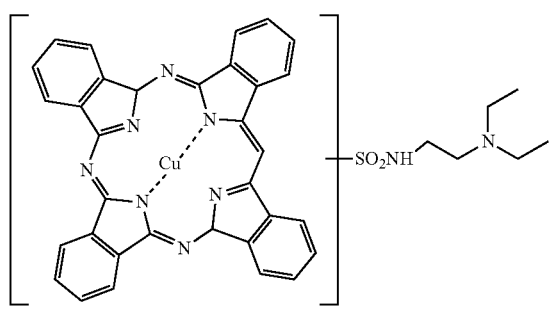
(SY-1)
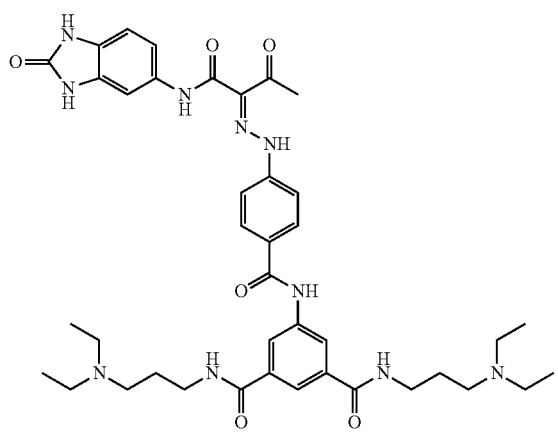
(SY-2)
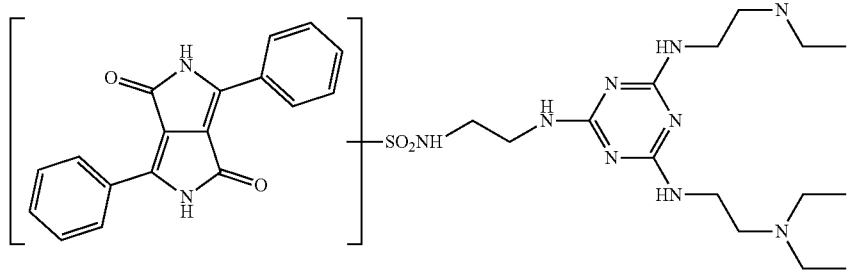
(SY-3)
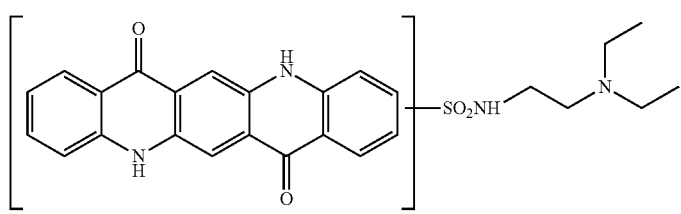
(SY-5)

<Solvent>
Cyclopentanone
PGMEA (propylene glycol monomethyl ether acetate)

TABLE 5

| Coloring material dispersion liquid | Pigment | | Derivative | | Dispersed resin | | Solvent | |
|---|---|---|---|---|---|---|---|---|
| | Type | Added amount | Type | Added amount | Type | Added amount | Type | Added amount |
| CA-7 | PB15:6/PV23 | 10/5 | SY-1 | 1 | DPB-1 | 20 | PGMEA | 65 |
| CA-8 | PR254/PY139 | 10/5 | SY-3 | 1 | DPB-2 | 20 | PGMEA | 65 |
| CA-9 | PG36/PY185 | 10/5 | SY-2 | 1 | DPB-3 | 20 | PGMEA | 65 |
| CA-10 | PB15:6 | 15 | SY-1 | 1 | DPB-1 | 20 | PGMEA | 65 |
| CA-11 | PR122 | 15 | SY-5 | 1 | DPB-2 | 20 | Cyclopentanone | 65 |
| CA-12 | PY150 | 15 | SY-2 | 1 | DPB-3 | 20 | PGMEA | 65 |

[Preparation of Coloring Composition]

The above-described raw materials were mixed in the formulations shown in Table 6 to prepare coloring compositions of Examples 4-1 to 4-122 and Comparative Examples 4-1 and 4-2. In Table 6, the description in a column of "Amount" in a column of each raw material indicates the addition amount (parts by mass) of each raw material.

[Evaluation of Storage Stability]

Storage stability of the coloring composition was evaluated by the same procedure and evaluation standard as in the evaluation of the storage stability using the above-described dispersion liquid, except that the coloring composition obtained as described above was used.

[Evaluation of Surface Unevenness]

Surface unevenness of the cured film was evaluated by the same procedure and evaluation standard as in the evaluation of the surface unevenness of the substrate with a cured film, formed of the above-described photocurable composition, except that the coloring composition was used.

TABLE 6

| | Dispersion liquid of modified silica particles | | Coloring material dispersion liquid | | Resin | | Initiator | | Polymerizable compound | |
|---|---|---|---|---|---|---|---|---|---|---|
| | Type | Amount | Type | Amount | Type | Amount | Type | Amount | Type | Amount |
| Example 4-1 | D-1 | 11 | CA-1 | 72 | B-1 | 0.2 | C-1 | 2 | M-1 | 4.8 |
| Example 4-2 | D-2 | 11 | CA-1 | 72 | B-1 | 0.2 | C-1 | 2 | M-1 | 4.8 |
| Example 4-3 | D-3 | 11 | CA-1 | 72 | B-1 | 0.2 | C-1 | 2 | M-1 | 4.8 |
| Example 4-4 | D-4 | 11 | CA-1 | 72 | B-1 | 0.2 | C-1 | 2 | M-1 | 4.8 |
| Example 4-5 | D-5 | 11 | CA-1 | 72 | B-1 | 0.2 | C-1 | 2 | M-1 | 4.8 |
| Example 4-6 | D-6 | 11 | CA-1 | 72 | B-1 | 0.2 | C-1 | 2 | M-1 | 4.8 |
| Example 4-7 | D-7 | 11 | CA-1 | 72 | B-1 | 0.2 | C-1 | 2 | M-1 | 4.8 |
| Example 4-8 | D-8 | 11 | CA-1 | 72 | B-1 | 0.2 | C-1 | 2 | M-1 | 4.8 |
| Example 4-9 | D-9 | 11 | CA-1 | 72 | B-1 | 0.2 | C-1 | 2 | M-1 | 4.8 |
| Example 4-10 | D-10 | 11 | CA-1 | 72 | B-1 | 0.2 | C-1 | 2 | M-1 | 4.8 |
| Example 4-11 | D-11 | 11 | CA-1 | 72 | B-1 | 0.2 | C-1 | 2 | M-1 | 4.8 |
| Example 4-12 | D-12 | 11 | CA-1 | 72 | B-1 | 0.2 | C-1 | 2 | M-1 | 4.8 |
| Example 4-13 | D-13 | 11 | CA-1 | 72 | B-1 | 0.2 | C-1 | 2 | M-1 | 4.8 |
| Example 4-14 | D-14 | 11 | CA-1 | 72 | B-1 | 0.2 | C-1 | 2 | M-1 | 4.8 |
| Example 4-15 | D-15 | 11 | CA-1 | 72 | B-1 | 0.2 | C-1 | 2 | M-1 | 4.8 |
| Example 4-16 | D-16 | 11 | CA-1 | 72 | B-1 | 0.2 | C-1 | 2 | M-1 | 4.8 |
| Example 4-17 | D-17 | 11 | CA-1 | 72 | B-1 | 0.2 | C-1 | 2 | M-1 | 4.8 |
| Example 4-18 | D-18 | 11 | CA-1 | 72 | B-1 | 0.2 | C-1 | 2 | M-1 | 4.8 |
| Example 4-19 | D-19 | 11 | CA-1 | 72 | B-1 | 0.2 | C-1 | 2 | M-1 | 4.8 |
| Example 4-20 | D-20 | 11 | CA-1 | 72 | B-1 | 0.2 | C-1 | 2 | M-1 | 4.8 |
| Example 4-21 | D-21 | 11 | CA-1 | 72 | B-1 | 0.2 | C-1 | 2 | M-1 | 4.8 |
| Example 4-22 | D-22 | 11 | CA-1 | 72 | B-1 | 0.2 | C-1 | 2 | M-1 | 4.8 |
| Example 4-23 | D-23 | 11 | CA-1 | 72 | B-1 | 0.2 | C-1 | 2 | M-1 | 4.8 |
| Example 4-24 | D-24 | 11 | CA-1 | 72 | B-1 | 0.2 | C-1 | 2 | M-1 | 4.8 |
| Example 4-25 | D-25 | 11 | CA-1 | 72 | B-1 | 0.2 | C-1 | 2 | M-1 | 4.8 |
| Example 4-26 | D-26 | 11 | CA-1 | 72 | B-1 | 0.2 | C-1 | 2 | M-1 | 4.8 |
| Example 4-27 | D-27 | 11 | CA-1 | 72 | B-1 | 0.2 | C-1 | 2 | M-1 | 4.8 |
| Example 4-28 | D-28 | 11 | CA-1 | 72 | B-1 | 0.2 | C-1 | 2 | M-1 | 4.8 |
| Example 4-29 | D-29 | 11 | CA-1 | 72 | B-1 | 0.2 | C-1 | 2 | M-1 | 4.8 |
| Example 4-30 | D-30 | 11 | CA-1 | 72 | B-1 | 0.2 | C-1 | 2 | M-1 | 4.8 |
| Example 4-31 | D-31 | 11 | CA-1 | 72 | B-1 | 0.2 | C-1 | 2 | M-1 | 4.8 |
| Example 4-32 | D-32 | 11 | CA-1 | 72 | B-1 | 0.2 | C-1 | 2 | M-1 | 4.8 |
| Example 4-33 | D-33 | 11 | CA-1 | 72 | B-1 | 0.2 | C-1 | 2 | M-1 | 4.8 |
| Example 4-34 | D-34 | 11 | CA-1 | 72 | B-1 | 0.2 | C-1 | 2 | M-1 | 4.8 |
| Example 4-35 | D-35 | 11 | CA-1 | 72 | B-1 | 0.2 | C-1 | 2 | M-1 | 4.8 |
| Example 4-36 | D-36 | 11 | CA-1 | 72 | B-1 | 0.2 | C-1 | 2 | M-1 | 4.8 |
| Example 4-37 | D-37 | 11 | CA-1 | 72 | B-1 | 0.2 | C-1 | 2 | M-1 | 4.8 |
| Example 4-38 | D-38 | 11 | CA-1 | 72 | B-1 | 0.2 | C-1 | 2 | M-1 | 4.8 |
| Example 4-39 | D-39 | 11 | CA-1 | 72 | B-1 | 0.2 | C-1 | 2 | M-1 | 4.8 |

TABLE 6-continued

| | | | | | | | | | | |
|---|---|---|---|---|---|---|---|---|---|---|
| Example 4-40 | D-40 | 11 | CA-1 | 72 | B-1 | 0.2 | C-1 | 2 | M-1 | 4.8 |
| Example 4-41 | D-41 | 11 | CA-1 | 72 | B-1 | 0.2 | C-1 | 2 | M-1 | 4.8 |
| Example 4-42 | D-42 | 11 | CA-1 | 72 | B-1 | 0.2 | C-1 | 2 | M-1 | 4.8 |
| Example 4-43 | D-43 | 11 | CA-1 | 72 | B-1 | 0.2 | C-1 | 2 | M-1 | 4.8 |
| Example 4-44 | D-44 | 11 | CA-1 | 72 | B-1 | 0.2 | C-1 | 2 | M-1 | 4.8 |
| Example 4-45 | D-45 | 11 | CA-1 | 72 | B-1 | 0.2 | C-1 | 2 | M-1 | 4.8 |
| Example 4-46 | D-46 | 11 | CA-1 | 72 | B-1 | 0.2 | C-1 | 2 | M-1 | 4.8 |
| Example 4-47 | D-47 | 11 | CA-1 | 72 | B-1 | 0.2 | C-1 | 2 | M-1 | 4.8 |
| Example 4-48 | D-48 | 11 | CA-1 | 72 | B-1 | 0.2 | C-1 | 2 | M-1 | 4.8 |

| | Polymerizable inhibitor Amount | Solvent Type | Solvent Amount | Storage stability | Surface unevenness |
|---|---|---|---|---|---|
| Example 4-1 | 0.003 | Cyclopentanone | 10 | AA | AA |
| Example 4-2 | 0.003 | Cyclopentanone | 10 | AA | AA |
| Example 4-3 | 0.003 | Cyclopentanone | 10 | A | AA |
| Example 4-4 | 0.003 | Cyclopentanone | 10 | AA | AA |
| Example 4-5 | 0.003 | Cyclopentanone | 10 | A | A |
| Example 4-6 | 0.003 | Cyclopentanone | 10 | A | A |
| Example 4-7 | 0.003 | Cyclopentanone | 10 | B | A |
| Example 4-8 | 0.003 | Cyclopentanone | 10 | A | A |
| Example 4-9 | 0.003 | Cyclopentanone | 10 | B | B |
| Example 4-10 | 0.003 | Cyclopentanone | 10 | AA | AA |
| Example 4-11 | 0.003 | Cyclopentanone | 10 | AA | AA |
| Example 4-12 | 0.003 | Cyclopentanone | 10 | A | AA |
| Example 4-13 | 0.003 | Cyclopentanone | 10 | AA | AA |
| Example 4-14 | 0.003 | Cyclopentanone | 10 | AA | A |
| Example 4-15 | 0.003 | Cyclopentanone | 10 | AA | AA |
| Example 4-16 | 0.003 | Cyclopentanone | 10 | AA | AA |
| Example 4-17 | 0.003 | Cyclopentanone | 10 | A | AA |
| Example 4-18 | 0.003 | Cyclopentanone | 10 | AA | AA |
| Example 4-19 | 0.003 | Cyclopentanone | 10 | AA | A |
| Example 4-20 | 0.003 | Cyclopentanone | 10 | AA | AAA |
| Example 4-21 | 0.003 | Cyclopentanone | 10 | A | AA |
| Example 4-22 | 0.003 | Cyclopentanone | 10 | AA | AA |
| Example 4-23 | 0.003 | Cyclopentanone | 10 | AA | AAA |
| Example 4-24 | 0.003 | Cyclopentanone | 10 | A | AA |
| Example 4-25 | 0.003 | Cyclopentanone | 10 | AA | AA |
| Example 4-26 | 0.003 | Cyclopentanone | 10 | AA | AA |
| Example 4-27 | 0.003 | Cyclopentanone | 10 | A | AA |
| Example 4-28 | 0.003 | Cyclopentanone | 10 | AA | A |
| Example 4-29 | 0.003 | Cyclopentanone | 10 | AA | AAA |
| Example 4-30 | 0.003 | Cyclopentanone | 10 | A | AA |
| Example 4-31 | 0.003 | Cyclopentanone | 10 | AA | AA |
| Example 4-32 | 0.003 | Cyclopentanone | 10 | AA | AAA |
| Example 4-33 | 0.003 | Cyclopentanone | 10 | A | AA |
| Example 4-34 | 0.003 | Cyclopentanone | 10 | AA | AA |
| Example 4-35 | 0.003 | Cyclopentanone | 10 | AA | AA |
| Example 4-36 | 0.003 | Cyclopentanone | 10 | AA | AAA |
| Example 4-37 | 0.003 | Cyclopentanone | 10 | A | A |
| Example 4-38 | 0.003 | Cyclopentanone | 10 | AA | AA |
| Example 4-39 | 0.003 | Cyclopentanone | 10 | AA | AA |
| Example 4-40 | 0.003 | Cyclopentanone | 10 | A | A |
| Example 4-41 | 0.003 | Cyclopentanone | 10 | AA | AA |
| Example 4-42 | 0.003 | Cyclopentanone | 10 | AA | AA |
| Example 4-43 | 0.003 | Cyclopentanone | 10 | AA | AA |
| Example 4-44 | 0.003 | Cyclopentanone | 10 | B | A |
| Example 4-45 | 0.003 | Cyclopentanone | 10 | AA | B |
| Example 4-46 | 0.003 | Cyclopentanone | 10 | A | AA |
| Example 4-47 | 0.003 | Cyclopentanone | 10 | B | A |
| Example 4-48 | 0.003 | Cyclopentanone | 10 | AA | AAA |

| | Dispersion liquid of modified silica particles | | Coloring material dispersion liquid | | Resin | | | | Initiator | | | |
|---|---|---|---|---|---|---|---|---|---|---|---|---|
| | Type | Amount | Type | Amount | Type | Amount | Type | Amount | Type | Amount | Type | Amount |
| Example 4-49 | D-1 | 8 | D-20 | 3 | CA-1 | 72 | B-1 | 0.2 | | | C-1 | 2 |
| Example 4-50 | D-1 | 8 | DC-3 | 3 | CA-1 | 72 | B-1 | 0.2 | | | C-1 | 2 |
| Example 4-51 | D-1 | 11 | | | CA-1 | 72 | B-1 | 0.1 | B-2 | 0.1 | C-1 | 2 |
| Example 4-52 | D-1 | 11 | | | CA-1 | 72 | B-1 | 0.1 | B-3 | 0.1 | C-1 | 2 |
| Example 4-53 | D-1 | 11 | | | CA-1 | 72 | | | | | C-1 | 2 |
| Example 4-54 | D-1 | 11 | | | CA-1 | 72 | B-1 | 0.2 | | | C-2 | 2 |
| Example 4-55 | D-1 | 11 | | | CA-1 | 72 | B-1 | 0.2 | | | C-3 | 2 |
| Example 4-56 | D-1 | 11 | | | CA-1 | 72 | B-1 | 0.1 | B-3 | 0.1 | C-1 | 1 | C-3 | 1 |
| Example 4-57 | D-1 | 11 | | | CA-1 | 72 | B-1 | 0.2 | | | C-1 | 2 |
| Example 4-58 | D-1 | 11 | | | CA-1 | 72 | B-1 | 0.2 | | | C-1 | 2 |

TABLE 6-continued

| | | | | | | | |
|---|---|---|---|---|---|---|---|
| Example 4-59 | D-1 | 11 | CA-1 | 72 | B-1 | 0.2 | C-1 | 2 |
| Example 4-60 | D-1 | 11 | CA-1 | 72 | B-1 | 5 | C-1 | 2 |
| Example 4-61 | D-1 | 5.5 | CA-1 | 72 | B-1 | 0.2 | C-1 | 2 |
| Example 4-62 | D-1 | 18 | CA-1 | 72 | B-1 | 0.2 | C-1 | 2 |
| Example 4-63 | D-1 | 11 | CA-1 | 72 | B-1 | 0.2 | C-1 | 2 |
| Example 4-64 | D-1 | 11 | CA-1 | 72 | B-1 | 0.2 | C-1 | 2 |
| Example 4-65 | D-1 | 11 | CA-2 | 72 | B-1 | 0.2 | C-1 | 2 |
| Example 4-66 | D-1 | 11 | CA-3 | 72 | B-1 | 0.2 | C-1 | 2 |
| Example 4-67 | D-1 | 11 | CA-4 | 72 | B-1 | 0.2 | C-1 | 2 |
| Example 4-68 | D-1 | 11 | CA-5 | 72 | B-1 | 0.2 | C-1 | 2 |
| Example 4-69 | D-1 | 11 | CA-6 | 72 | B-1 | 0.2 | C-1 | 2 |
| Example 4-70 | D-2 | 11 | CA-6 | 72 | B-1 | 0.2 | C-1 | 2 |
| Example 4-71 | D-3 | 11 | CA-6 | 72 | B-1 | 0.2 | C-1 | 2 |
| Example 4-72 | D-4 | 11 | CA-6 | 72 | B-1 | 0.2 | C-1 | 2 |
| Example 4-73 | D-5 | 11 | CA-6 | 72 | B-1 | 0.2 | C-1 | 2 |
| Example 4-74 | D-6 | 11 | CA-6 | 72 | B-1 | 0.2 | C-1 | 2 |
| Example 4-75 | D-7 | 11 | CA-6 | 72 | B-1 | 0.2 | C-1 | 2 |
| Example 4-76 | D-8 | 11 | CA-6 | 72 | B-1 | 0.2 | C-1 | 2 |
| Example 4-77 | D-9 | 11 | CA-6 | 72 | B-1 | 0.2 | C-1 | 2 |
| Example 4-78 | D-10 | 11 | CA-6 | 72 | B-1 | 0.2 | C-1 | 2 |

| | Polymerizable compound | | Surfactant | Polymerizable inhibitor | Solvent | | Evaluation result | |
|---|---|---|---|---|---|---|---|---|
| | Type | Amount | Type | Amount | Amount | Amount | Type | Amount | Storage stability | Surface unevenness |
| Example 4-49 | M-1 | 4.8 | | | 0 | 0.003 | Cyclopentanone | 10 | AA | AA |
| Example 4-50 | M-1 | 4.8 | | | 0 | 0.003 | Cyclopentanone | 10 | A | A |
| Example 4-51 | M-1 | 4.8 | | | 0 | 0.003 | Cyclopentanone | 10 | AA | AA |
| Example 4-52 | M-1 | 4.8 | | | 0 | 0.003 | Cyclopentanone | 10 | AA | AA |
| Example 4-53 | M-1 | 5 | | | 0 | 0.003 | Cyclopentanone | 10 | AA | AA |
| Example 4-54 | M-1 | 4.8 | | | 0 | 0.003 | Cyclopentanone | 10 | AA | AA |
| Example 4-55 | M-1 | 4.8 | | | 0 | 0.003 | Cyclopentanone | 10 | AA | AA |
| Example 4-56 | M-1 | 4.8 | | | 0 | 0.003 | Cyclopentanone | 10 | AA | AA |
| Example 4-57 | M-2 | 4.8 | | | 0 | 0.003 | Cyclopentanone | 10 | AA | AA |
| Example 4-58 | M-3 | 4.8 | | | 0 | 0.003 | Cyclopentanone | 10 | AA | AA |
| Example 4-59 | M-1 | 2.4 | M-2 | 2.4 | 0 | 0.003 | Cyclopentanone | 10 | AA | AA |
| Example 4-60 | | | | | 0 | 0.003 | Cyclopentanone | 10 | AA | AA |
| Example 4-61 | M-1 | 4.8 | | | 0 | 0.003 | Cyclopentanone | 10 | AA | A |
| Example 4-62 | M-1 | 4.8 | | | 0 | 0.003 | Cyclopentanone | 10 | AA | AA |
| Example 4-63 | M-1 | 4.8 | | | 0 | 0 | Cyclopentanone | 10 | AA | AA |
| Example 4-64 | M-1 | 4.8 | | | 0.01 | 0.003 | Cyclopentanone | 10 | AA | AA |
| Example 4-65 | M-1 | 4.8 | | | 0.01 | 0.003 | Cyclopentanone | 10 | AA | AA |
| Example 4-66 | M-1 | 4.8 | | | 0.01 | 0.003 | Cyclopentanone | 10 | AA | AA |
| Example 4-67 | M-1 | 4.8 | | | 0.01 | 0.003 | Cyclopentanone | 10 | AA | AA |
| Example 4-68 | M-1 | 4.8 | | | 0.01 | 0.003 | Cyclopentanone | 10 | AA | AA |
| Example 4-69 | M-1 | 4.8 | | | 0.01 | 0.003 | Cyclopentanone | 10 | AA | AA |
| Example 4-70 | M-1 | 4.8 | | | 0 | 0.003 | Cyclopentanone | 10 | AA | AA |
| Example 4-71 | M-1 | 4.8 | | | 0 | 0.003 | Cyclopentanone | 10 | A | AA |
| Example 4-72 | M-1 | 4.8 | | | 0 | 0.003 | Cyclopentanone | 10 | AA | AA |
| Example 4-73 | M-1 | 4.8 | | | 0 | 0.003 | Cyclopentanone | 10 | A | A |
| Example 4-74 | M-1 | 4.8 | | | 0 | 0.003 | Cyclopentanone | 10 | A | A |
| Example 4-75 | M-1 | 4.8 | | | 0 | 0.003 | Cyclopentanone | 10 | B | A |
| Example 4-76 | M-1 | 4.8 | | | 0 | 0.003 | Cyclopentanone | 10 | A | A |
| Example 4-77 | M-1 | 4.8 | | | 0 | 0.003 | Cyclopentanone | 10 | B | B |
| Example 4-78 | M-1 | 4.8 | | | 0 | 0.003 | Cyclopentanone | 10 | AA | AA |

| | Dispersion liquid of modified silica particles | | Coloring material dispersion liquid | | Resin | | Initiator | | Polymerizable compound | |
|---|---|---|---|---|---|---|---|---|---|---|
| | Type | Amount | Type | Amount | Type | Amount | Type | Amount | Type | Amount |
| Example 4-79 | D-11 | 11 | CA-6 | 72 | B-1 | 0.2 | C-1 | 2 | M-1 | 4.8 |
| Example 4-80 | D-12 | 11 | CA-6 | 72 | B-1 | 0.2 | C-1 | 2 | M-1 | 4.8 |
| Example 4-81 | D-13 | 11 | CA-6 | 72 | B-1 | 0.2 | C-1 | 2 | M-1 | 4.8 |
| Example 4-82 | D-14 | 11 | CA-6 | 72 | B-1 | 0.2 | C-1 | 2 | M-1 | 4.8 |
| Example 4-83 | D-15 | 11 | CA-6 | 72 | B-1 | 0.2 | C-1 | 2 | M-1 | 4.8 |
| Example 4-84 | D-16 | 11 | CA-6 | 72 | B-1 | 0.2 | C-1 | 2 | M-1 | 4.8 |
| Example 4-85 | D-17 | 11 | CA-6 | 72 | B-1 | 0.2 | C-1 | 2 | M-1 | 4.8 |
| Example 4-86 | D-18 | 11 | CA-6 | 72 | B-1 | 0.2 | C-1 | 2 | M-1 | 4.8 |
| Example 4-87 | D-19 | 11 | CA-6 | 72 | B-1 | 0.2 | C-1 | 2 | M-1 | 4.8 |
| Example 4-88 | D-20 | 11 | CA-6 | 72 | B-1 | 0.2 | C-1 | 2 | M-1 | 4.8 |
| Example 4-89 | D-21 | 11 | CA-6 | 72 | B-1 | 0.2 | C-1 | 2 | M-1 | 4.8 |
| Example 4-90 | D-22 | 11 | CA-6 | 72 | B-1 | 0.2 | C-1 | 2 | M-1 | 4.8 |
| Example 4-91 | D-23 | 11 | CA-6 | 72 | B-1 | 0.2 | C-1 | 2 | M-1 | 4.8 |
| Example 4-92 | D-24 | 11 | CA-6 | 72 | B-1 | 0.2 | C-1 | 2 | M-1 | 4.8 |
| Example 4-93 | D-25 | 11 | CA-6 | 72 | B-1 | 0.2 | C-1 | 2 | M-1 | 4.8 |
| Example 4-94 | D-26 | 11 | CA-6 | 72 | B-1 | 0.2 | C-1 | 2 | M-1 | 4.8 |
| Example 4-95 | D-27 | 11 | CA-6 | 72 | B-1 | 0.2 | C-1 | 2 | M-1 | 4.8 |

TABLE 6-continued

| | | | | | | | | | | |
|---|---|---|---|---|---|---|---|---|---|---|
| Example 4-96 | D-28 | 11 | CA-6 | 72 | B-1 | 0.2 | C-1 | 2 | M-1 | 4.8 |
| Example 4-97 | D-29 | 11 | CA-6 | 72 | B-1 | 0.2 | C-1 | 2 | M-1 | 4.8 |
| Example 4-98 | D-30 | 11 | CA-6 | 72 | B-1 | 0.2 | C-1 | 2 | M-1 | 4.8 |
| Example 4-99 | D-31 | 11 | CA-6 | 72 | B-1 | 0.2 | C-1 | 2 | M-1 | 4.8 |
| Example 4-100 | D-32 | 11 | CA-6 | 72 | B-1 | 0.2 | C-1 | 2 | M-1 | 4.8 |
| Example 4-101 | D-33 | 11 | CA-6 | 72 | B-1 | 0.2 | C-1 | 2 | M-1 | 4.8 |
| Example 4-102 | D-34 | 11 | CA-6 | 72 | B-1 | 0.2 | C-1 | 2 | M-1 | 4.8 |
| Example 4-103 | D-35 | 11 | CA-6 | 72 | B-1 | 0.2 | C-1 | 2 | M-1 | 4.8 |

| | Polymerizable inhibitor Amount | Solvent Type | Amount | Evaluation result Storage stability | Surface unevenness |
|---|---|---|---|---|---|
| Example 4-79 | 0.003 | Cyclopentanone | 10 | AA | AA |
| Example 4-80 | 0.003 | Cyclopentanone | 10 | A | AA |
| Example 4-81 | 0.003 | Cyclopentanone | 10 | AA | AA |
| Example 4-82 | 0.003 | Cyclopentanone | 10 | AA | A |
| Example 4-83 | 0.003 | Cyclopentanone | 10 | AA | AA |
| Example 4-84 | 0.003 | Cyclopentanone | 10 | AA | AA |
| Example 4-85 | 0.003 | Cyclopentanone | 10 | A | AA |
| Example 4-86 | 0.003 | Cyclopentanone | 10 | AA | AA |
| Example 4-87 | 0.003 | Cyclopentanone | 10 | AA | A |
| Example 4-88 | 0.003 | Cyclopentanone | 10 | AA | AAA |
| Example 4-89 | 0.003 | Cyclopentanone | 10 | A | AA |
| Example 4-90 | 0.003 | Cyclopentanone | 10 | AA | AA |
| Example 4-91 | 0.003 | Cyclopentanone | 10 | AA | AAA |
| Example 4-92 | 0.003 | Cyclopentanone | 10 | A | AA |
| Example 4-93 | 0.003 | Cyclopentanone | 10 | AA | AA |
| Example 4-94 | 0.003 | Cyclopentanone | 10 | AA | AA |
| Example 4-95 | 0.003 | Cyclopentanone | 10 | A | AA |
| Example 4-96 | 0.003 | Cyclopentanone | 10 | AA | A |
| Example 4-97 | 0.003 | Cyclopentanone | 10 | AA | AAA |
| Example 4-98 | 0.003 | Cyclopentanone | 10 | A | AA |
| Example 4-99 | 0.003 | Cyclopentanone | 10 | AA | AA |
| Example 4-100 | 0.003 | Cyclopentanone | 10 | AA | AAA |
| Example 4-101 | 0.003 | Cyclopentanone | 10 | A | AA |
| Example 4-102 | 0.003 | Cyclopentanone | 10 | AA | AA |
| Example 4-103 | 0.003 | Cyclopentanone | 10 | AA | AA |

| | Dispersion liquid of modified silica particles | | Coloring material dispersion liquid | | Resin | | Initiator | | Polymerizable compound | |
|---|---|---|---|---|---|---|---|---|---|---|
| | Type | Amount | Type | Amount | Type | Amount | Type | Amount | Type | Amount |
| Example 4-104 | D-36 | 11 | CA-6 | 72 | B-1 | 0.2 | C-1 | 2 | M-1 | 4.8 |
| Example 4-105 | D-37 | 11 | CA-6 | 72 | B-1 | 0.2 | C-1 | 2 | M-1 | 4.8 |
| Example 4-106 | D-38 | 11 | CA-6 | 72 | B-1 | 0.2 | C-1 | 2 | M-1 | 4.8 |
| Example 4-107 | D-39 | 11 | CA-6 | 72 | B-1 | 0.2 | C-1 | 2 | M-1 | 4.8 |
| Example 4-108 | D-40 | 11 | CA-6 | 72 | B-1 | 0.2 | C-1 | 2 | M-1 | 4.8 |
| Example 4-109 | D-41 | 11 | CA-6 | 72 | B-1 | 0.2 | C-1 | 2 | M-1 | 4.8 |
| Example 4-110 | D-42 | 11 | CA-6 | 72 | B-1 | 0.2 | C-1 | 2 | M-1 | 4.8 |
| Example 4-111 | D-43 | 11 | CA-6 | 72 | B-1 | 0.2 | C-1 | 2 | M-1 | 4.8 |
| Example 4-112 | D-44 | 11 | CA-6 | 72 | B-1 | 0.2 | C-1 | 2 | M-1 | 4.8 |
| Example 4-113 | D-45 | 11 | CA-6 | 72 | B-1 | 0.2 | C-1 | 2 | M-1 | 4.8 |
| Example 4-114 | D-46 | 11 | CA-6 | 72 | B-1 | 0.2 | C-1 | 2 | M-1 | 4.8 |
| Example 4-115 | D-47 | 11 | CA-6 | 72 | B-1 | 0.2 | C-1 | 2 | M-1 | 4.8 |
| Example 4-116 | D-48 | 11 | CA-6 | 72 | B-1 | 0.2 | C-1 | 2 | M-1 | 4.8 |
| Example 4-117 | D-1 | 10 | CA-7 | 100 | B-1 | 2 | C-1 | 1 | M-1 | 1 |
| Example 4-118 | D-1 | 10 | CA-8 | 100 | B-1 | 2 | C-1 | 1 | M-1 | 1 |
| Example 4-119 | D-1 | 10 | CA-9 | 100 | B-1 | 2 | C-1 | 1 | M-1 | 1 |
| Example 4-120 | D-1 | 10 | CA-10 | 100 | B-1 | 2 | C-1 | 1 | M-1 | 1 |
| Example 4-121 | D-1 | 10 | CA-11 | 100 | B-1 | 2 | C-1 | 1 | M-1 | 1 |
| Example 4-122 | D-1 | 10 | CA-12 | 100 | B-1 | 2 | C-1 | 1 | M-1 | 1 |
| Comparative example 4-1 | DC-1 | 11 | CA-3 | 72 | B-1 | 0.2 | C-1 | 2 | M-1 | 4.8 |
| Comparative example 4-2 | DC-2 | 11 | CA-3 | 72 | B-1 | 0.2 | C-1 | 2 | M-1 | 4.8 |

| | Surfactant Amount | Polymerizable inhibitor Amount | Solvent Type | Amount | Evaluation result Storage stability | Surface unevenness |
|---|---|---|---|---|---|---|
| Example 4-104 | 0 | 0.003 | Cyclopentanone | 10 | AA | AAA |
| Example 4-105 | 0 | 0.003 | Cyclopentanone | 10 | A | A |
| Example 4-106 | 0 | 0.003 | Cyclopentanone | 10 | AA | AA |

TABLE 6-continued

|  |  |  |  |  |  |  |
|---|---|---|---|---|---|---|
| Example 4-107 | 0 | 0.003 | Cyclopentanone | 10 | AA | AA |
| Example 4-108 | 0 | 0.003 | Cyclopentanone | 10 | A | A |
| Example 4-109 | 0 | 0.003 | Cyclopentanone | 10 | AA | AA |
| Example 4-110 | 0 | 0.003 | Cyclopentanone | 10 | AA | AA |
| Example 4-111 | 0 | 0.003 | Cyclopentanone | 10 | AA | AA |
| Example 4-112 | 0 | 0.003 | Cyclopentanone | 10 | B | A |
| Example 4-113 | 0 | 0.003 | Cyclopentanone | 10 | AA | B |
| Example 4-114 | 0 | 0.003 | Cyclopentanone | 10 | A | AA |
| Example 4-115 | 0 | 0.003 | Cyclopentanone | 10 | B | A |
| Example 4-116 | 0 | 0.003 | Cyclopentanone | 10 | AA | AAA |
| Example 4-117 | 1 | 0.01 | Cyclopentanone | 5 | AA | AA |
| Example 4-118 | 1 | 0.01 | Cyclopentanone | 5 | AA | AA |
| Example 4-119 | 1 | 0.01 | Cyclopentanone | 5 | AA | AA |
| Example 4-120 | 1 | 0.01 | Cyclopentanone | 5 | AA | AA |
| Example 4-121 | 1 | 0.01 | Cyclopentanone | 5 | AA | AA |
| Example 4-122 | 1 | 0.01 | Cyclopentanone | 5 | AA | AA |
| Comparative example 4-1 | 0 | 0.003 | Cyclopentanone | 10 | D | D |
| Comparative example 4-2 | 0 | 0.003 | Cyclopentanone | 10 | D | D |

As shown in Table 6, it was confirmed that the evaluation results of the storage stability of the coloring composition showed the same tendency as the above-described dispersion liquid.

In addition, as shown in Table 6, in a case of using a coloring composition including a dispersion liquid containing the specific modified silica particles, organic solvent, and water in the present invention, in which the content of water was 0.1 to 20 mass % with respect to the total mass of the specific modified silica particles (Examples), it was shown that a cured film having excellent surface unevenness could be obtained as compared with a case where the dispersion liquid which did not satisfy this was used.

In particular, from the comparison of Examples 4-15, 4-20, and 4-23, in a case where the organic group of the compound B included a fluorine atom or a silicon atom (Examples 4-20 and 4-23), it was shown that a cured film having more excellent surface unevenness could be obtained.

EXPLANATION OF REFERENCES

10: headlight unit
12: light source
14: light shielding part
16: lens
20: substrate
22: light shielding film
23: opening part
30: light distribution pattern
30a: edge
31: region
32: light distribution pattern
32a: edge
33: notched part
100: solid-state imaging device
101: solid-state imaging element
102: imaging unit
103: cover glass
104: spacer
105: laminated substrate
106: chip board
107: circuit board
108: electrode pad
109: external connection terminal
110: through-electrode
111: lens layer
112: lens material
113: support
114, 115: light shielding film
201: light receiving element
202: color filter
203: microlens
204: substrate
205b: blue pixel
205r: red pixel
205g: green pixel
205bm: black matrix
206: p-well layer
207: readout gate portion
208: vertical electric charge transfer path
209: element separation region
210: gate insulating film
211: vertical electric charge transfer electrode
212: light shielding film
213, 214: insulating film
215: planarizing film
300: infrared sensor
310: solid-state imaging element
311: infrared absorbing filter
312: color filter
313: infrared transmitting filter
314: resin film
315: microlens
316: planarizing film

What is claimed is:

1. A dispersion liquid comprising:
modified silica particles that comprise particles containing silica and a coating layer disposed on a surface of the particles containing silica,
an organic solvent; and
water,
wherein the coating layer includes a reactant of a reactive group on the particles containing silica surface-treated with a compound A represented by Formula A and a functional group of a compound B having the functional group and an organic group, wherein the organic group of the compound B includes at least one structure selected from the group consisting of a polyester structure, a poly(meth)acrylate structure, a polyolefin structure, and a polyether structure, wherein a content of water is 0.1 to 20.0 mass % with respect to a total mass of the modified silica particles,

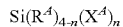      Formula A in Formula A, $R^A$ represents a monovalent organic group including the reactive group, $X^A$ represents a hydroxyl group or a monovalent hydrolyzable group, and n represents an integer of 1 to 3, in a case where n is 2 or less, a plurality of $R^A$'s may be the same or different from each other, the reactive group contained in $R^A$ in Formula A is an ethylenically unsaturated group, a thiol group, an epoxy group, or an amino group.

2. The dispersion liquid according to claim 1, wherein the content of water is 0.2 to 15 mass % with respect to a total mass of the modified silica particles.

3. The dispersion liquid according to claim 1, wherein the organic group of the compound B includes a fluorine atom.

4. The dispersion liquid according to claim 1, wherein the organic group of the compound B includes a silicon atom.

5. The dispersion liquid according to claim 1, wherein an average primary particle diameter of the modified silica particles is 5 to 200 nm.

6. A composition comprising:
the dispersion liquid according to claim 1; and
at least one of a polymerizable compound or a resin.

7. The composition according to claim 6, further comprising:
a coloring material.

8. A cured film formed of the composition according to claim 6.

9. A color filter comprising:
the cured film according to claim 8.

10. An optical element comprising:
the cured film according to claim 8.

11. A solid-state imaging element comprising:
the cured film according to claim 8.

12. A headlight unit for a vehicle lighting tool, the headlight unit comprising:
a light source; and
a light shielding part which shields at least a part of light emitted from the light source,
wherein the light shielding part contains the cured film according to claim 8.

* * * * *